(12) United States Patent
Lee et al.

(10) Patent No.: US 9,655,258 B2
(45) Date of Patent: May 16, 2017

(54) DISPLAY DEVICE

(71) Applicant: LG ELECTRONICS INC., Seoul (KR)

(72) Inventors: Hayun Lee, Seoul (KR); Bumgi Min, Seoul (KR); Wansik Kim, Seoul (KR); Mingeun Jeong, Seoul (KR); Cheolsoo Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 11 days.

(21) Appl. No.: 14/725,386

(22) Filed: May 29, 2015

(65) Prior Publication Data
US 2015/0351261 A1 Dec. 3, 2015

(30) Foreign Application Priority Data

May 30, 2014 (KR) .................. 10-2014-0065657
Dec. 8, 2014 (KR) .................. 10-2014-0175367

(51) Int. Cl.
*H05K 5/00* (2006.01)
*H05K 5/02* (2006.01)
*G02F 1/1333* (2006.01)

(52) U.S. Cl.
CPC ............. *H05K 5/02* (2013.01); *G02F 1/1333* (2013.01)

(58) Field of Classification Search
None
See application file for complete search history.

(56) References Cited

U.S. PATENT DOCUMENTS

| | | | | |
|---|---|---|---|---|
| 6,919,937 B2* | 7/2005 | Kim | .................. | G02F 1/133308 349/58 |
| 7,405,925 B2* | 7/2008 | Sung | .................. | G02F 1/133308 345/905 |
| 7,463,314 B2* | 12/2008 | Lee | .................. | G02F 1/133308 349/58 |
| 7,646,447 B2* | 1/2010 | Kim | .................. | G02F 1/133308 349/58 |
| 7,714,952 B2* | 5/2010 | Chang | .................. | G02B 6/0088 349/58 |
| 7,929,075 B2* | 4/2011 | Lee | .................. | G02F 1/133308 349/58 |
| 8,045,128 B2* | 10/2011 | Kim | .................. | G02F 1/133608 349/158 |
| 8,437,120 B2* | 5/2013 | Lee | ...................... | H05K 5/0217 361/679.01 |
| 8,550,689 B2* | 10/2013 | Han | ...................... | G02B 6/0068 362/632 |
| 8,599,330 B2* | 12/2013 | Lee | .................. | G02F 1/133308 349/58 |
| 9,474,169 B2* | 10/2016 | Park | .................. | G02F 1/133308 |
| 2004/0109104 A1* | 6/2004 | Lee | .................. | G02F 1/133308 349/58 |

(Continued)

*Primary Examiner* — Courtney Smith
*Assistant Examiner* — Rashen E Morrison
(74) *Attorney, Agent, or Firm* — KED & Associates, LLP

(57) ABSTRACT

A display device is disclosed. The display device includes a display panel including a front substrate and a back substrate, a guide panel positioned at an edge of a back surface of the display panel, a frame positioned in the rear of the display panel and connected to the guide panel, and a back cover positioned in the rear of the frame and inserted into the frame in a sliding manner.

12 Claims, 92 Drawing Sheets

(56) References Cited

U.S. PATENT DOCUMENTS

| | | | |
|---|---|---|---|
| 2005/0231658 A1* | 10/2005 | Chieh | G02F 1/133308 |
| | | | 349/56 |
| 2006/0089023 A1* | 4/2006 | Kim | H05K 5/02 |
| | | | 439/96 |
| 2007/0002591 A1* | 1/2007 | Chang | G02B 6/0088 |
| | | | 362/633 |
| 2007/0236910 A1* | 10/2007 | Yun | G02F 1/133308 |
| | | | 362/23.18 |
| 2009/0262554 A1* | 10/2009 | Lee | G02F 1/133308 |
| | | | 362/633 |
| 2009/0308999 A1* | 12/2009 | Kim | F16M 11/048 |
| | | | 248/299.1 |
| 2009/0310288 A1* | 12/2009 | Lee | G02F 1/133308 |
| | | | 361/679.01 |
| 2012/0092585 A1* | 4/2012 | Byeon | G02F 1/133308 |
| | | | 349/58 |
| 2013/0050820 A1* | 2/2013 | Shin | G06F 1/1601 |
| | | | 359/465 |
| 2013/0194781 A1* | 8/2013 | Kim | H04M 1/0266 |
| | | | 362/97.1 |
| 2014/0232942 A1* | 8/2014 | Yahata | H04N 5/64 |
| | | | 348/725 |
| 2015/0208529 A1* | 7/2015 | Sakong | H05K 5/0017 |
| | | | 361/679.01 |
| 2015/0346539 A1* | 12/2015 | Lee | G02F 1/133308 |
| | | | 349/58 |
| 2015/0351261 A1* | 12/2015 | Lee | H05K 5/02 |
| | | | 361/679.01 |
| 2016/0054614 A1* | 2/2016 | Choi | G02F 1/133308 |
| | | | 349/58 |
| 2016/0143161 A1* | 5/2016 | Jeong | G02F 1/1333 |
| | | | 361/749 |

* cited by examiner

DISPLAY DEVICE

CROSS-REFERENCE TO RELATED APPLICATIONS

Pursuant to 35 U.S.C. §119(a), this application claims the benefit of earlier filing date and right of priority to Korean Patent Application No. 10-2014-0065657, filed on May 30, 2014, and No. 10-2014-0175367 filed on Dec. 8, 2014, the contents of which are incorporated by reference herein in their entirety.

TECHNICAL FIELD

Embodiments of the invention relate to a display device.

DISCUSSION OF THE RELATED ART

With the development of the information society, various demands for display devices have been increasing. Various display devices, such as liquid crystal displays (LCDs), plasma display panels (PDPs), electroluminescent displays (ELDs), and vacuum fluorescent displays (VFDs), have been recently studied and used to meet various demands for the display devices. Among the display devices, a liquid crystal display panel of the liquid crystal display includes a liquid crystal layer, and a thin film transistor (TFT) substrate and a color filter substrate which are positioned opposite each other with the liquid crystal layer interposed therebetween. The liquid crystal display panel displays an image using light provided by a backlight unit of the liquid crystal display.

SUMMARY

In one aspect, there is a display device comprising a display panel including a front substrate and a back substrate, a guide panel positioned at an edge of a back surface of the display panel, a frame positioned in the rear of the display panel and connected to the guide panel, and a back cover positioned in the rear of the frame and inserted into the frame in a sliding manner.

An external surface of the guide panel may be exposed.

The display device may further comprise at least one fixer attached to the back surface of the display panel using an adhesive layer. The guide panel may be connected to the fixer.

The back cover may include a first protrusion configured to extend toward a second side area opposite a first side area at an end of the first side area, a second protrusion configured to extend toward the first side area at an end of the second side area, and a third protrusion configured to extend toward a fourth side area, which is adjacent to the first and second side areas and is opposite to a third side area, at an end of the third side area adjacent to the first and second side areas. The frame may include a first connector corresponding to the first protrusion, a second connector corresponding to the second protrusion, and a third connector corresponding to the third protrusion.

The frame may include a fifth side area corresponding to the first side area, a sixth side area corresponding to the second side area, a seventh side area corresponding to the third side area, and an eight side area corresponding to the fourth side area. The first connector may include a first convex portion protruding from the frame toward the back cover in the fifth side area and a first arm protruding from the first convex portion toward the seventh side area. The second connector may include a second convex portion protruding from the frame toward the back cover in the sixth side area and a second arm protruding from the second convex portion toward the seventh side area. Grooves depressed toward the eight side area may be respectively formed between the first arm and the frame and between the second arm and the frame.

The first protrusion may be slidingly inserted into the groove of the first connector in a direction from the seventh side area to the eight side area. The second protrusion may be slidingly inserted into the groove of the second connector in the direction from the seventh side area to the eight side area.

Further, the third connector may include a third convex portion protruding from the frame toward the back cover in the seventh side area. The third convex portion may include a groove depressed toward the eight side area. The third protrusion may be inserted into the groove of the third connector in a direction from the seventh side area to the eight side area.

The first protrusion may include a first main protrusion extending toward the second side area at the end of the first side area and a first auxiliary protrusion extending from the first main protrusion in a vertical direction. The second protrusion may include a second main protrusion extending toward the first side area at the end of the second side area and a second auxiliary protrusion extending from the second main protrusion in the vertical direction.

The frame may include a first horizontal frame part configured to extend in a horizontal direction, a second horizontal frame part positioned at an edge of the first horizontal frame part and configured to extend in the horizontal direction, an inclined frame part positioned between the first horizontal frame part and the second horizontal frame part and configured to extend in an oblique direction, a vertical frame part configured to extend from an end of the second horizontal frame part in a vertical direction, and a third horizontal frame part configured to extend from an end of the vertical frame part toward the inclined frame part in the horizontal direction.

At least one of the first convex portion or the second convex portion may overlap at least one of the inclined frame part or the second horizontal frame part.

The third horizontal frame part may include an opening, through which at least one of the first convex portion or the second convex portion passes.

A distance between the first horizontal frame part and the second horizontal frame part in the vertical direction may be greater than a distance between the second horizontal frame part and the third horizontal frame part in the vertical direction.

The guide panel may include a resin material and a glass fiber material.

The guide panel may further include a pigment.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION

Figure 1:
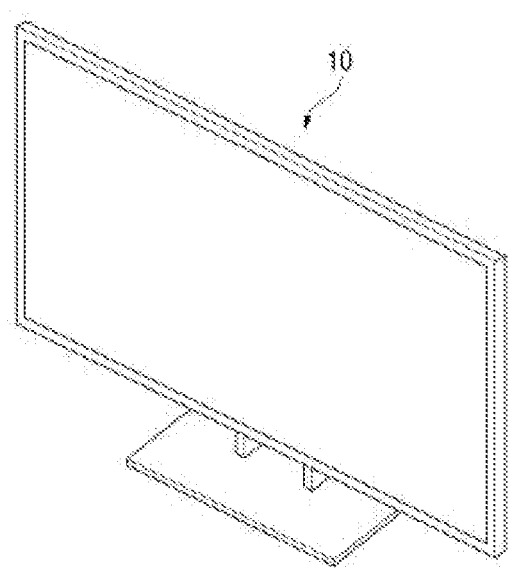
FIGS. 1 and 2 schematically illustrate configuration of a display device according to an exemplary embodiment of the invention.
Figure 1:
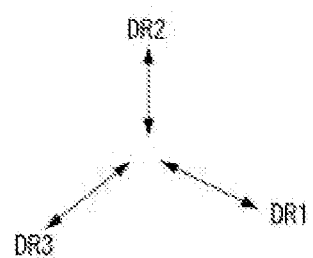

Arrangements and embodiments may now be described more fully with reference to the accompanying drawings, in which exemplary embodiments may be shown. Embodiments may, however, be embodied in many different forms and should not be construed as being limited to embodiments set forth herein; rather, embodiments may be provided so that this disclosure will be thorough and complete, and will fully convey the concept to those skilled in the art.

A mobile terminal may be described below with reference to the accompanying drawings. In the following description, suffixes "module" and "unit" may be given to components of the mobile terminal in consideration of only facilitation of description and do not have meanings or functions discriminated from each other.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component (s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

Hereinafter, a liquid crystal display panel is used as an example of a display panel. Other display panels may be used. For example, a plasma display panel (PDP), a field emission display (FED) panel, and an organic light emitting diode (OLED) display panel may be used.

A display panel according to an exemplary embodiment of the invention may include a first long side LS1, a second long side LS2 opposite the first long side LS1, a first short side SS1 adjacent to the first long side LS1 and the second long side LS2, and a second short side SS2 opposite the first short side SS1.

In the embodiment disclosed herein, the first short side SS1 may be referred to as a first side area; the second short side SS2 may be referred to as a second side area opposite the first side area; the first long side LS1 may be referred to as a third side area which is adjacent to the first side area and the second side area and is positioned between the first side area and the second side area; and the second long side LS2 may be referred to as a fourth side area which is adjacent to the first side area and the second side area, is positioned between the first side area and the second side area, and is opposite to the third side area.

The embodiment of the invention describes that lengths of the first and second long sides LS1 and LS2 are longer than lengths of the first and second short sides SS1 and SS2 for the sake of brevity and ease of reading. However, the lengths of the first and second long sides LS1 and LS2 may be almost equal to the lengths of the first and second short sides SS1 and SS2.

In the following description, a first direction DR1 may be a direction parallel to the long sides LS1 and LS2 of the display panel, and a second direction DR2 may be a direction parallel to the short sides SS1 and SS2 of the display panel.

Further, a third direction DR3 may be a direction vertical to the first direction DR1 and/or the second direction DR2.

In the embodiment of the invention, the first direction DR1 and the second direction DR2 may be commonly referred to as a horizontal direction.

Further, the third direction DR3 may be referred to as a vertical direction.

Figure 2:
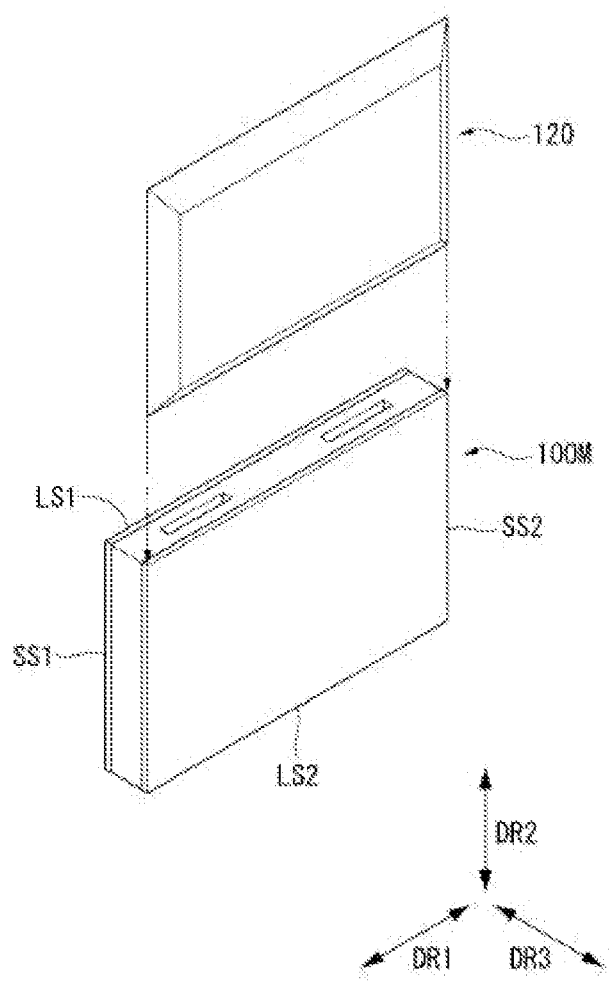

FIGS. 1 and 2 schematically illustrate configuration of a display device according to an exemplary embodiment of the invention.

As shown in FIGS. 1 and 2, a display device 10 according to the embodiment of the invention may include a display module 100M and a back cover 120, which is positioned in the rear of the display module 100M and is connected to the display module 100M.

Preferably, as shown in FIG. 2, the back cover 120 may be connected to the display module 100M in a sliding manner in a direction (i.e., the second direction DR2) from the first long side LS1 to the second long side LS2.

In other words, the back cover 120 may be inserted into a first short side SS1, a second short side SS2 opposite the first short side SS1, and a first long side LS1, which is adjacent to the first and second short sides SS1 and SS2 and is positioned between the first short side SS1 and the second short side SS2, of the display module 100M in the sliding manner.

Although not shown, the back cover 120 may include a first protrusion extending toward a second side area opposite a first side area at an end of the first side area, a second protrusion extending toward the first side area at an end of the second side area, and a third protrusion extending toward a fourth side area, which is adjacent to the first side area and the second side area and is opposite to a third side area, at an end of the third side area adjacent to the first side area and the second side area, so as to connect the back cover 120 to the display module 100M in the sliding manner as described above.

The display module 100M may include a first connector corresponding to the first protrusion, a second connector corresponding to the second protrusion, and a third connector corresponding to the third protrusion.

The configuration of the display device is described in detail below.

FIGS. 3 to 42 illustrate in detail configuration of a display device according to the embodiment of the invention. In the following description, the descriptions of the configuration and the structure described above may be omitted.

Figure 3:
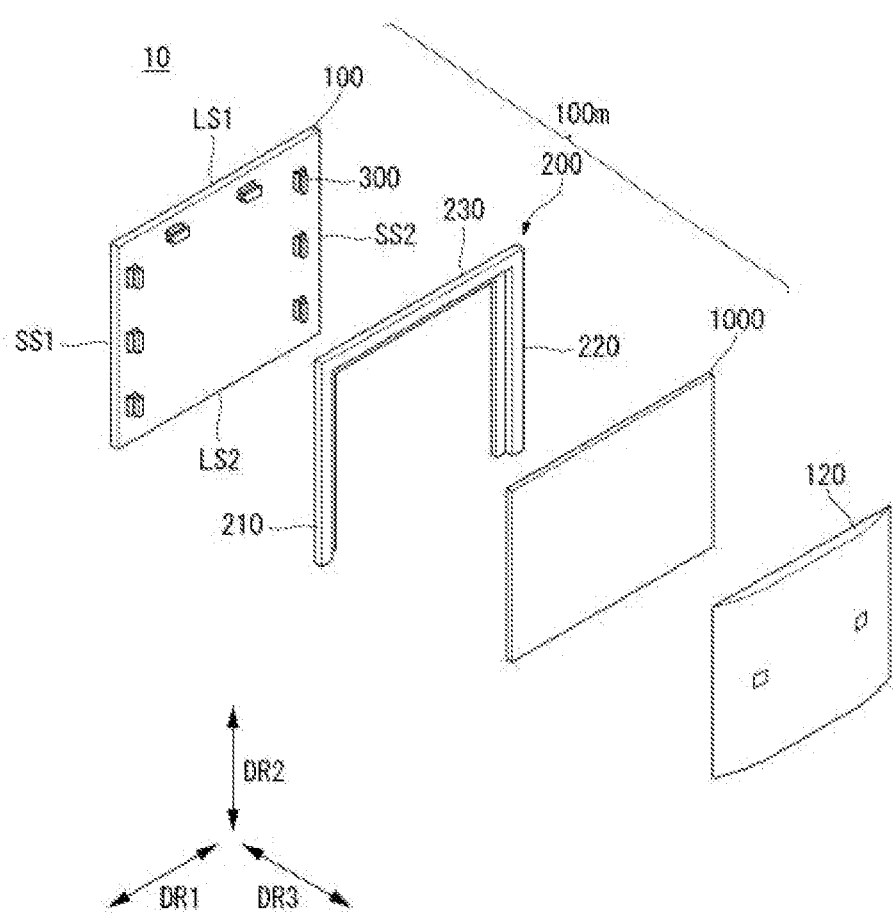
FIGS. 3 to 42 illustrate in detail configuration of a display device according to an exemplary embodiment of the invention.

As shown in FIG. 3, a display device 10 according to the embodiment of the invention may a display module 100M including a display panel 100, a fixer 300, and a guide panel 200, and a back cover 120.

The display module 100M may further include a frame 1000 which is positioned in the rear of the display panel 100 and is connected to the guide panel 200. The frame 1000 may be positioned between the display panel 100 and the back cover 120.

The embodiment of the invention describes that the display module 100M includes the display panel 100, the fixer 300, and the guide panel 200. However, the display module 100M may further include an optical layer, a light source, and/or a top case.

The display panel 100 displaying an image may include a front substrate and a back substrate, which are positioned opposite each other. The fixer 300 may be attached to a non-display area of a back surface of the back substrate of the display panel 100.

The back cover 120 may be connected to the guide panel 200.

Although not shown, the back cover 120 may protect various components positioned between the back cover 120 and the display panel 100.

The fixer 300 may be attached to a back surface of the display panel 100 using an adhesive layer. More specifically, the fixer 300 may be attached to the back surface of the back substrate of the display panel 100 using the adhesive layer.

The plurality of fixers 300 may be attached to the back surface of the display panel 100. For example, at least one fixer 300 may be attached to the back surface of the display panel 100 on a first long side LS1, a first short side SS1, and a second short side SS2 of the display panel 100.

The guide panel 200 may cover the fixer 300 and may be connected to the fixer 300.

The guide panel 200 may be positioned at an edge of the back surface of the display panel 100.

The guide panel 200 may include a first guide panel 210 corresponding to a first side area (i.e., the first short side SS1) of the display panel 100, a second guide panel 220 corresponding to a second side area (i.e., the second short side SS2) of the display panel 100, and a third guide panel 230 corresponding to a third side area (i.e., the first long side LS1) of the display panel 100. It may be preferable, but not required, that the first guide panel 210, the second guide panel 220, and the third guide panel 230 form one body.

The guide panel 200 may include a resin material and a glass fiber material, so as to improve rigidity. This will be described in detail later.

Figure 4:
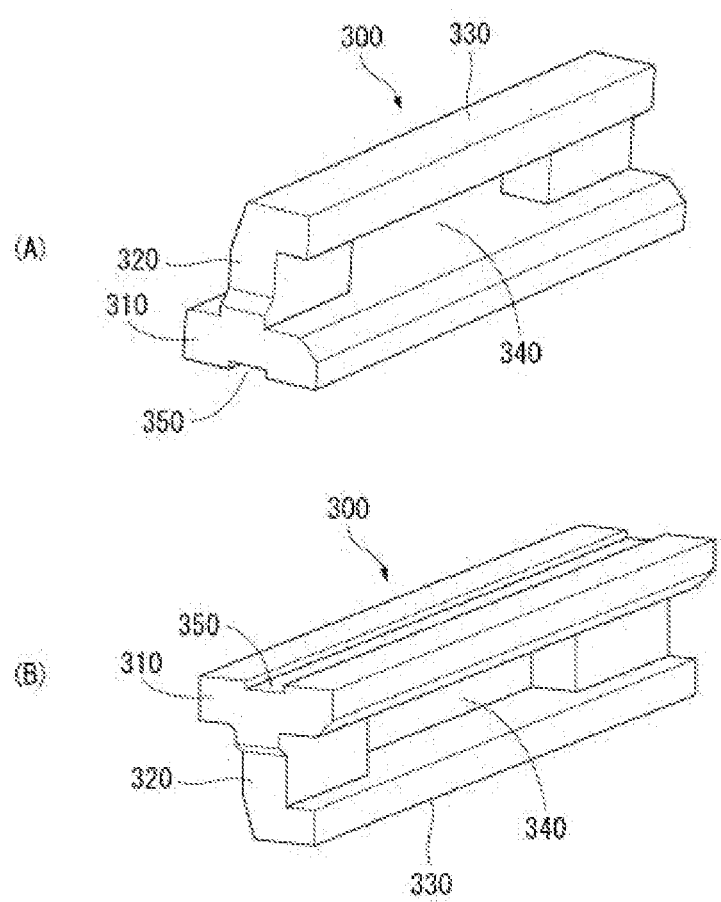

As shown in FIG. 4, the fixer 300 may include a base part 310 including a groove 350, to which an adhesive layer is applied, a connector 320 extending from the base part 310 in a vertical direction (i.e., a third direction DR3), and a head part 330 extending from an end of the connector 320 in a horizontal direction (i.e., a first direction DR1 and/or a second direction DR2) perpendicular to the vertical direction.

More specifically, the groove 350 may be formed at a first surface of the base part 310, and the connector 320 may extend from a second surface opposite the first surface in the vertical direction (i.e., the third direction DR3).

The connector 320 may have an opening 340.

Figure 5:
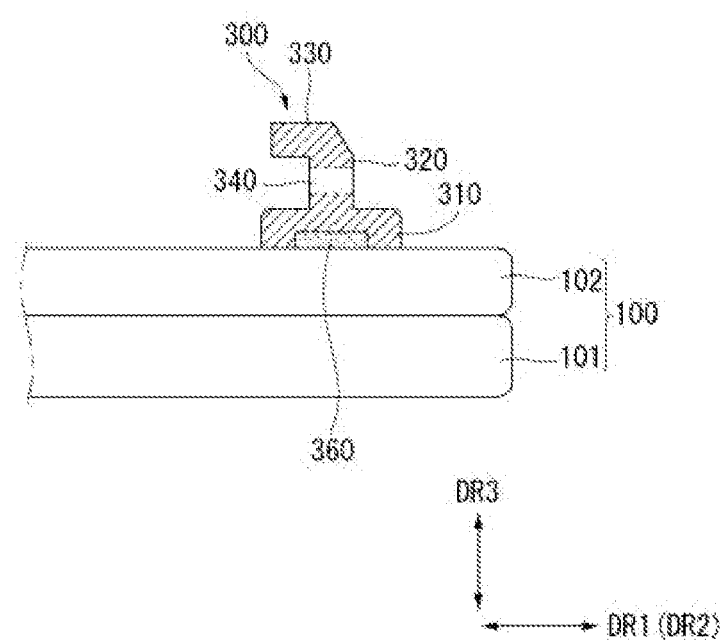

As shown in FIG. 5, an adhesive layer 360 may be formed between the fixer 300 and a back substrate 102 of the display panel 100. Hence, the fixer 300 may be attached to a back surface of the back substrate 102 of the display panel 100. Preferably, the adhesive layer 360 may be formed on the groove 350 of the base part 310 of the fixer 300.

As described above, when the fixer 300 is attached to the back surface of the back substrate 102 using the adhesive layer 360, a supporter, such as a pem nut and a boss, and a fastening member, such as a screw, are not used to fasten the fixer 300 to the back substrate 102. Therefore, a fixing process may be simply performed, the manufacturing cost may be reduced, and a thickness of the display device 10 may be reduced.

The display panel 100 may include a front substrate 101 and the back substrate 102, which are positioned opposite each other and are attached to each other to form a uniform cell gap therebetween. A liquid crystal layer (not shown) may be formed between the front substrate 101 and the back substrate 102.

A seal part may be formed between the front substrate 101 and the back substrate 102 to seal the liquid crystal layer.

A color filter may be positioned on the front substrate 101 to implement red, green, and blue colors.

The color filter may include a plurality of pixels each including red, green, and blue subpixels. When light is incident on the color filter, the color filter may generate images corresponding to the red, green, or blue color.

A predetermined transistor, for example, a thin film transistor (TFT) may be formed on the back substrate 102. The transistor may turn on or off liquid crystals in each pixel. In this instance, the front substrate 101 may be referred to as a color filter substrate, and the back substrate 102 may be referred to as a TFT substrate.

The liquid crystal layer may include a plurality of liquid crystal molecules, and the arrangement of the liquid crystal molecules may change by a driving signal supplied by the transistor. Hence, light provided by a backlight unit (not shown) may be incident on the color filter based on changes in the arrangement of the liquid crystal molecules of the liquid crystal layer.

As a result, the color filter may implement red, green, and blue light, and thus a predetermined image may be displayed on the front substrate 101 of the display panel 100.

Since the above-described structure and configuration of the display panel 100 are merely an example, they may be changed, added, or omitted.

Figure 6:
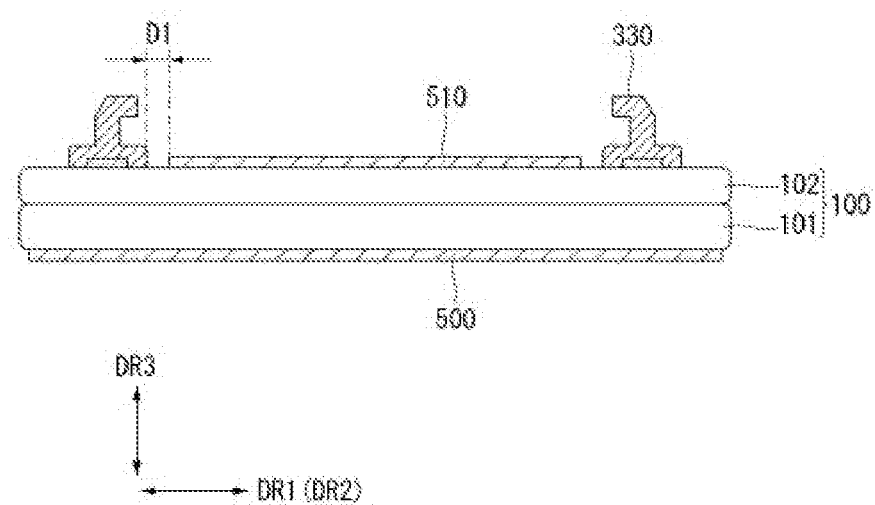

As shown in FIG. 6, the display panel 100 may further include a front polarizing film 500 and a back polarizing film 510. For example, the front polarizing film 500 for polarizing light passing through the display panel 100 may be disposed on a front surface of the front substrate 101, and the back polarizing film 510 for polarizing light passing through the optical layer positioned in the rear of the back substrate 102 may be disposed on the back surface of the back substrate 102.

The back polarizing film 510 may be separated from the fixer 300 by a predetermined distance D1 in the horizontal direction (i.e., the first direction DR1 and/or the second direction DR2).

The front polarizing film 500 may overlap the fixer 300 in the vertical direction (i.e., the third direction DR3).

Figure 7:
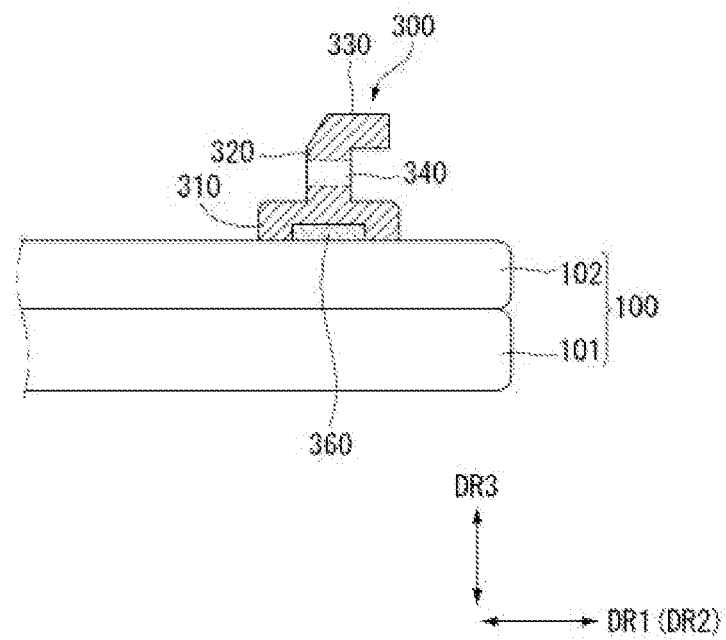

As shown in FIG. 7, the head part 330 may extend from the connector 320 in the horizontal direction (i.e., the first direction DR1 and/or the second direction DR2) far from the center of the display panel 100.

Alternatively, as shown in FIG. 5, the head part 330 may extend from the connector 320 toward the center of the display panel 100 in the horizontal direction (i.e., the first direction DR1 and/or the second direction DR2).

Further, although not shown, the base part 310 of the fixer 300 may not have the groove 350. In this instance, the adhesive layer 360 may be formed on the bottom of the base part 310.

Figure 8:
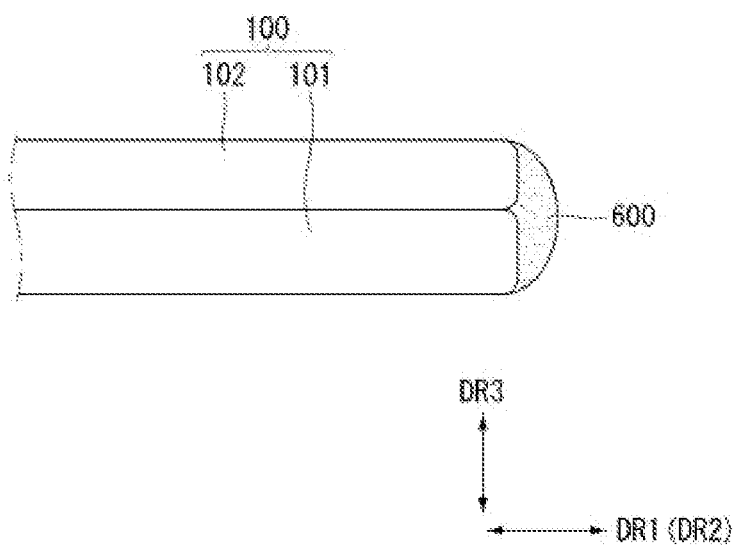

As shown in FIG. 8, the display panel 100 may further include a resin layer 600 formed on the side of the front substrate 101 and/or the side of the back substrate 102.

The resin layer 600 may protect the side of the front substrate 101 and/or the back substrate 102 of the display panel 100 from an impact.

Figure 9:
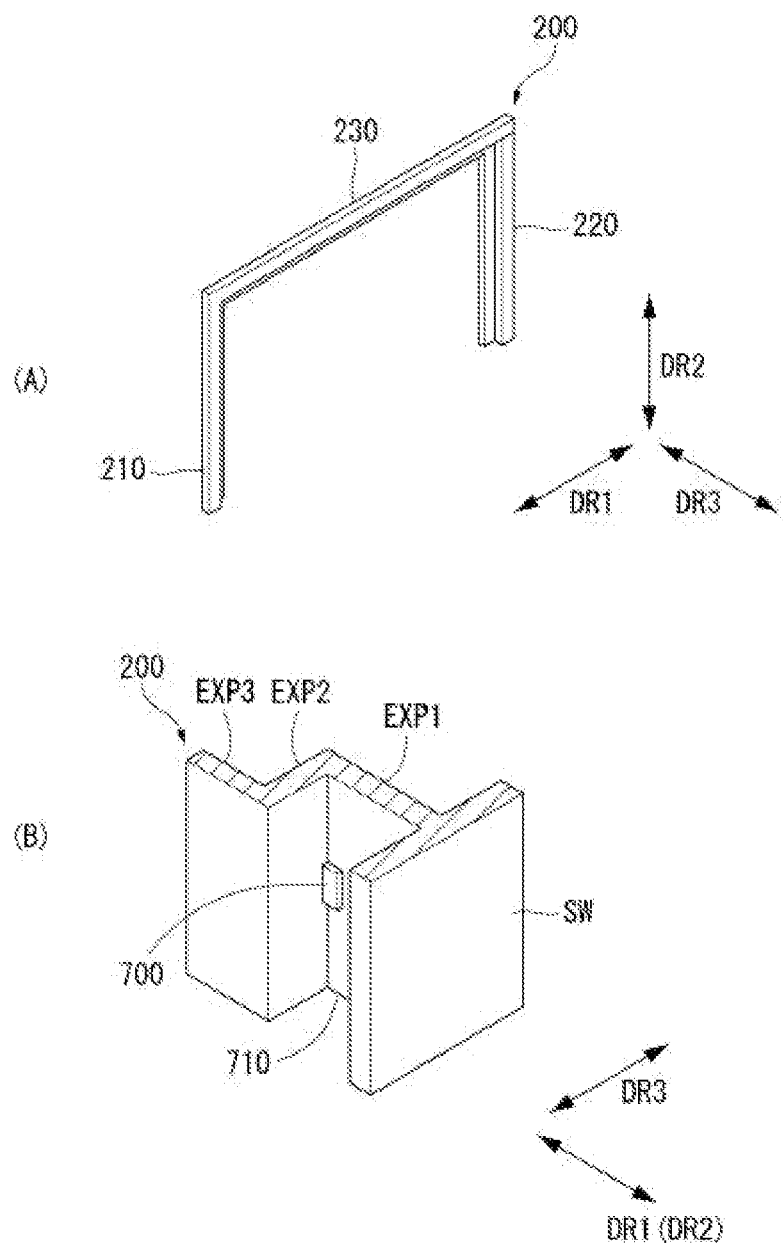

As shown in (A) and (B) of FIG. 9, the guide panel 200 (i.e., a cross section of the guide panel 200) may extend in the horizontal direction (i.e., the first direction DR1 and/or the second direction DR2) and may include a first groove 710, into which the fixer 300 is inserted.

For example, the guide panel 200 may include a side wall SW extending in the vertical direction (i.e., the third direction DR3), a first extension EXP1 extending from the side wall SW in the horizontal direction (i.e., the first direction DR1 and/or the second direction DR2), a second extension EXP2 extending from the first extension EXP1 in the vertical direction (i.e., the third direction DR3), and a third extension EXP3 extending from the second extension EXP2 in the horizontal direction (i.e., the first direction DR1 and/or the second direction DR2).

The side wall SW, the first extension EXP1, and the second extension EXP2 of the guide panel 200 may form the first groove 710.

A first protuberance 700 extending in the horizontal direction (i.e., the first direction DR1 and/or the second direction DR2) may be formed on an inner surface of the first groove 710 of the guide panel 200. The first protuberance 700 may be used to connect the guide panel 200 to the fixer 300.

Figure 10:
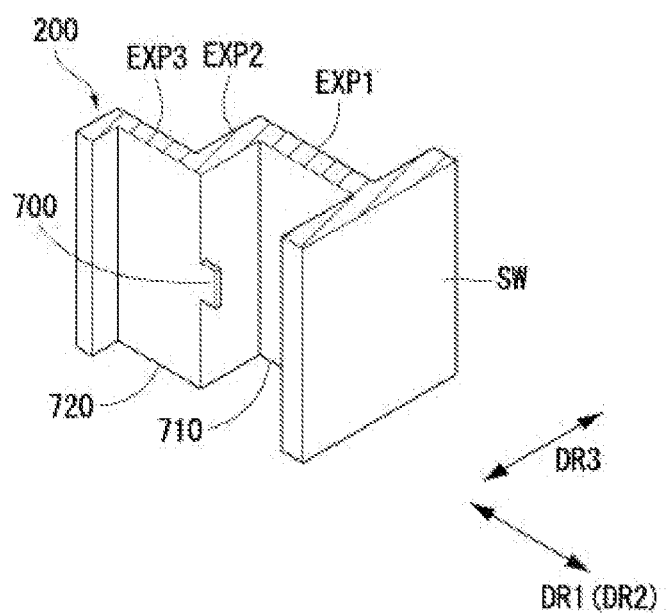

As shown in FIG. 10, the guide panel 200 may further include a second groove 720 extending in the horizontal direction (i.e., the first direction DR1 and/or the second direction DR2). A pad (not shown) may be disposed on the second groove 720. The pad will be described later, As described above, when the guide panel 200 includes the first groove 710, the fixer 300 may be connected to the guide panel 200 in the sliding manner.

Figure 11:
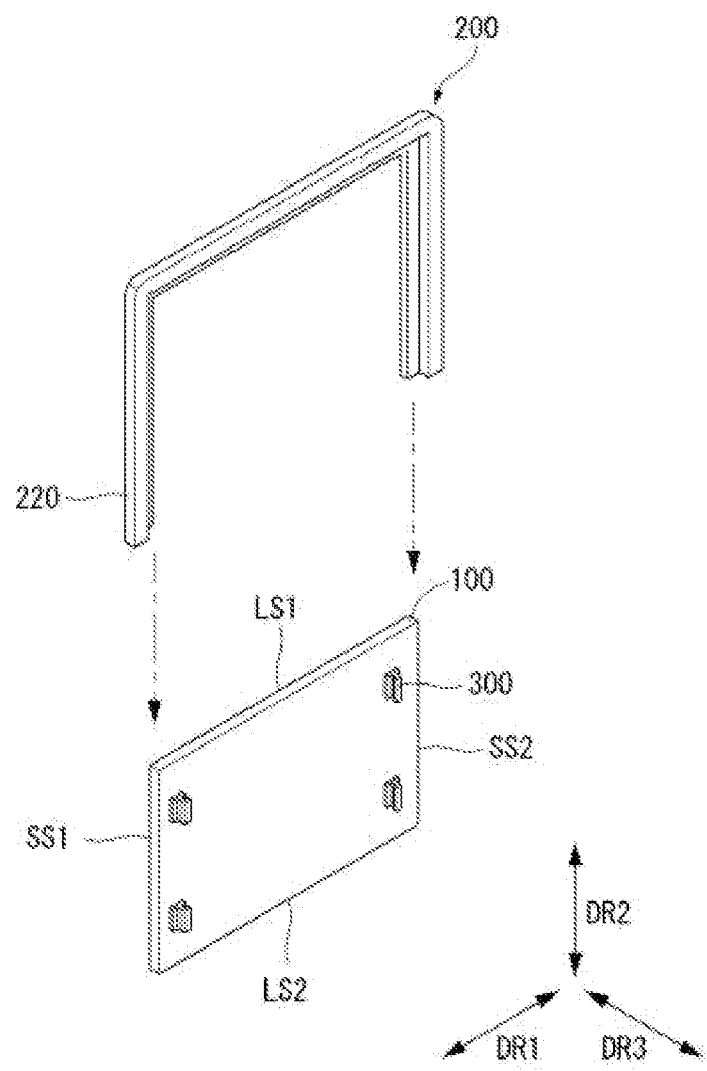

For example, as shown in FIG. 11, at least one fixer 300 may be disposed on each of the first short side SS1 and the second short side SS2 of the display panel 100. Further, the guide panel 200 may be connected to the fixer 300 in the second direction DR2 of the horizontal direction in the sliding manner.

Figure 12:
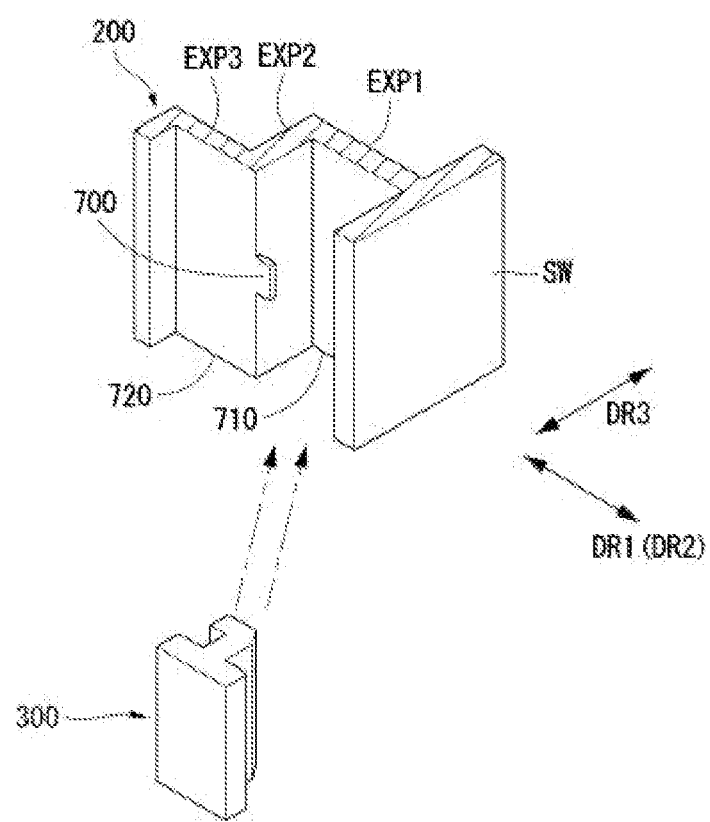
Figure 13:
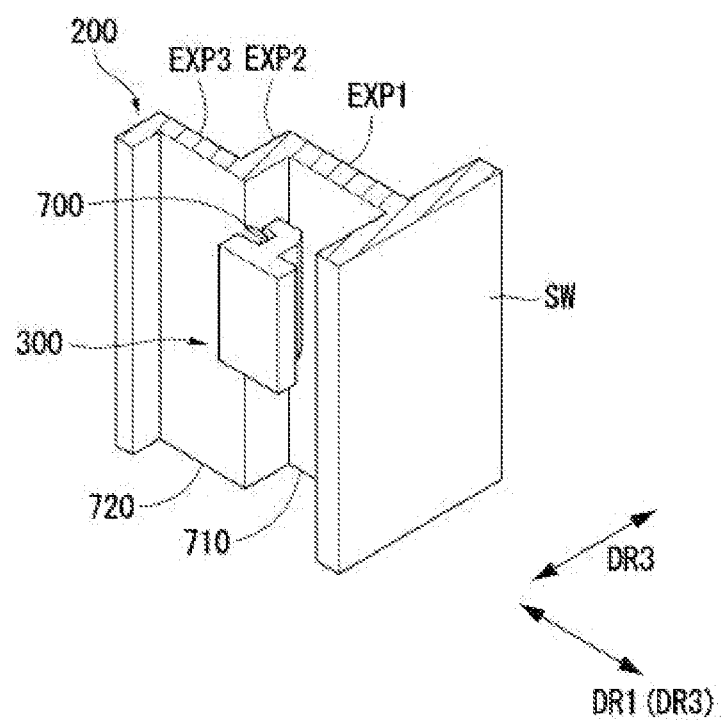

In such a manner, as shown in FIGS. 12 and 13, the fixer 300 may move in the horizontal direction (i.e., the first direction DR1 and/or the second direction DR2) in a state where the fixer 300 is inserted into the first groove 710 of the guide panel 200. Hence, as shown in FIGS. 13 and 14, as the first protuberance 700 is inserted into a space between the base part 310 and the head part 330 of the fixer 300, the fixer 300 may be connected to the guide panel 200 in the sliding manner.

Figure 14:
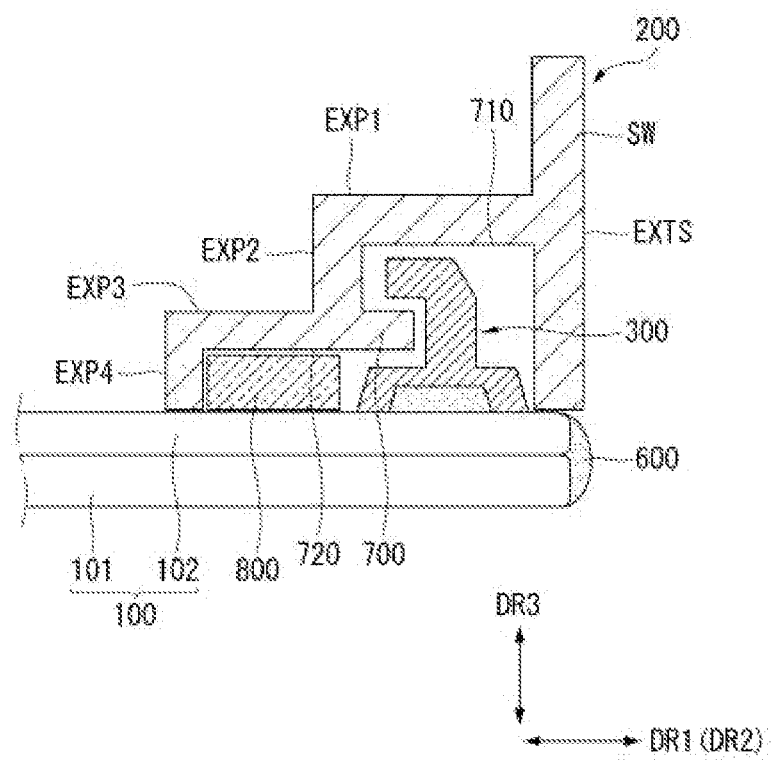

As shown in FIG. 14, the first protuberance 700 of the guide panel 200 may extend from the second extension EXP2 in the horizontal direction (i.e., the first direction DR1 and/or the second direction DR2).

Further, a pad 800 having elasticity may be disposed between the guide panel 200 and the back surface of the display panel 100. Preferably, the pad 800 may be disposed at a location corresponding to the second groove 720 of the guide panel 200.

The guide panel 200 may cover the fixer 300 in a state where the guide panel 200 and the fixer 300 are connected to each other.

Figure 15:
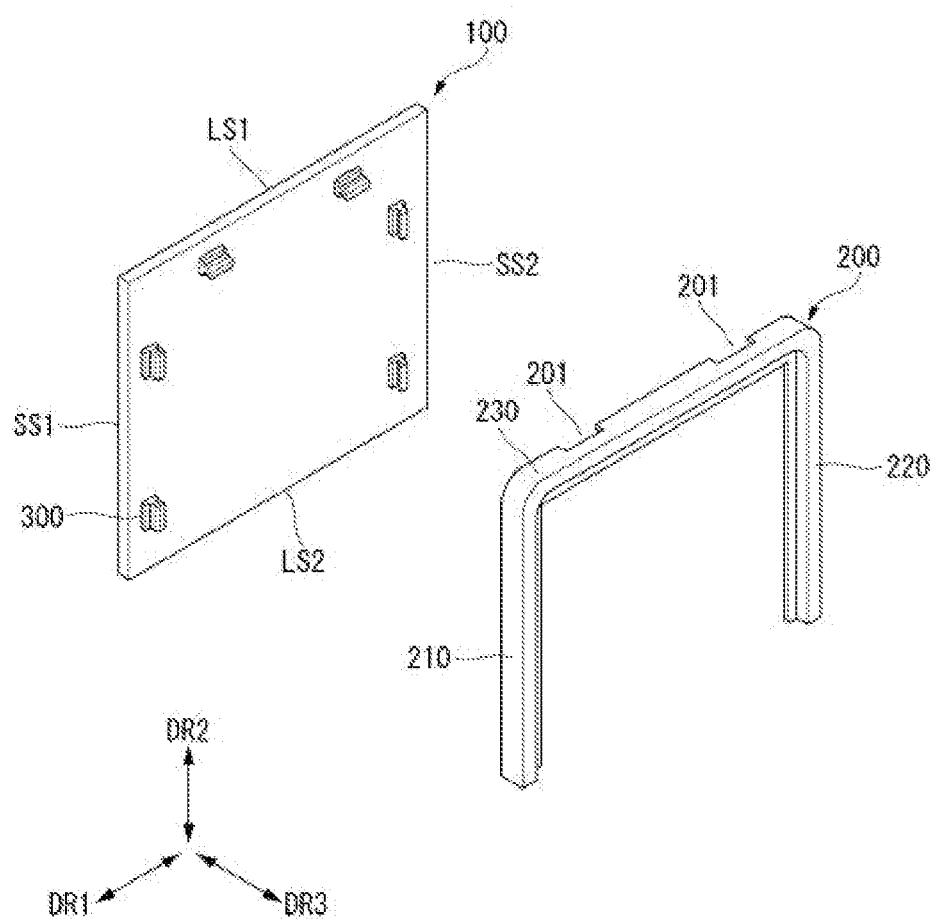

As shown in FIG. 15, at least one fixer 300 may be disposed on the first long side LS1 of the display panel 100.

Further, the guide panel 200 may include the first guide panel 210 corresponding to the first short side SS1 of the display panel 100, the second guide panel 220 corresponding to the second short side SS2 of the display panel 100, and the third guide panel 230 corresponding to the first long side LS1 of the display panel 100. The first, second, and third guide panels 210, 220, and 230 may form one body.

In this instance, it may be preferable, but not required, that the third guide panel 230 has an opening 201, so as to connect the fixer 300 disposed on the first long side LS1 of the display panel 100 to the third guide panel 230.

Figure 16:
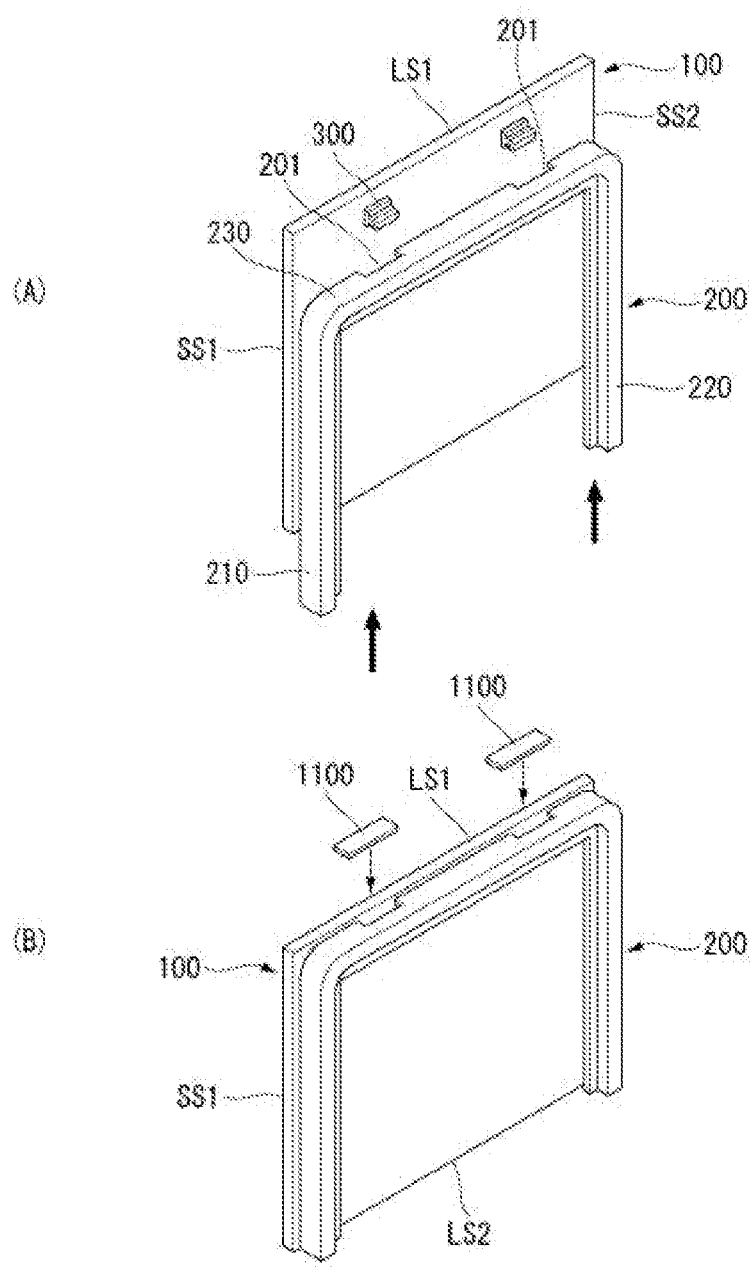

As shown in (A) of FIG. 16, the fixers 300 disposed on the first short side SS1 and the second short side SS2 of the display panel 100 may be inserted into the first grooves 710 of the first and second guide panels 210 and 220.

Next, as shown in (B) of FIG. 16, when the guide panel 200 is pushed up, the fixer 300 disposed on the first long side LS1 of the display panel 100 may pass through the opening 201 formed on the side wall SW of the third guide panel 230.

Afterwards, the opening 201 may be covered using a cover 1100. Namely, the cover 1100 may cover the opening 201.

Figure 17:
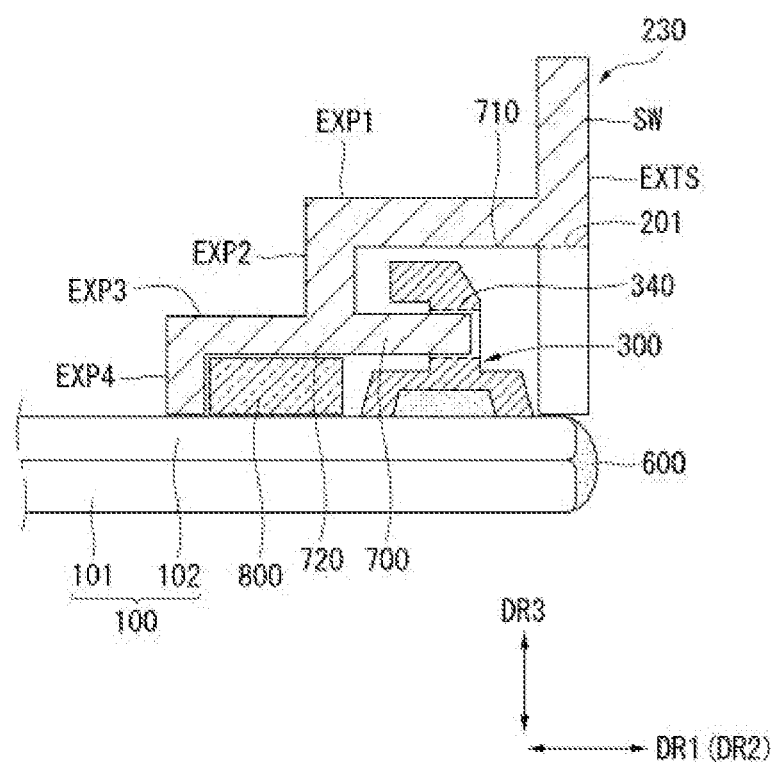

As shown in FIG. 17, when the fixer 300 disposed on the first long side LS1 of the display panel 100 passes through the opening 201 formed in the side wall SW of the third guide panel 230, the first protuberance 700 formed on an inner surface of the first groove 710 may be inserted into a space between the base part 310 and the head part 330 of the fixer 300.

Alternatively, the first protuberance 700 may be inserted into an opening 340 formed in the connector 320 of the fixer 300. For this, a length of the first protuberance 700 of the third guide panel 230 in the horizontal direction (i.e., the first direction DR1 and/or the second direction DR2) may be longer than lengths of the first protuberances 700 of the first and second guide panels 210 and 220 in the horizontal direction (i.e., the first direction DR1 and/or the second direction DR2).

Figure 18:
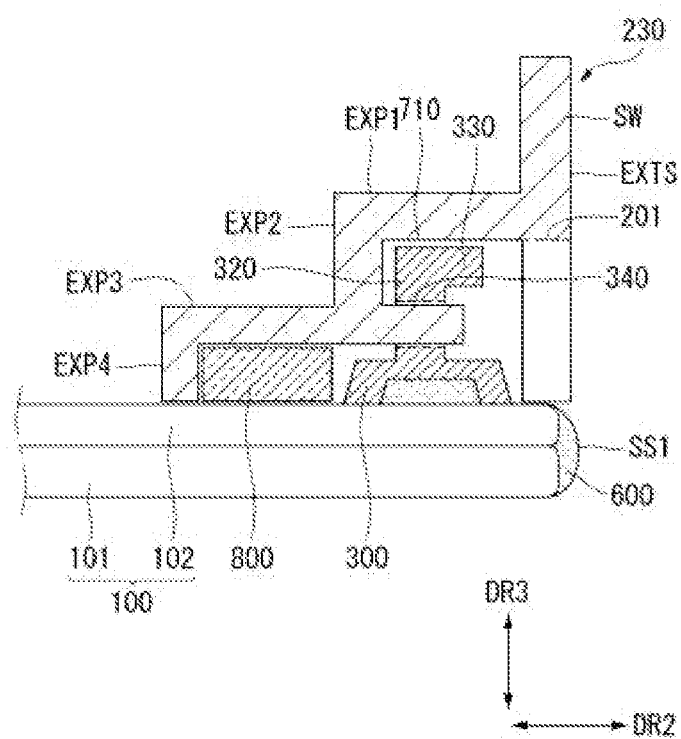

As shown in FIG. 18, the head part 330 of the fixer 300 may extend from the connector 320 in the horizontal direction (i.e., the first direction DR1 and/or the second direction DR2) far from the center of the display panel 100, so as to easily insert the first protuberance 700 of the third guide panel 230 into the opening 340 of the fixer 300.

In this instance, even if the length of the first protuberance 700 of the third guide panel 230 is relatively short, the first protuberance 700 of the third guide panel 230 may be easily inserted into the opening 340 of the fixer 300.

In this instance, the first protuberance 700 of the third guide panel 230 may protrude from the inner surface of the first groove 710 in the direction far from the center of the display panel 100. For example, the first protuberance 700 of the third guide panel 230 may protrude from the second extension EXP2 of the third guide panel 230 in the direction far from the center of the display panel 100.

Figure 19:
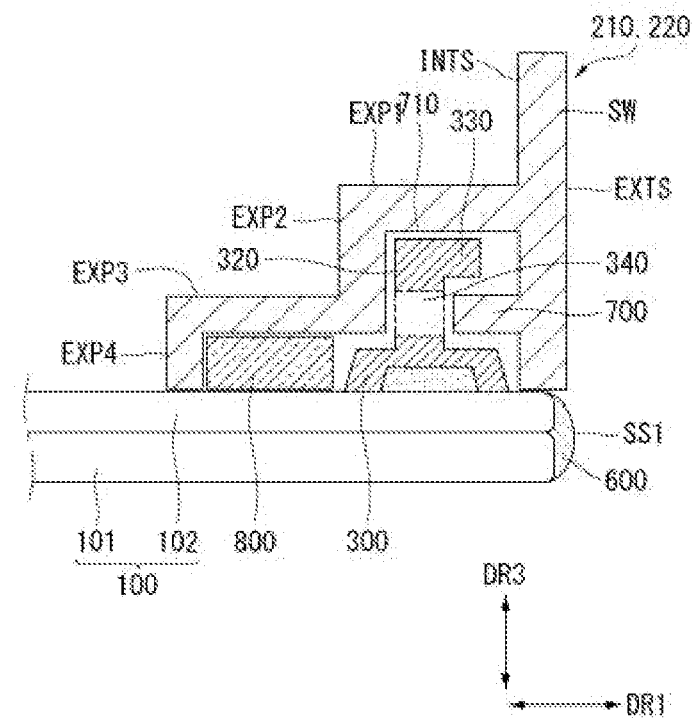

As shown in FIG. 19, the first protuberances 700 of the first and second guide panels 210 and 220 may protrude in the direction toward the center of the display panel 100. For example, the first protuberances 700 of the first and second guide panels 210 and 220 may protrude from the side walls SW of the first and second guide panels 210 and 220 in the direction toward the center of the display panel 100.

In this instance, the fixers 300 disposed on the first and second short sides SS1 and SS2 of the display panel 100 may be easily connected to the first and second guide panels 210 and 220 in the sliding manner.

Figure 20:
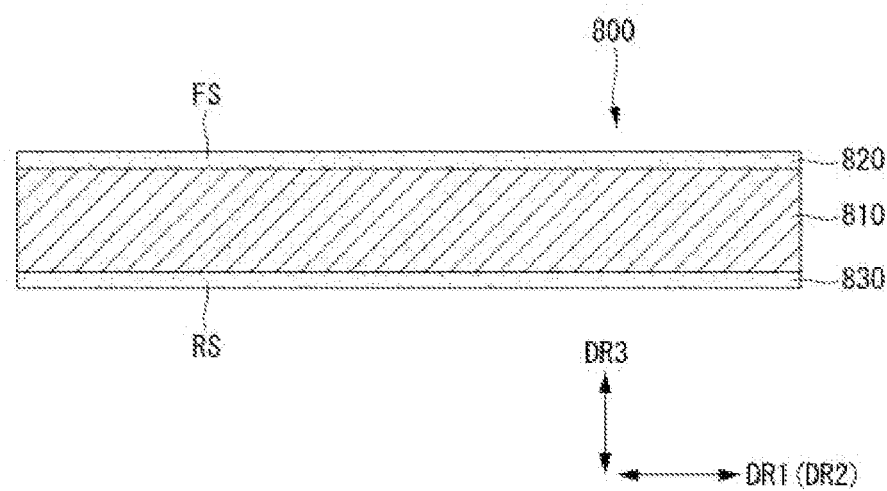

As shown in FIG. 20, an adhesive layer 800 for attaching the guide panel 200 to the back surface of the display panel 100 may include a base layer 810, a first layer 820 which is formed on a first surface FS of the base layer 810 and has the adhesion, and a second layer 830 which is formed on a second surface RS of the base layer 810 and has the adhesion.

It may be preferable, but not required, that the base layer 810 may be formed of a material having elasticity. For example, the base layer 810 may be formed of urethane foam.

The adhesive layer 800 having the above-described configuration may have the elasticity and the flexibility as well as the adhesion. Hence, the adhesive layer 800 may prevent an external force from being applied to the guide panel 200 and thus may prevent the external force from being transferred to the display panel 100.

The adhesive layer 800 having the above-described configuration may be referred to as a foam pad.

Figure 21:
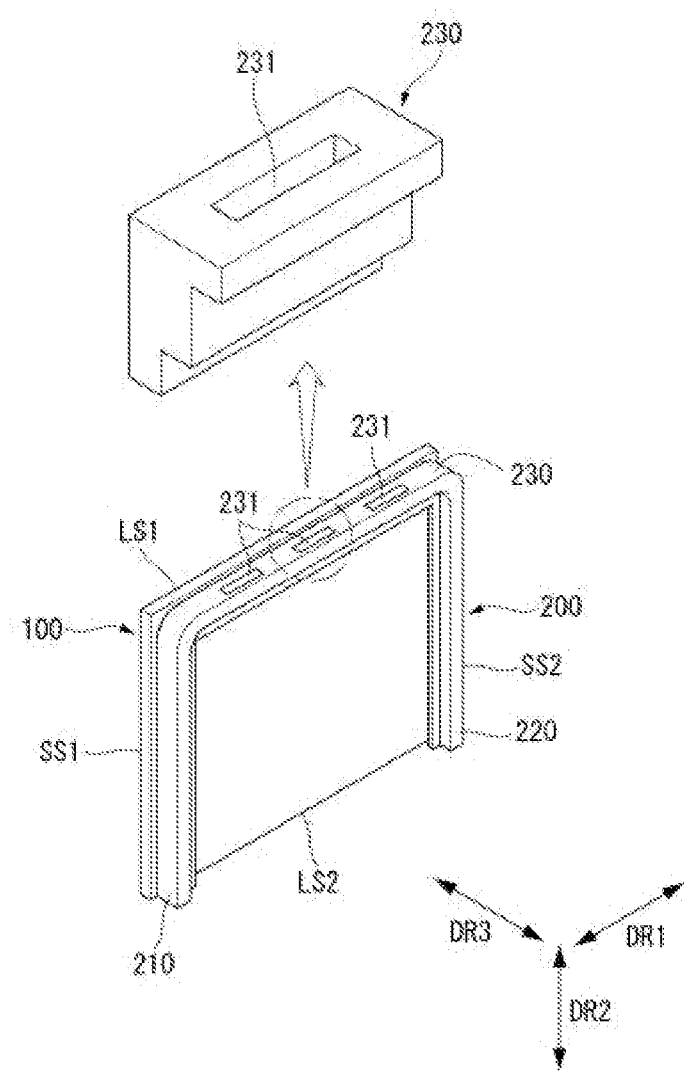

As shown in FIG. 21, the third guide panel 230 may include a third connector 231. The third connector 231 may be formed on an external surface of the side wall SW of the third guide panel 230 and may be a hole or a groove formed toward the second long side LS2.

Figure 22:
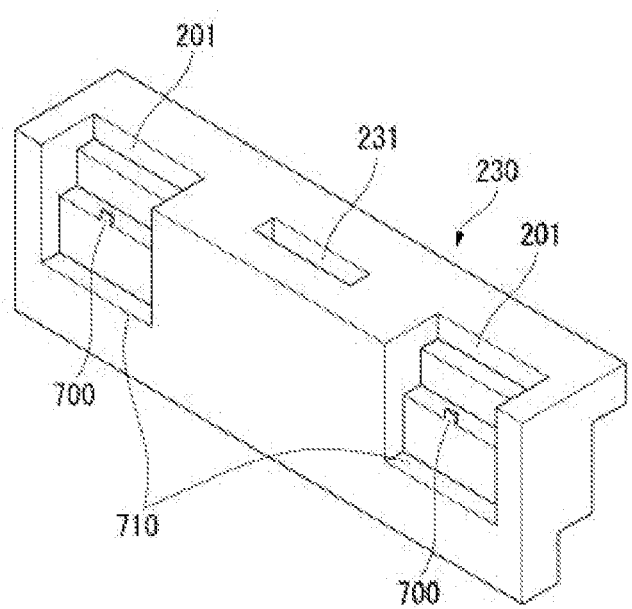
Figure 22:
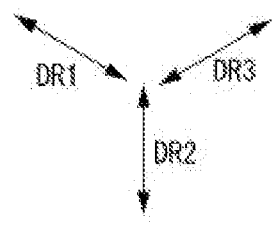

As shown in FIG. 22, the third connector 231 may be positioned between the first grooves 710 corresponding to the fixers 300 on the side wall SW of the third guide panel 230.

Figure 23:
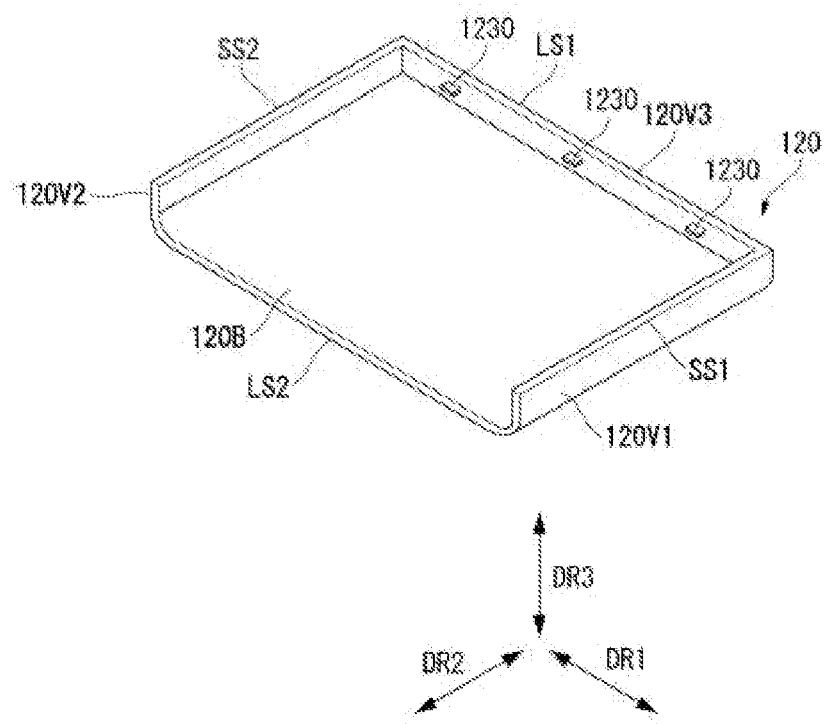

As shown in FIG. 23, the back cover 120 may include a third protrusion 1230 corresponding to the third connector 231.

The back cover 120 may include a main cover 120B, a first vertical part 120V1 which extends from the main cover 120B and covers the external surface of the first guide panel 210, a second vertical part 120V2 which extends from the main cover 120B and covers the external surface of the second guide panel 220, and a third vertical part 120V3 which extends from the main cover 120B and covers the external surface of the third guide panel 230.

The third protrusion 1230 may protrude from the third vertical part 120V3 toward the second long side LS2. The third protrusion 1230 may be inserted into the third connector 231.

Figure 24:
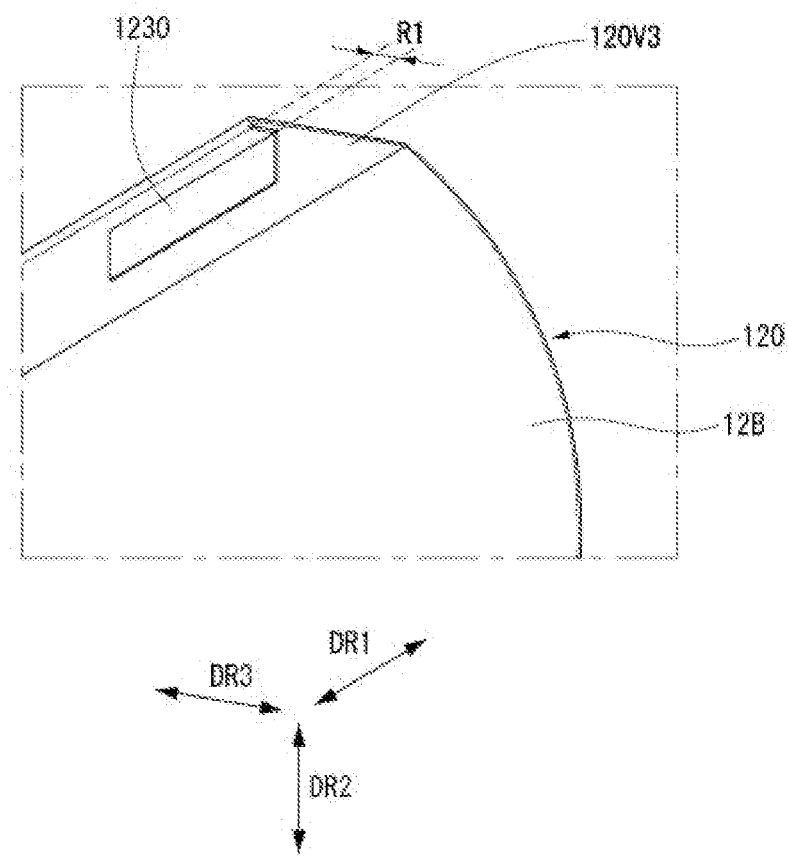

As shown in FIG. 24, an end of the third vertical part 120V3 of the back cover 120 may be formed by folding a portion of the back cover 120. The embodiment of the invention described that the end of the third vertical part 120V3 is formed by folding a portion of the back cover 120. However, an end of the first vertical part 120V1 and/or an end of the second vertical part 120V2 may be formed by folding a portion of the back cover 120.

The third protrusion 1230 may be separated from the end of the third vertical part 120V3 by a predetermined distance R1 in the vertical direction (i.e., the third direction DR3).

Further, although not shown, a first protrusion 1210 of the back cover 120 may be separated from the end of the first vertical part 120V1 by a predetermined distance, and a second protrusion 1220 of the back cover 120 may be separated from the end of the second vertical part 120V2 by a predetermined distance.

Figure 25:
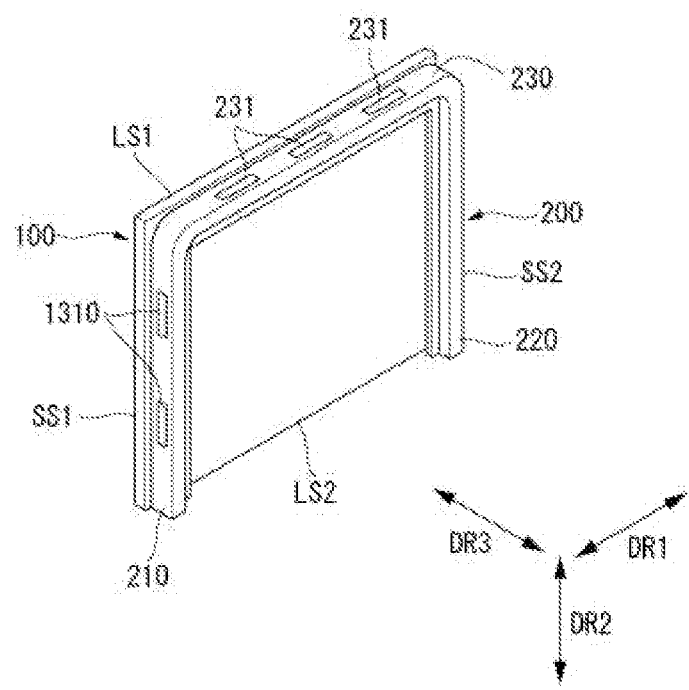

As shown in FIG. 25, the first guide panel 210 may have a first connector 1310. Further, although not shown, the second guide panel 220 may have a second connector 1320.

The first connector 1310 and the second connector 1320 are described in detail below with reference to FIGS. 26A and 26B.

Figure 26A:
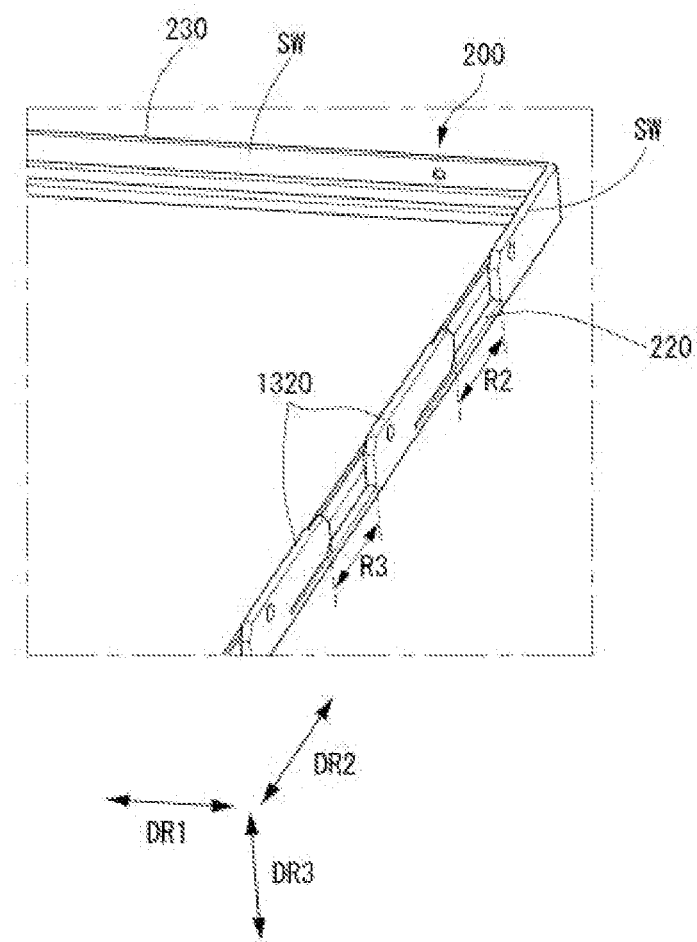
Figure 26B:
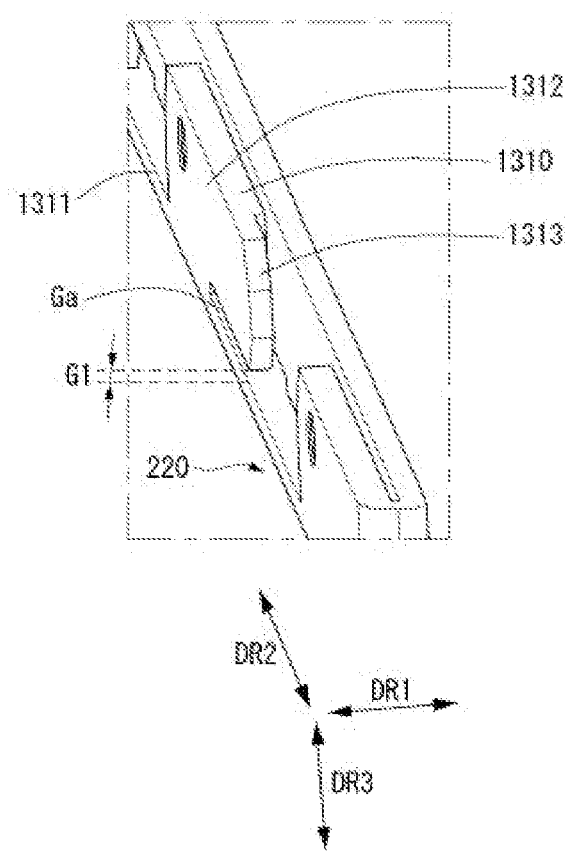

As shown in FIGS. 26A and 26B, the second connector 1320 may be formed on the side wall SW of the second guide panel 220, and the first connector 1310 may be formed on the side wall SW of the first guide panel 210. The first connector 1310 and the second connector 1320 may substantially have the same structure and may be vertically symmetrical to each other.

The first connector 1310 may include a first latch engaged with the first protrusion, and the second connector 1320 may include a second latch engaged with the second protrusion. In the following description, the first connector 1310 may be referred to as the first latch, and the second connector 1320 may be referred to as the second latch.

A space R3 may be provided between the two adjacent second connectors 1320 (or between the two adjacent first connectors 1310).

Further, a space R2 may be provided between the second connector 1320 and the side wall SW (or between the first connector 1310 and the side wall SW).

As shown in FIG. 26B, each of the first latch and the second latch (i.e., the first connector 1310 and the second connector 1320) may include a first portion 1312 extending from a bottom 1311 in the vertical direction (i.e., the third direction DR3) and a second portion 1313 extending from the first portion 1312 in the horizontal direction (i.e., the first direction DR1 and/or the second direction DR2).

A gap Ga may be formed between the second portion 1313 and the bottom 1311.

Figure 27:
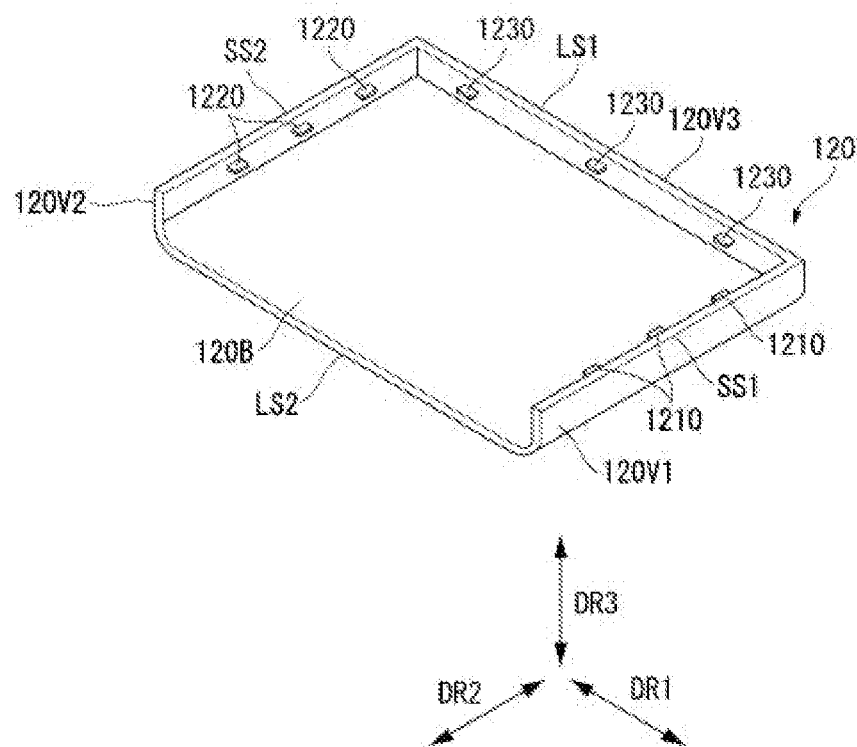

As shown in FIG. 27, the back cover 120 may include the first protrusion 1210 corresponding to the first connector 1310 and the second protrusion 1220 corresponding to the second connector 1320.

The first protrusion 1210 may protrude from the first vertical part 120V1 toward the second vertical part 120V2, and the second protrusion 1220 may protrude from the second vertical part 120V2 toward the first vertical part 120V1.

Figure 28:
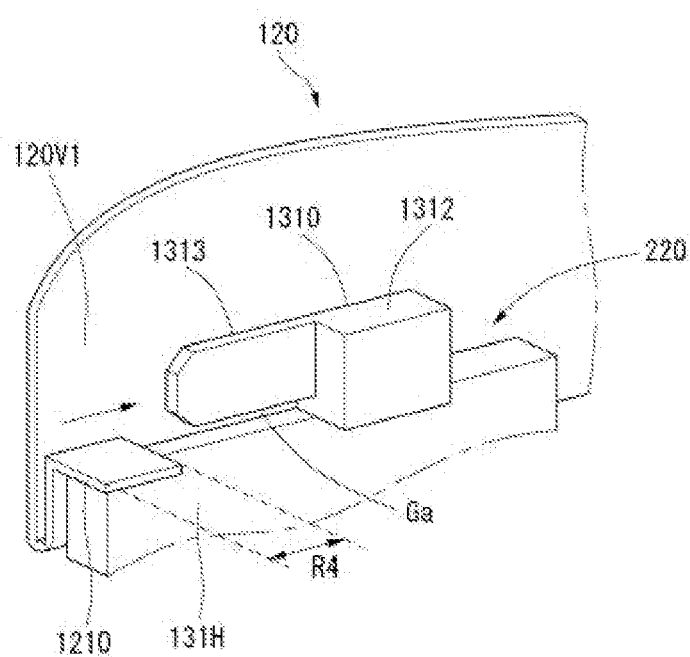

As shown in FIG. 28, the first protrusion 1210 may be engaged with the first connector 1310 in an arrow direction in the sliding manner. The first protrusion 1210 may be inserted into the gap Ga between the second portion 1313 and the bottom 1311 of the first connector 1310.

Further, the second protrusion 1220 may be engaged with the second connector 1320 in the sliding manner. The second protrusion 1220 may be inserted into the gap Ga between the second portion 1313 and the bottom 1311 of the second connector 1320.

As described above, the space R2 between the first connector 1310 and the side wall SW may be greater than a length R4 of the first protrusion 1210, and the space R2 between the second connector 1320 and the side wall SW may be greater than a length R4 of the second protrusion 1220, so as to connect the first and second protrusions 1210 and 1220 to the first and second connectors 1310 and 1320 in the sliding manner.

Further, the space R3 between the adjacent first connectors 1310 may be greater than the length R4 of the first protrusion 1210, and the space R3 between the adjacent second connectors 1320 may be greater than the length R4 of the second protrusion 1220.

Figure 29A:
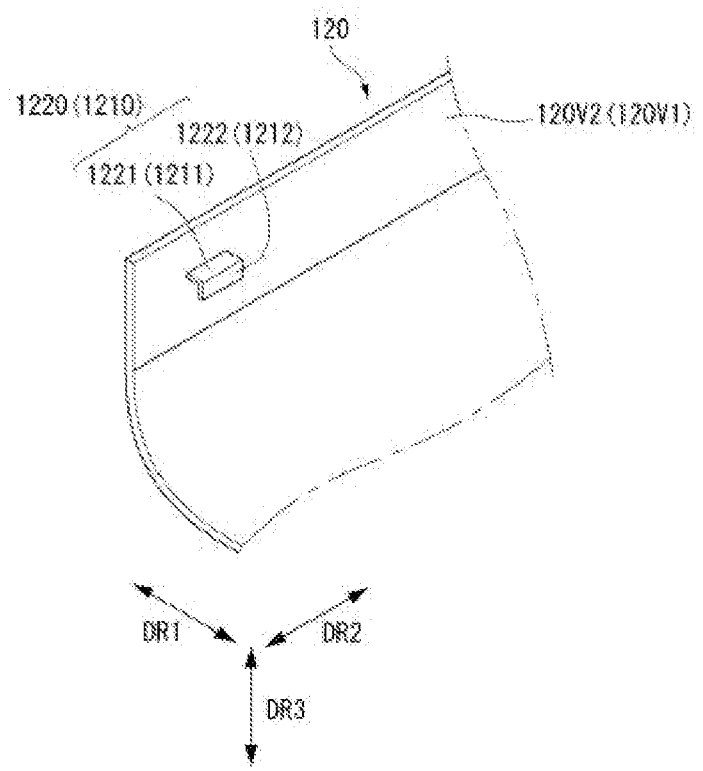
Figure 29B:
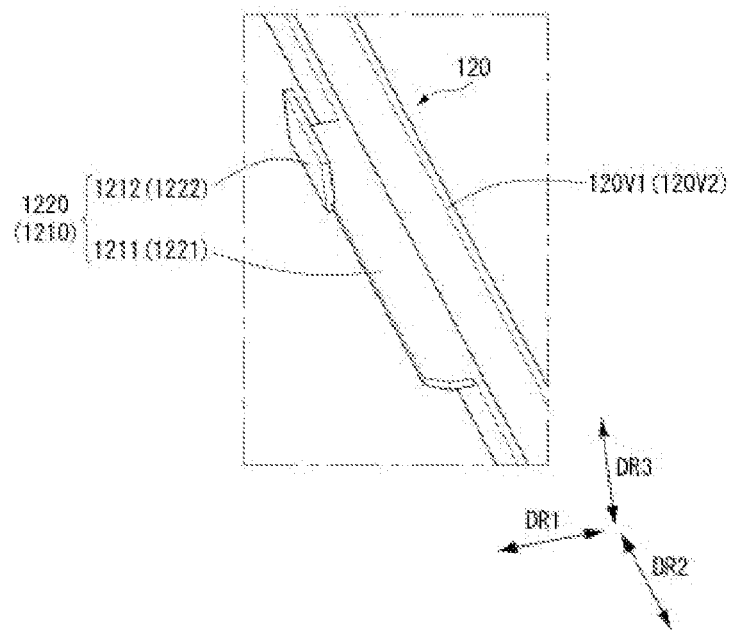

As shown in FIGS. 29A and 29B, the first protrusion 1210 may include a first main protrusion 1211 protruding from the first vertical part 120V1 toward the second vertical part 120V2 and a first auxiliary protrusion 1212 extending from the first main protrusion 1211 in the vertical direction (i.e., the third direction DR3).

Further, the second protrusion 1220 may include a second main protrusion 1221 protruding from the second vertical part 120V2 toward the first vertical part 120V1 and a second auxiliary protrusion 1222 extending from the second main protrusion 1221 in the vertical direction (i.e., the third direction DR3).

Figure 30:
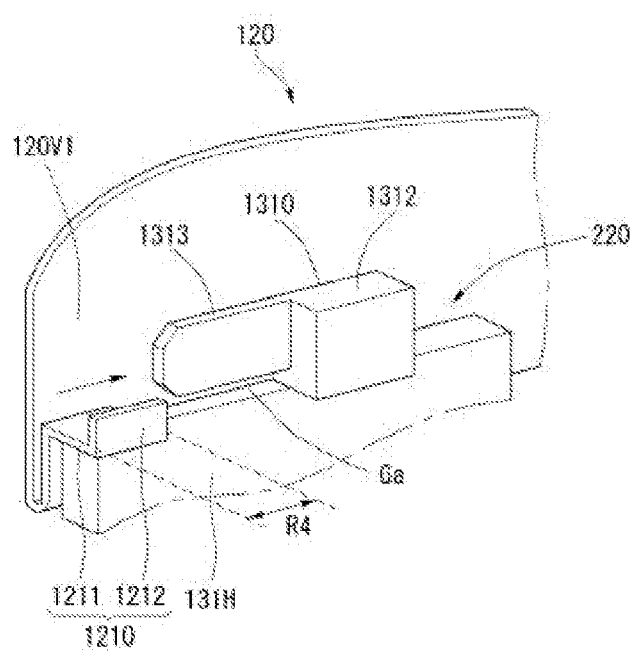

As shown in FIG. 30, the first auxiliary protrusion 1212 of the first protrusion 1210 may be engaged with the second portion 1313 of the first connector 1310 in a state where the first protrusion 1210 is inserted into the gap Ga of the first connector 1310.

Further, the second auxiliary protrusion 1222 of the second protrusion 1220 may be engaged with the second portion 1313 of the second connector 1320 in a state where the second protrusion 1220 is inserted into the gap Ga of the second connector 1320.

In such a structure, the back cover 120 may be easily connected to the display module 100M in the sliding manner.

Figure 31:
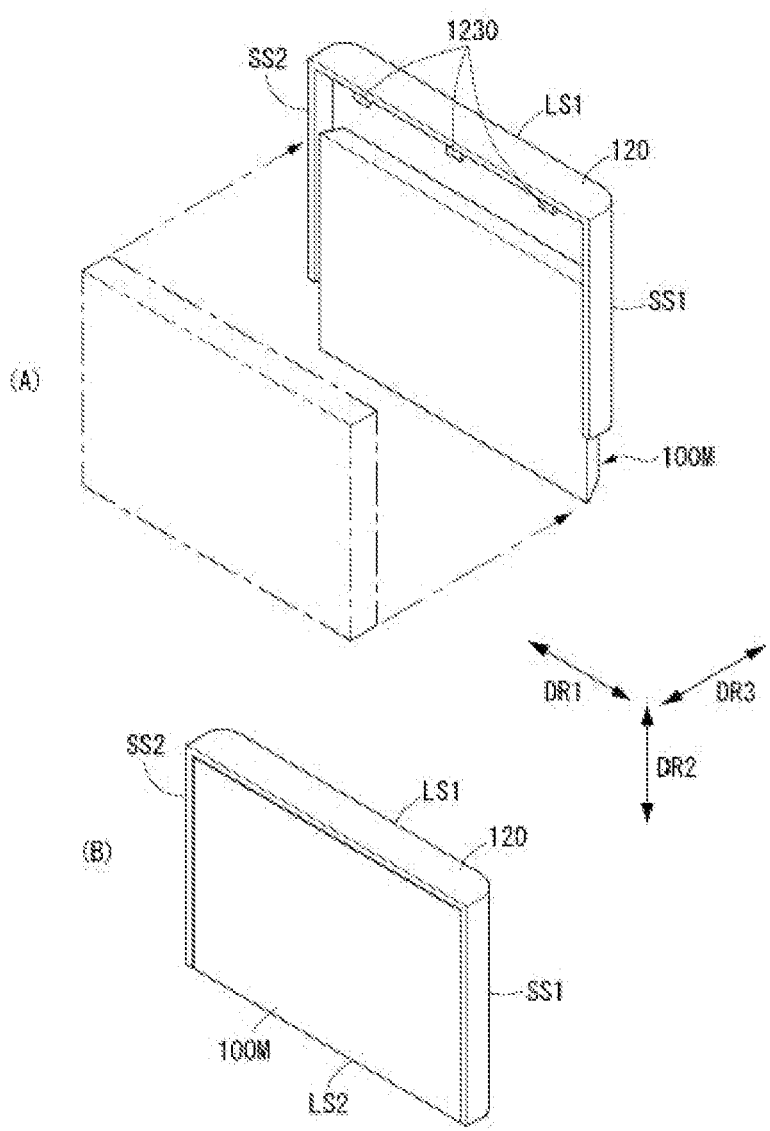

For example, when the display module 100M is pushed toward the first long side LS1 of the back cover 120 in a state where the display module 100M is inserted into the back cover 120 in the vertical direction (i.e., the third direction DR3) as shown in (A) of FIG. 31, the back cover 120 may be connected to the display module 100M as shown in (B) of FIG. 31.

As described above, the back cover 120 may be connected to the display module 100M in the sliding manner.

Figure 32:
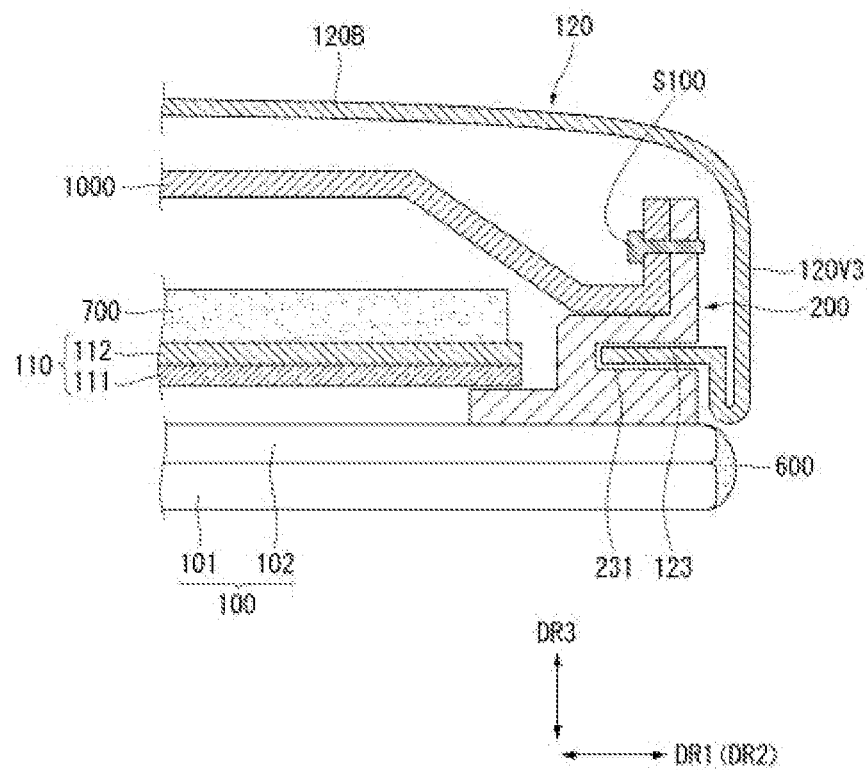

As shown in FIG. 32, which is a cross-sectional view of the first long side LS1 of the display device 10 according to the embodiment of the invention, the third protrusion 1230 of the back cover 120 may be inserted into the third connector 231 of the third guide panel 230.

The frame 1000 positioned between the display panel 100 and the back cover 120 may be connected to the guide panel 200. For example, a fastening member S100, such as a screw, may connect the side wall SW of the guide panel 200 to the frame 1000.

An optical layer 110 may be disposed between the frame 1000 and the display panel 100. Further, a light guide plate 900 may be disposed between the frame 1000 and the display panel 100. (도 32에 미도시)

At least one light source (not shown) may be disposed on the frame 1000.

The optical layer 110 may include a diffusion sheet 111 and a prism sheet 112. The embodiment of the invention describes the optical layer 110 including the two functional layers (for example, the diffusion sheet 111 and the prism sheet 112). However, a structure of the optical layer 110 may be variously changed.

In the embodiment of the invention, the optical layer 110, the light guide plate 900, and the light source may be referred to as a backlight unit.

When the backlight unit includes the light guide plate 900, the light source (not shown), for example, a light emitting diode (LED) may be positioned on the side of the light guide plate 900. The backlight unit having the above-described configuration may be referred to as an edge type backlight unit.

In the embodiment of the invention, the light source may be disposed in the rear of the display panel 100. The backlight unit having the above-described configuration may be referred to as a direct type backlight unit.

Configuration of the backlight unit of the display device 10 according to the embodiment of the invention may be variously changed.

Figure 33:
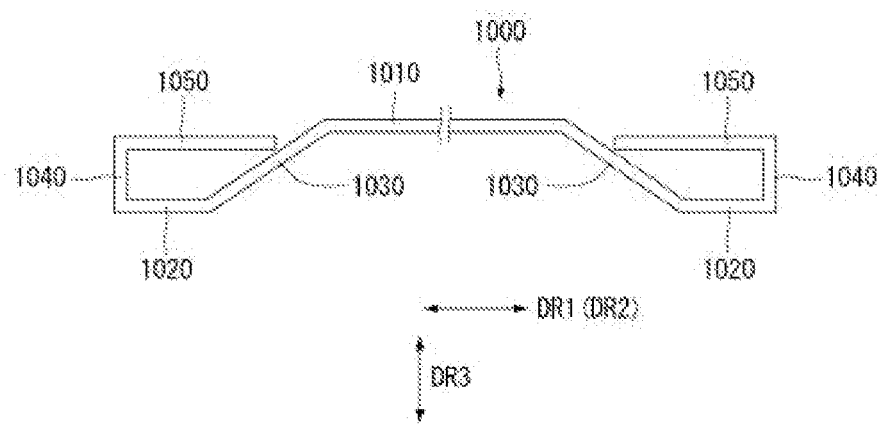

As shown in FIG. 33, the frame 1000 may include a first horizontal frame part 1010 extending in the horizontal direction (i.e., the first direction DR1 and/or the second direction DR2), a second horizontal frame part 1020 which is positioned at an edge of the first horizontal frame part 1010 and extends in the horizontal direction (i.e., the first direction DR1 and/or the second direction DR2), an inclined frame part 1030 which is positioned between the first horizontal frame part 1010 and the second horizontal frame part 1020 and extends in an oblique direction, a vertical frame part 1040 extending from an end of the second horizontal frame part 1020 in the vertical direction (i.e., the third direction DR3), and a third horizontal frame part 1050 which extends from an end of the vertical frame part 1040 toward the inclined frame part 1030 in the horizontal direction (i.e., the first direction DR1 and/or the second direction DR2).

Figure 34:
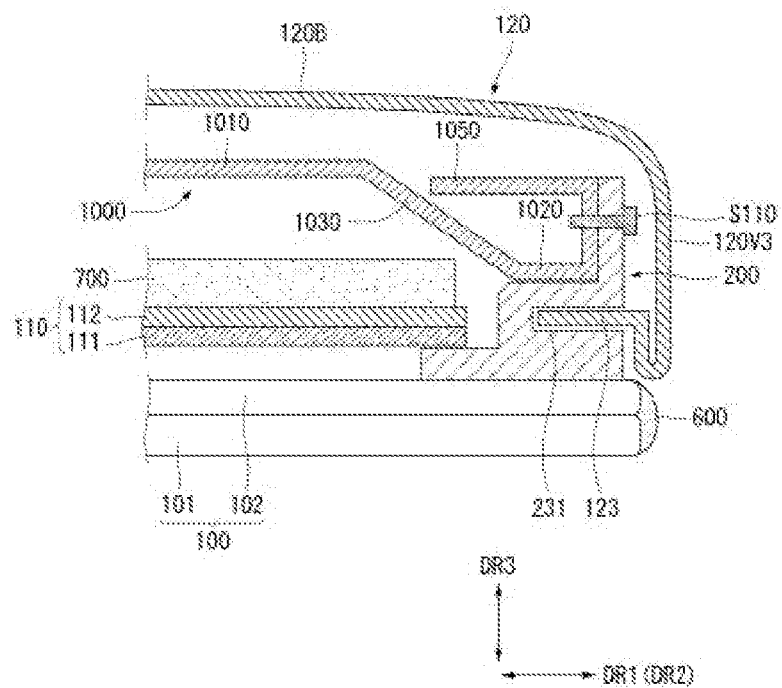

As shown in FIG. 34, the vertical frame part 1040 of the frame 1000 and the side wall SW of the guide panel 200 may be fastened by a predetermined fastening member S110. Hence, the frame 1000 and the guide panel 200 may be strongly connected.

Figure 35:
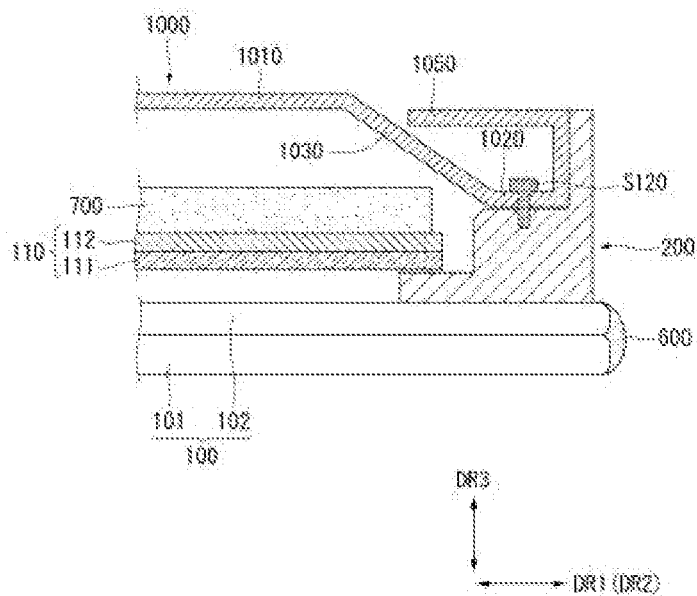

Alternatively, as shown in FIG. 35, a predetermined fastening member S120 may fasten the second horizontal frame part 1020 of the frame 1000 to the guide panel 200. In this instance, a fastening direction of the fastening member S120 may be a direction from the back cover 120 to the display panel 100.

Figure 36:
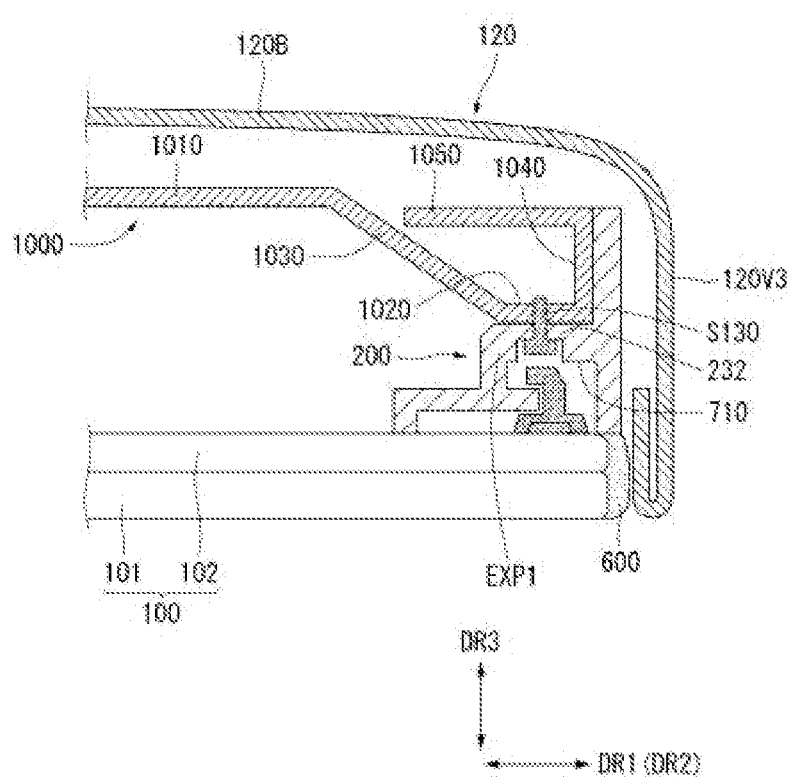

As shown in FIG. 36, a predetermined fastening member S130 may fasten the second horizontal frame part 1020 of the frame 1000 to the guide panel 200, and a fastening direction of the fastening member S130 may be a direction from the display panel 100 to the back cover 120.

In this instance, a second groove 232 for the fastening member S130 may be formed inside the first groove 710 of the guide panel 200. A head part of the fastening member S130 may be positioned in the second groove 232.

In such a structure, the fixer 300 positioned inside the first groove 710 may overlap the fastening member S130.

Figure 37:
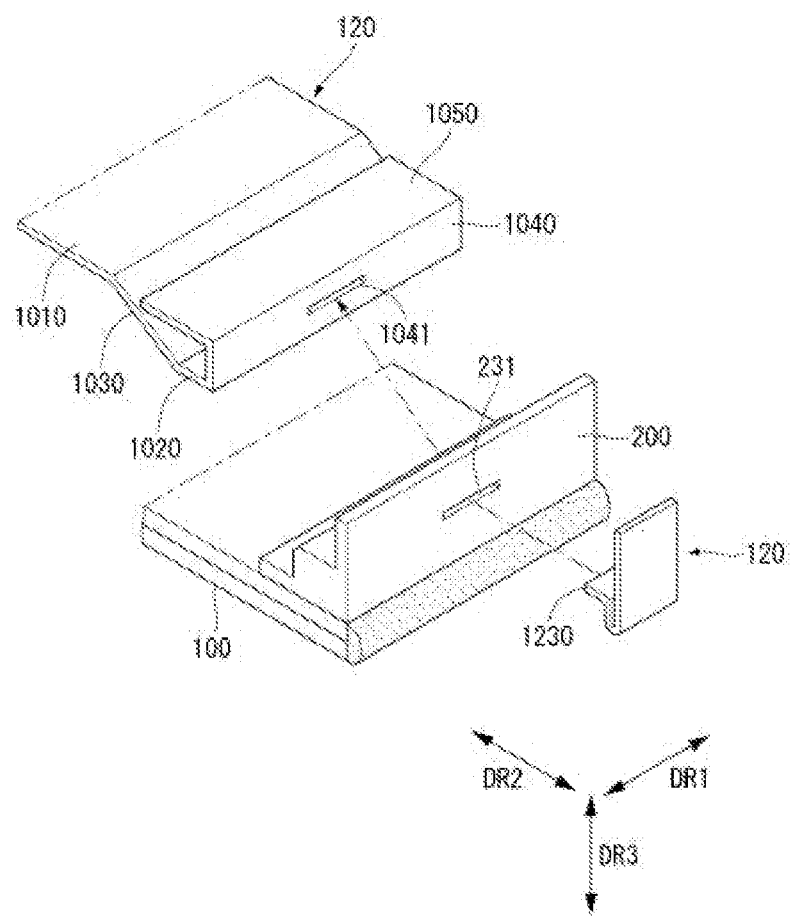

As shown in FIG. 37, the vertical frame part 1040 of the frame 1000 may include a hole 1041 corresponding to the third connector 231. In this instance, the third connector 231 may be an opening.

Figure 38:
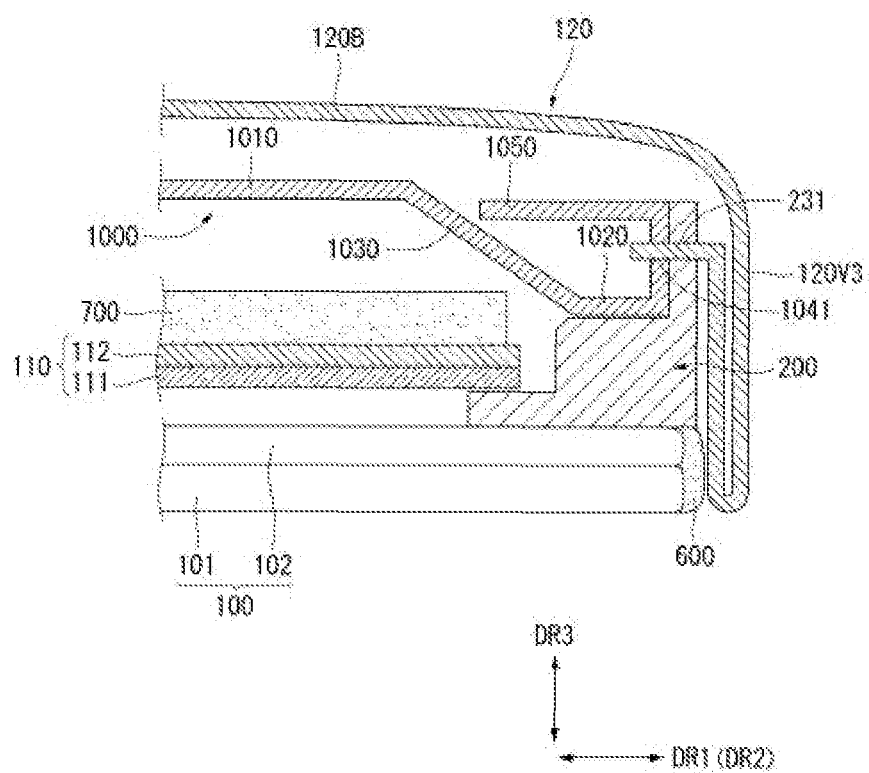

In this instance, as shown in FIG. 38, the third protrusion 1230 of the back cover 120 may pass through the third connector 231 and may be connected to the hole 1041 of the frame 1000. Hence, the structural stability of the display device 10 may be improved.

Figure 39:
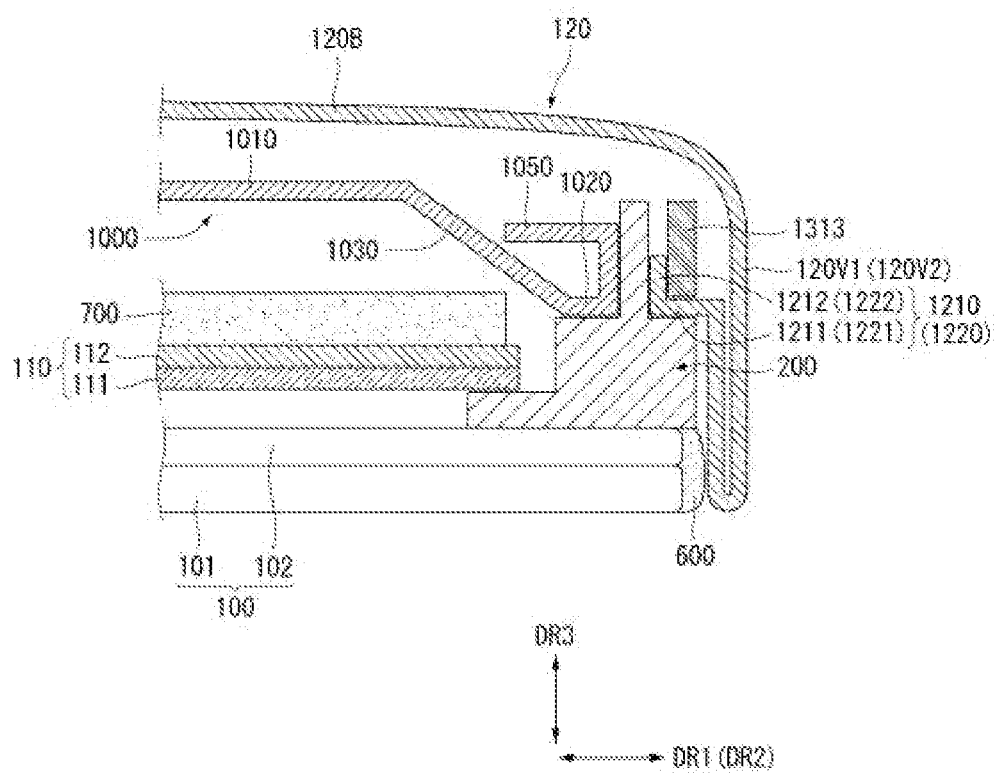

As shown in FIG. 39 which shows a cross section of the first short side SS1 and the second short side SS2 of the display device 10, the first protrusion 1210 and the second protrusion 1220 of the back cover 120 may be engaged with the first connector 1310 and the second connector 1320 of the guide panel 200.

Figure 40:
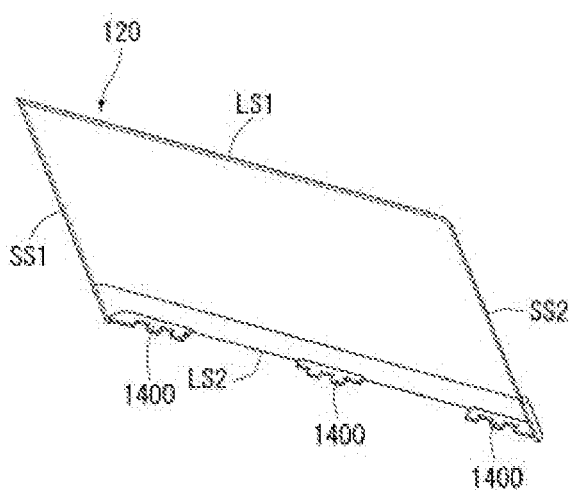

As shown in FIG. 40, the back cover 120 may further include a bottom supporter 1400 disposed on the second long side LS2.

Figure 41:
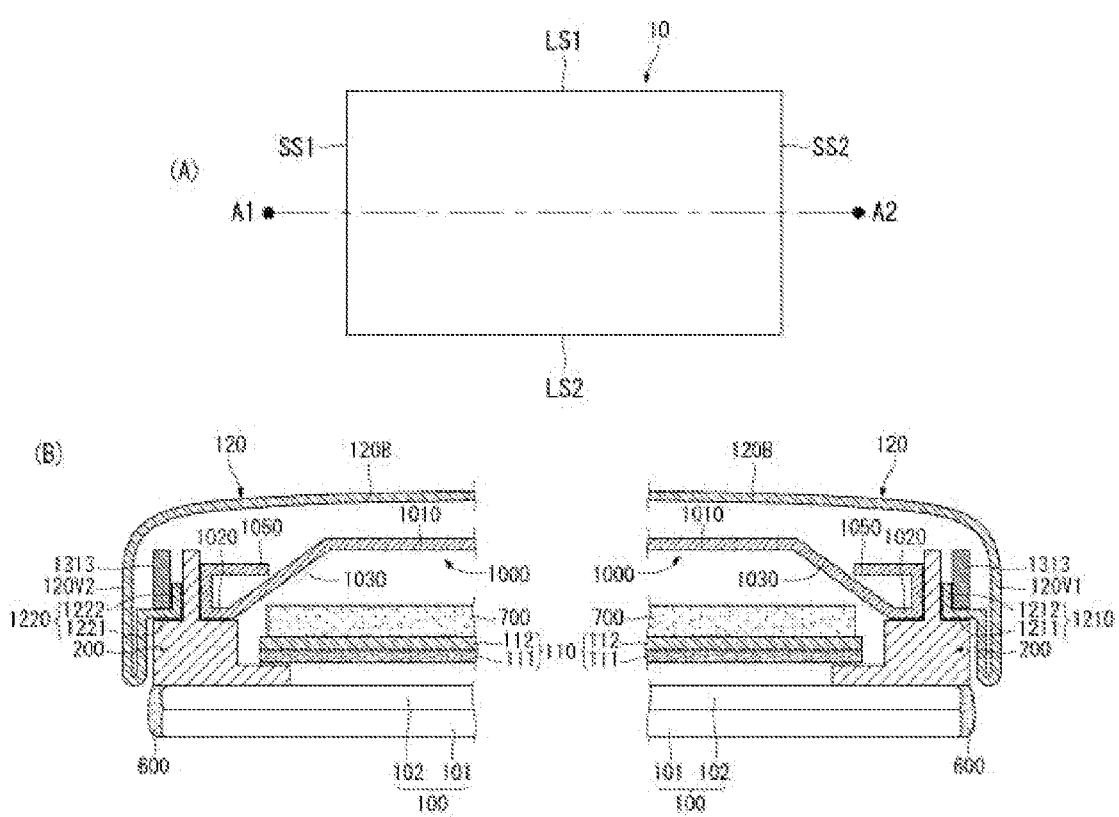

In FIG. 41, (B) is a cross-sectional view of the display device 10 taken along line A1-A2 of (A).

Configuration shown in FIG. 41 was described in detail above.

Figure 42:
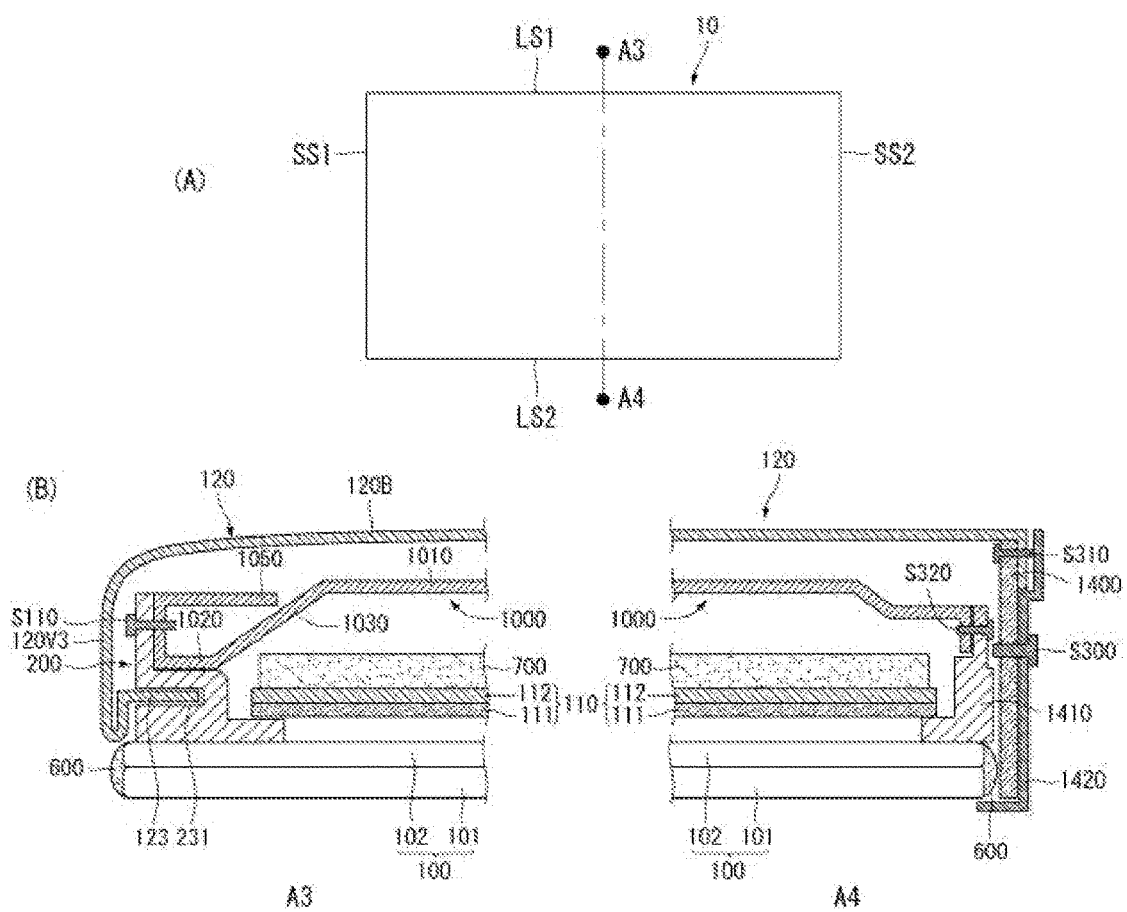

In FIG. 42, (B) is a cross-sectional view of the display device 10 taken along line A3-A4 of (A). Configuration shown in FIG. 42 was described above with reference to FIG. 34.

As shown in (B) of FIG. 42, a bottom guide panel 1410 may be positioned in the rear of the display panel 100 on the second long side LS2 of the display device 10, and the optical layer 110 may be positioned on the bottom guide panel 1410.

Further, the frame 1000 may be connected to the bottom guide panel 1410. For this, a predetermined fastening member S320 may be used.

The bottom supporter 1400 may support the second long side LS2 of the display panel 100 and may be connected to the back cover 120. For this, a predetermined fastening member S310 may be used.

The display device 10 according to the embodiment of the invention may cover an edge of the front surface on the second long side LS2 of the display panel 100 and may further include a bottom cover 1420 supporting the bottom supporter 1400.

The bottom cover 1420 may be connected to the bottom supporter 1400. For this, a predetermined fastening member S300 may be used.

As shown in FIGS. 41 and 42, edges of the front surface of the display panel 100 on the first long side LS1, the first short side SS1, and the second short side SS2 of the display device 10 may be exposed.

Further, the side of the display panel 100 on the first long side LS1, the first short side SS1, and the second short side SS2 of the display device 10 may be exposed.

FIGS. 43 to 59 illustrate another configuration of a display device according to the embodiment of the invention. In the following description, the descriptions of the configuration and the structure described above may be omitted.

Figure 43:
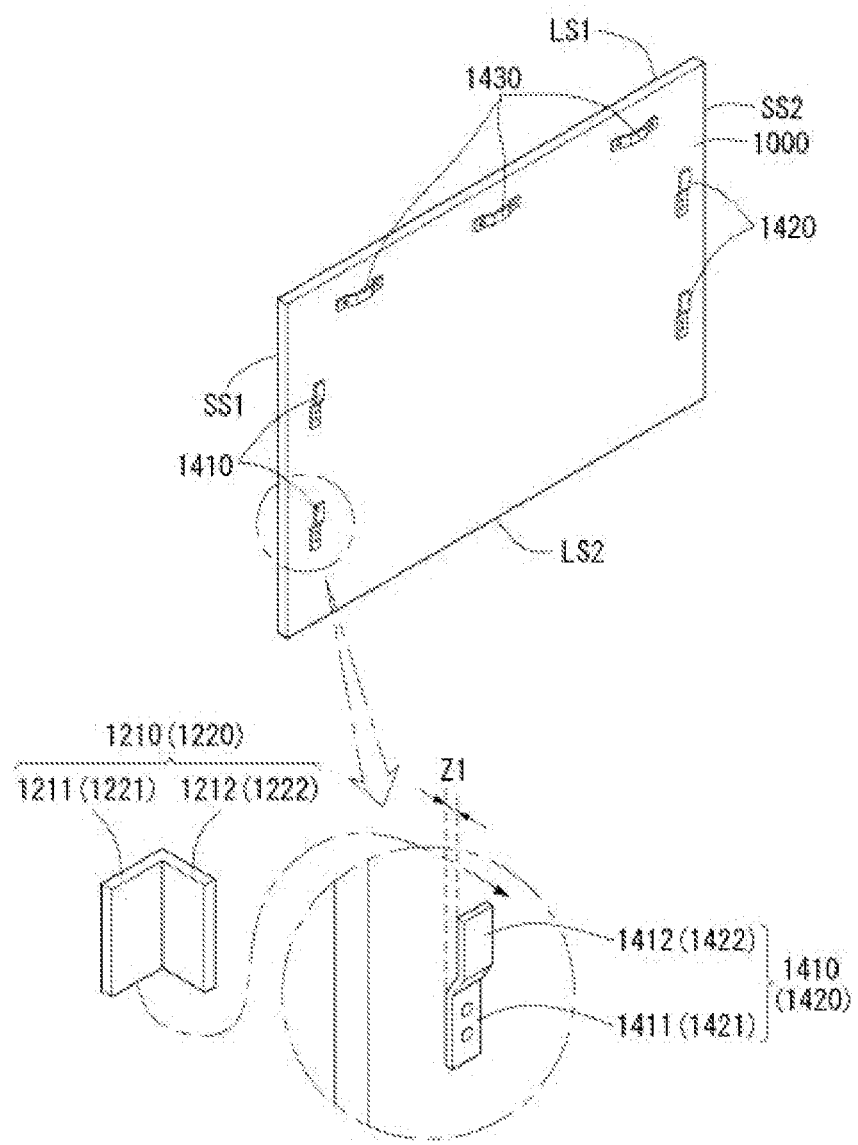
FIGS. 43 to 59 illustrate another configuration of a display device according to an exemplary embodiment of the invention.

As shown in FIG. 43, a first connector 1410 corresponding to the first protrusion 1210 of the back cover 120 may be disposed on the first short side SS1 of the frame 1000, and a second connector 1420 corresponding to the second protrusion 1220 of the back cover 120 may be disposed on the second short side SS2 of the frame 1000. Further, a third connector 1430 corresponding to the third protrusion 1230 of the back cover 120 may be disposed on the first long side LS1 of the frame 1000.

In this instance, the first protrusion 1210 may be connected to the first connector 1410 in the sliding manner, and the second protrusion 1220 may be connected to the second connector 1420 in the sliding manner.

Namely, the back cover 120 may be inserted into the frame 1000 in the sliding manner.

The first connector 1410 and the second connector 1420 may include first parts 1411 and 1421 connected to the frame 1000 and second parts 1412 and 1422 extending from the first parts 1411 and 1421 toward the first long side LS1, respectively.

The first parts 1411 and 1421 may be connected to the frame 1000 using a fastening member such as a screw.

A space Z1 may be provided between the second parts 1412 and 1422 of the first and second connectors 1410 and 1420 and the frame 1000.

The first protrusion 1210 may be inserted into the space Z1 between the second part 1412 of the first connector 1410 and the frame 1000 in the sliding manner, and the second protrusion 1220 may be inserted into the space Z1 between the second part 1422 of the second connector 1420 and the frame 1000 in the sliding manner.

Figure 44:
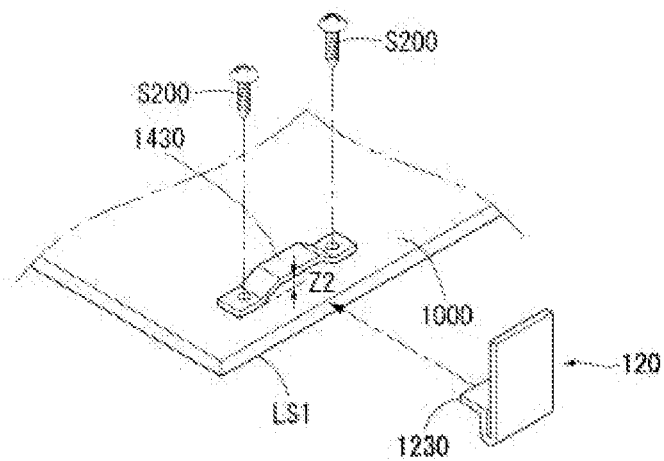

As shown in FIG. 44, both ends of the third connector 1430 may be connected to the frame 1000. For this, a predetermined fastening member S200 may be used.

A space Z2 may be provided between a middle portion of both ends of the third connector 1430 and the frame 1000.

The third protrusion 1230 of the back cover 120 may be inserted into the space Z2 between the third connector 1430 and the frame 1000.

Figure 45:
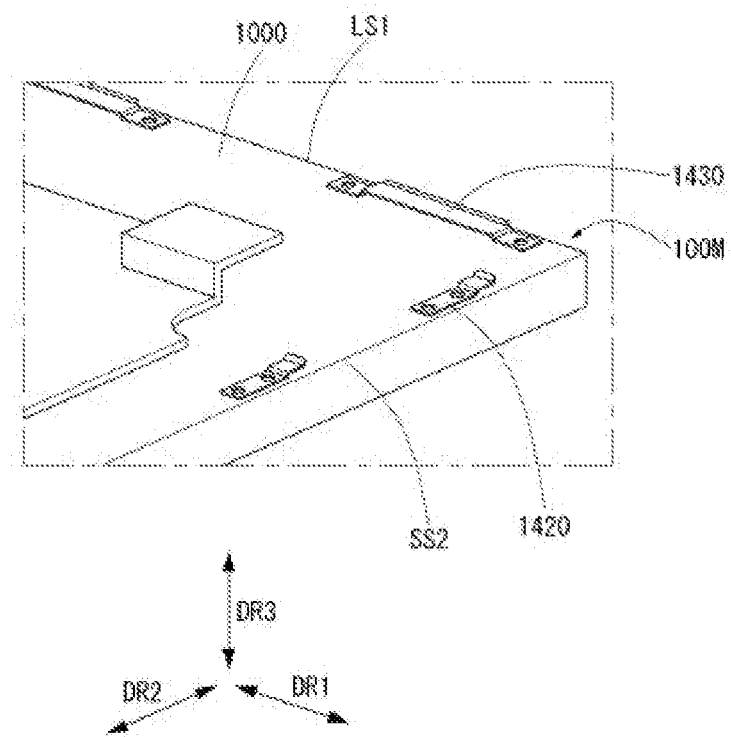

FIG. 45 shows a disposition structure of the first connector 1410, the second connector 1420, and the third connector 1430 disposed on a back surface of the frame 1000.

Figure 46:
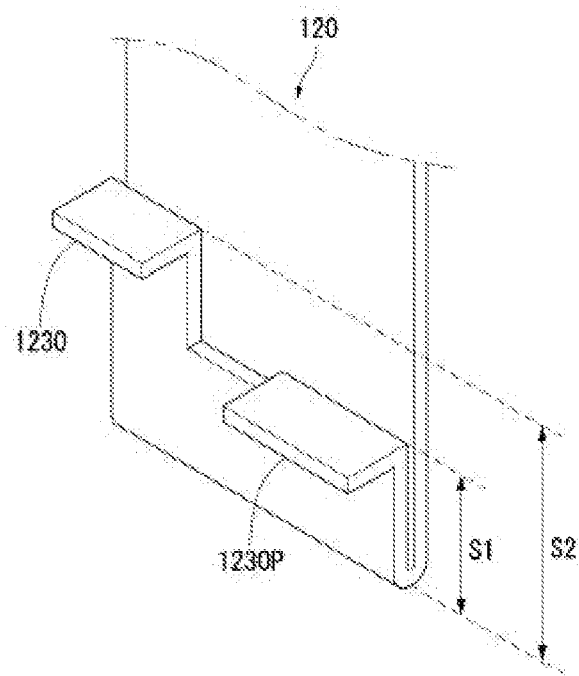

As shown in FIG. 46, the back cover 120 may further include a fourth protrusion 1230P.

The fourth protrusion 1230P may be positioned adjacent to the third protrusion 1230.

The fourth protrusion 1230P may be separated from an end of the back cover 120 by a first distance S1, and the third protrusion 1230 may be separated from the end of the back cover 120 by a second distance S2 longer than the first distance S1.

Figure 47A:
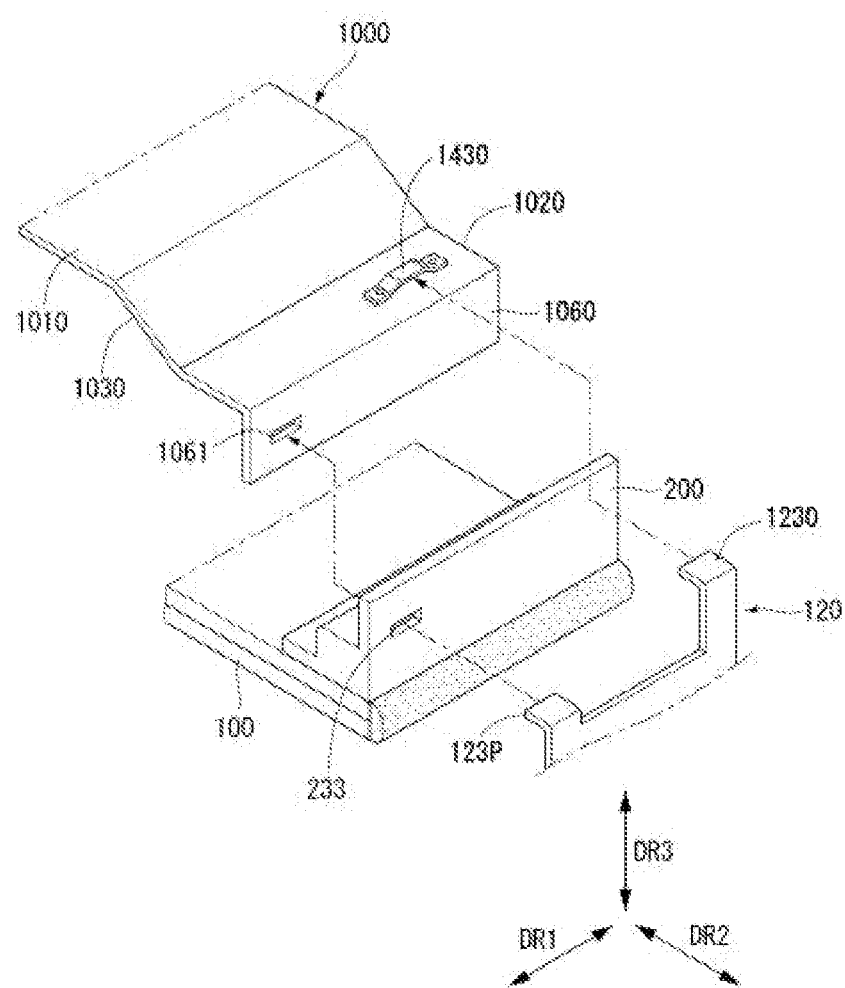

As shown in FIG. 47A, the side wall of the guide panel 200 may include a first through hole 233 corresponding to the fourth protrusion 1230P, and the frame 1000 may include a second through hole 1061 corresponding to the first through hole 233.

In such a structure, the third protrusion 1230 of the back cover 120 may be connected to the third connector 1430, and the fourth protrusion 1230P of the back cover 120 may pass through the first through hole 233 and may be connected to the second through hole 1061. Hence, the structural stability of the display device 10 may be improved.

The frame 1000 may include the first horizontal frame part 1010, the second horizontal frame part 1020, and the inclined frame part 1030. The frame 1000 may further include another vertical frame part 1060 extending from the second horizontal frame part 1020 in the vertical direction (i.e., the third direction DR3). The vertical frame part 1060 may extend toward the display panel 100.

Figure 47B:
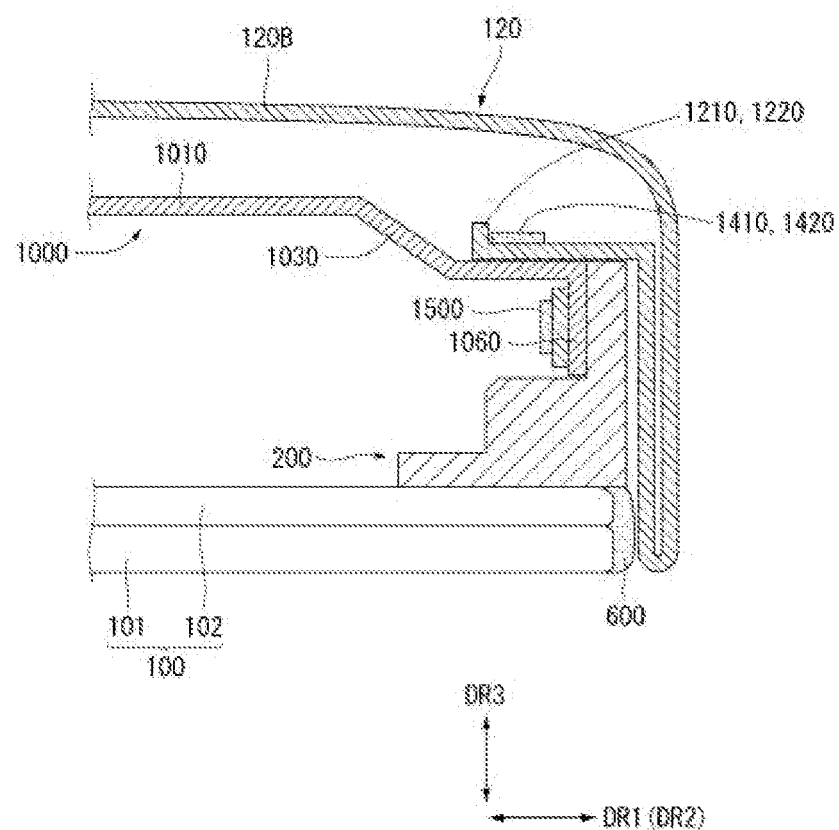

As shown in FIG. 47B, when the frame 1000 includes the vertical frame part 1060 extending from the second horizontal frame part 1020 toward the display panel 100 as described above, a light source 1500 may be disposed on the vertical frame part 1060. The backlight unit of such a structure may be referred to as the edge type backlight unit.

Figure 48:
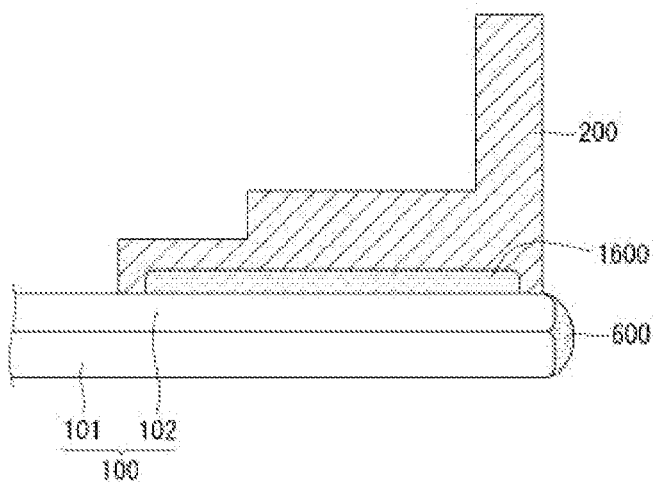

As shown in FIG. 48, the guide panel 200 may be attached to the back surface of the display panel 100. In this instance, the fixer 300 may be omitted.

For this, an adhesive layer 1600 may be formed between the guide panel 200 and the display panel 100.

The shapes of the first, second, and third connectors 1410, 1420, and 1430 of the frame 1000 may be variously changed. Other shapes of the first, second, and third connectors are described below.

Figure 49:
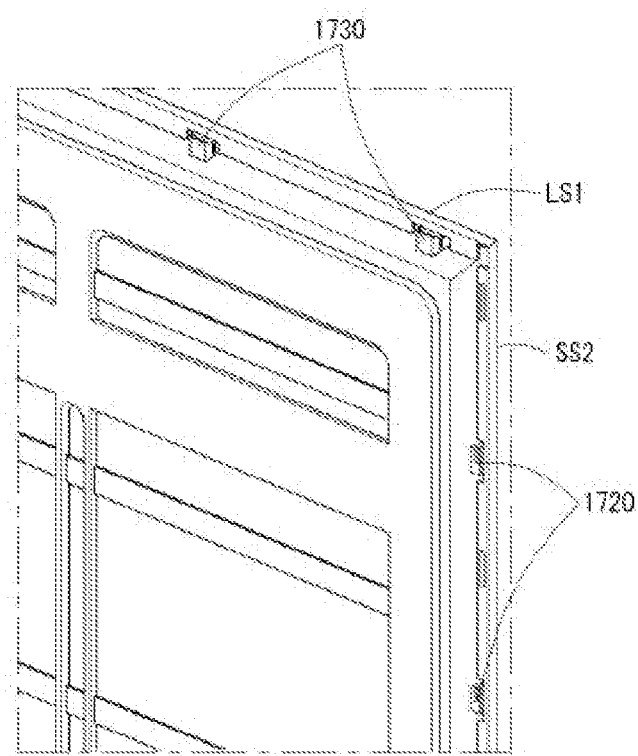
Figure 50:
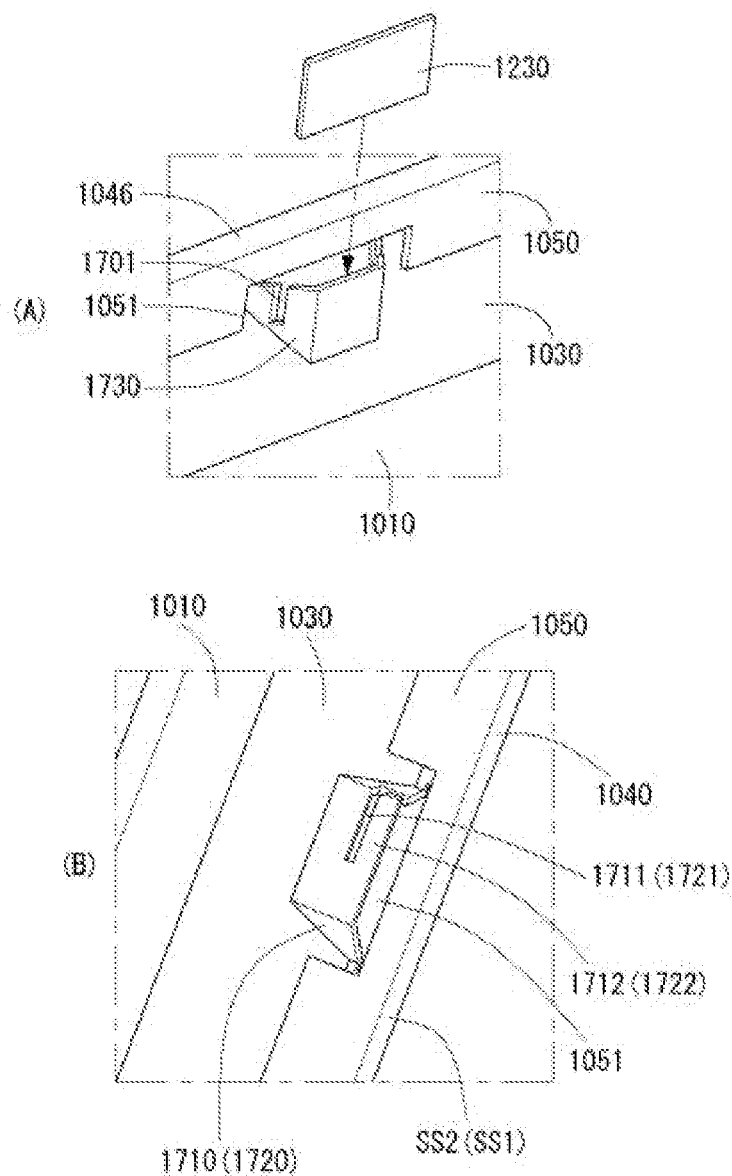

As shown in FIGS. 49 and 50, a third connector 1730 may be positioned on the first long side LS1 of the frame 1000, a second connector 1720 may be positioned on the second short side SS2 of the frame 1000, and a first connector 1710 may be positioned on the first short side SS1 of the frame 1000.

In the embodiment of the invention, the first short side SS1 of the frame 1000 may be referred to as a fifth side area, the second short side SS2 of the frame 1000 may be referred to as a sixth side area, the first long side LS1 of the frame 1000 may be referred to as a seventh side area, and the second long side LS2 of the frame 1000 may be referred to as an eighth side area.

As shown in (A) of FIG. 50, the third connector 1730 of the frame 1000 may include a third convex part protruding from a main body of the frame 1000 toward the back cover 120. The third convex part may be formed using a drawing method, etc. In the following description, the third convex part may indicate the third connector 1730.

The third convex part 1730 may have a groove 1701 which is depressed toward the second long side LS2.

In such a structure, the third protrusion 1230 of the back cover 120 may be inserted into the groove 1701 of the third convex part 1730 in a direction from the first long side LS1 to the second long side LS2.

As shown in (B) of FIG. 50, the first connector 1710 of the frame 1000 may include a first convex part protruding from the frame 1000 toward the back cover 120, and the second connector 1720 of the frame 1000 may include a second convex part protruding from the frame 1000 toward the back cover 120. In the following description, the first convex part may indicate the first connector 1710, and the second convex part may indicate the second connector 1720.

The first connector 1710 may include a first arm 1712 protruding from the first convex part toward the first long side LS1.

The second connector 1720 may include a second arm 1722 protruding from the second convex part toward the first long side LS1.

Grooves 1711 and 1721, which are depressed toward the second long side LS2, may be respectively formed between the first arm 1712 and the frame 1000 and between the second arm 1722 and the frame 1000.

An example of a method for forming the first, second, and third connectors 1710, 1720, and 1730 is described below.

Figure 51:
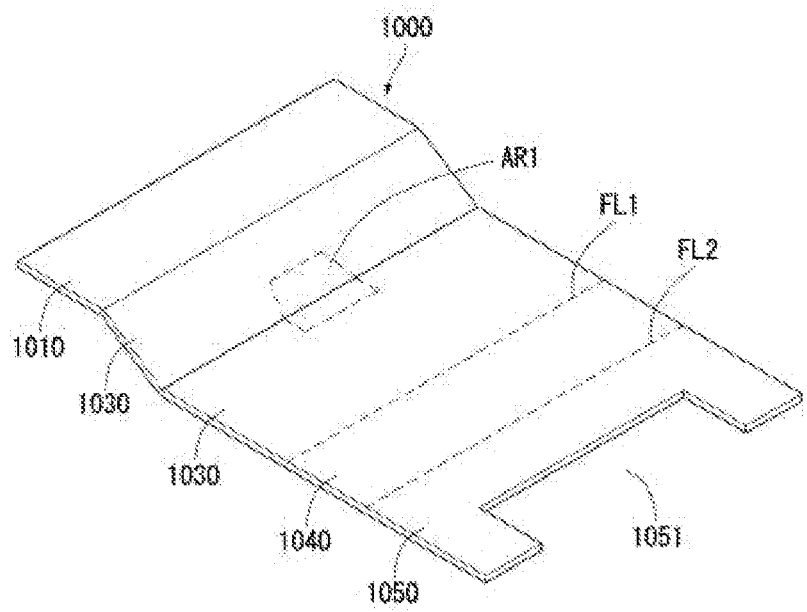

As shown in FIG. 51, a first area AR1 corresponding to the first, second, and third convex parts is determined at a boundary of the second horizontal frame part 1020 and the inclined frame part 1030 of the frame 1000.

An opening 1051 corresponding to the first, second, and third convex parts is formed in the third horizontal frame part 1050.

Figure 52:
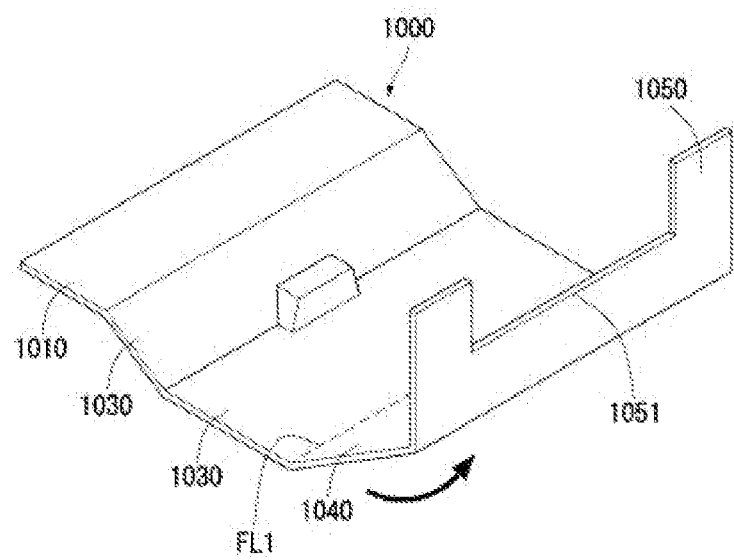

Next, as shown in FIG. 52, the first area AR1 may protrude using the drawing method, etc.

Hence, at least one of the first and second convex parts may overlap at least one of the second horizontal frame part 1020 and the inclined frame part 1030 of the frame 1000.

Figure 53:
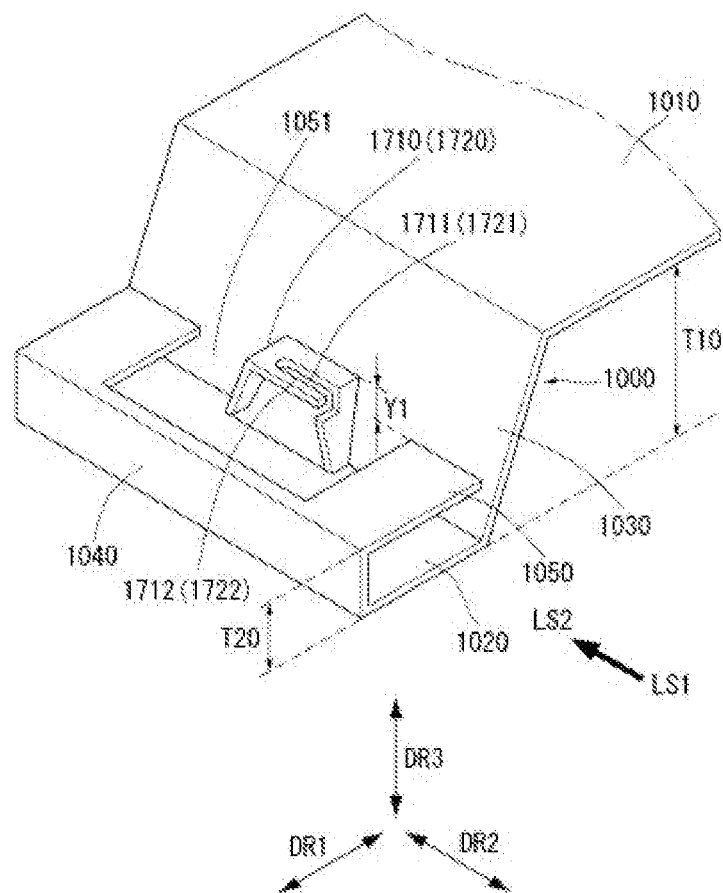

Afterwards, as shown in FIGS. 50 and 53, when the frame 1000 is folded along a first folding line FL1 and a second folding line FL2, the first, second, and third convex parts may be exposed through the opening 1051 of the third horizontal frame part 1050. Namely, the first, second, and third connectors 1710, 1720, and 1730 may pass through the opening 1051 of the third horizontal frame part 1050 and may be exposed.

As shown in FIG. 53, the first and second connectors 1710 and 1720 may protrude further than the third horizontal frame part 1050 by a predetermined height Y1. For this, it may be preferable, but not required, that a distance T10 between the first horizontal frame part 1010 and the second horizontal frame part 1020 in the vertical direction (i.e., the third direction DR3) is longer than a distance T20 between the second horizontal frame part 1020 and the third horizontal frame part 1050 in the vertical direction (i.e., the third direction DR3).

In this instance, the first and second protrusions 1210 and 1220 of the back cover 120 may be easily connected to the first and second connectors 1710 and 1720.

In such a structure, the first protrusion 1210 of the back cover 120 may be inserted into the groove 1711 of the first connector 1710 in the direction from the first long side LS1 to the second long side LS2 in the sliding manner. Further, the second protrusion 1220 of the back cover 120 may be inserted into the groove 1721 of the second connector 1720 in the direction from the first long side LS1 to the second long side LS2 in the sliding manner.

Figure 54:
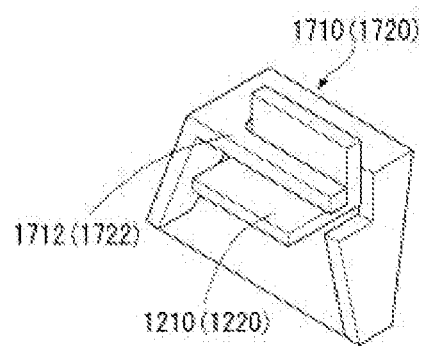

As a result, as shown in FIG. 54, the first protrusion 1210 may be engaged with the first connector 1710, and the second protrusion 1220 may be engaged with the second connector 1720.

Figure 55:
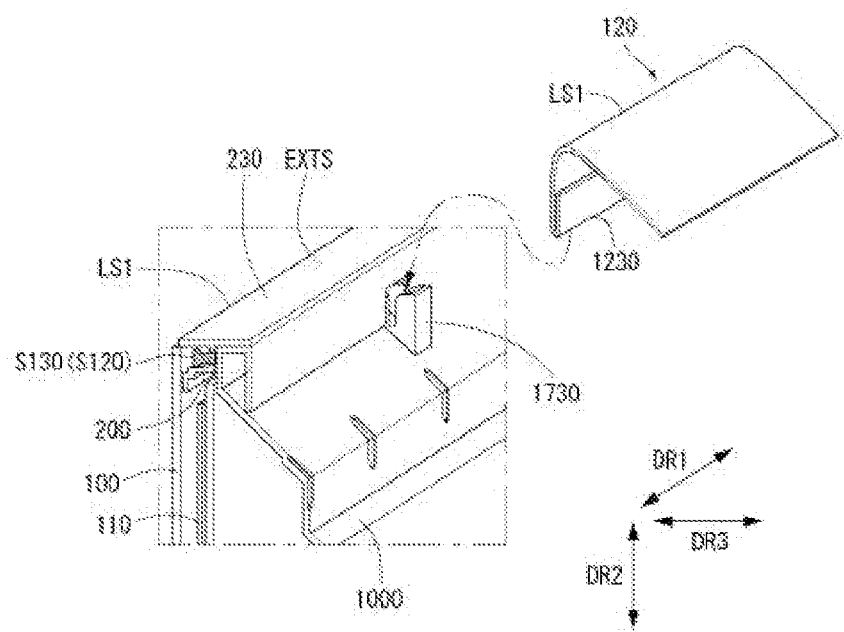

As shown in FIG. 55, the third protrusion 1230 may be formed at an end (i.e., an end of the first long side LS1) of the back cover 120. The third protrusion 1230 may be inserted into the groove 1701 of the third connector 1730 (i.e., the third convex part) in the direction from the first long side LS1 to the second long side LS2.

Figure 56:
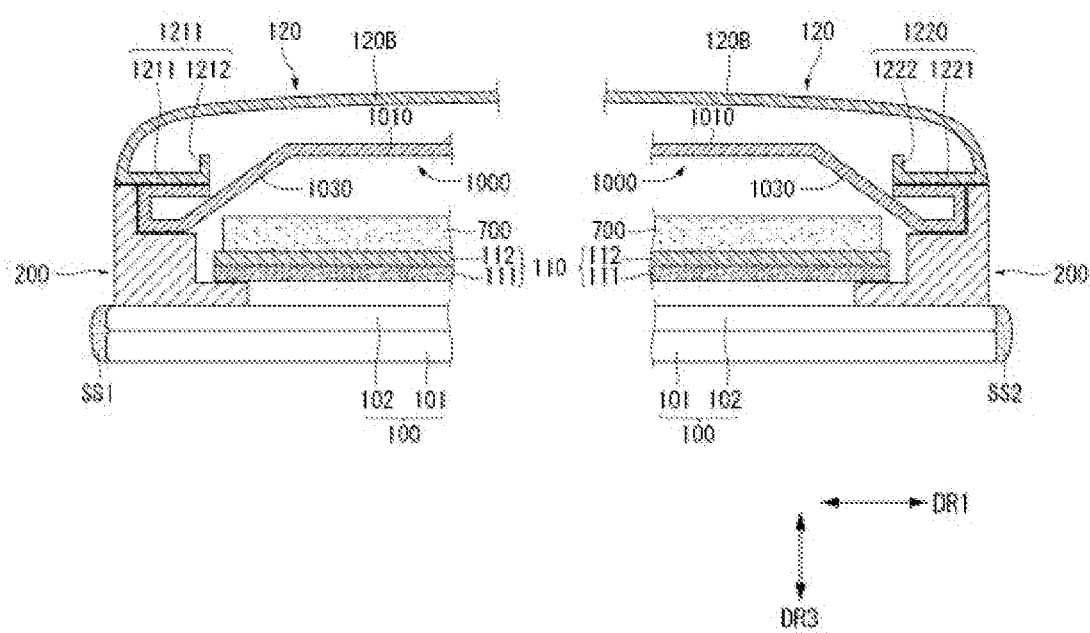

FIG. 56 shows a cross section of the display device 10 according to the embodiment of the invention along the horizontal direction.

Figure 57:
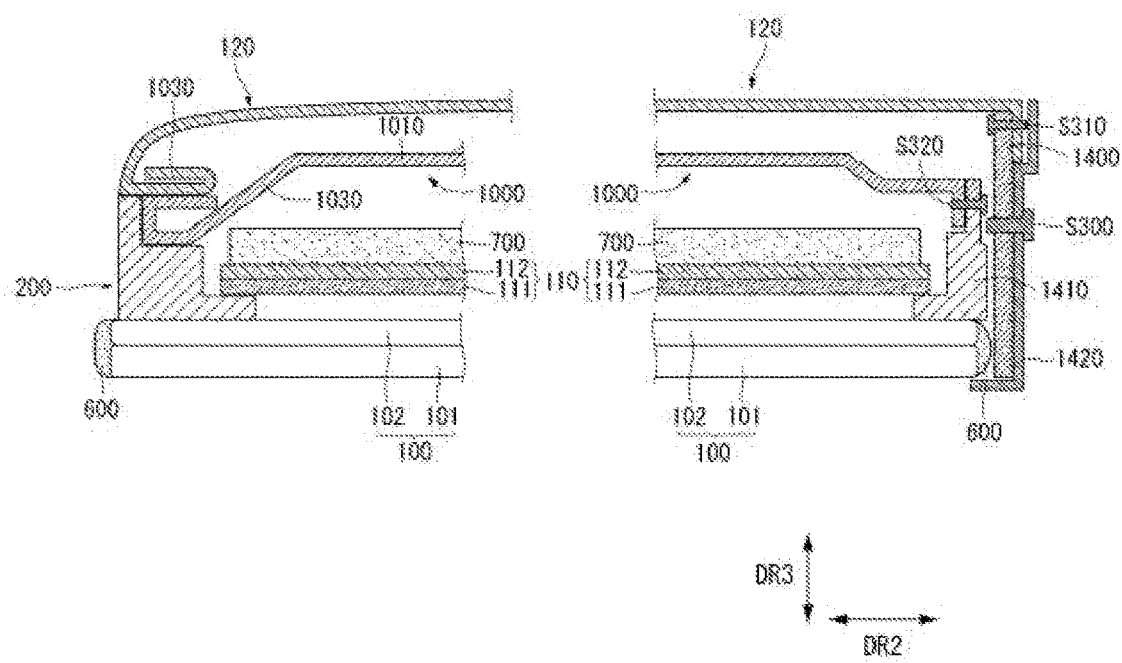

FIG. 57 shows a cross section of the display device 10 according to the embodiment of the invention along the vertical direction.

As described above, the edge of the front surface and the side of the display panel 100 may be exposed in a state where the back cover 120 is connected to the display module 100M.

The fact that the edge of the front surface of the display panel 100 is exposed may mean that the entire front surface of the display panel 100 is exposed. Hence, the visibility of the display device 10 may be improved.

Further, the fact that the side of the display panel 100 is exposed may mean that a resin layer 600 formed on the side of the front substrate 101 and/or the side of the back substrate 102 of the display panel 100 is exposed.

The guide panel 200 may be covered by the display panel 100. Namely, the guide panel 200 may be positioned in the rear of the display panel 100. In this instance, a visual effect, in which a bezel area of the display device 10 seems to be smaller than its original size, may be obtained.

An external surface EXTS of the guide panel 200 may be exposed. In other words, the external surface EXTS of the side wall SW of the guide panel 200 may be exposed.

Figure 58:
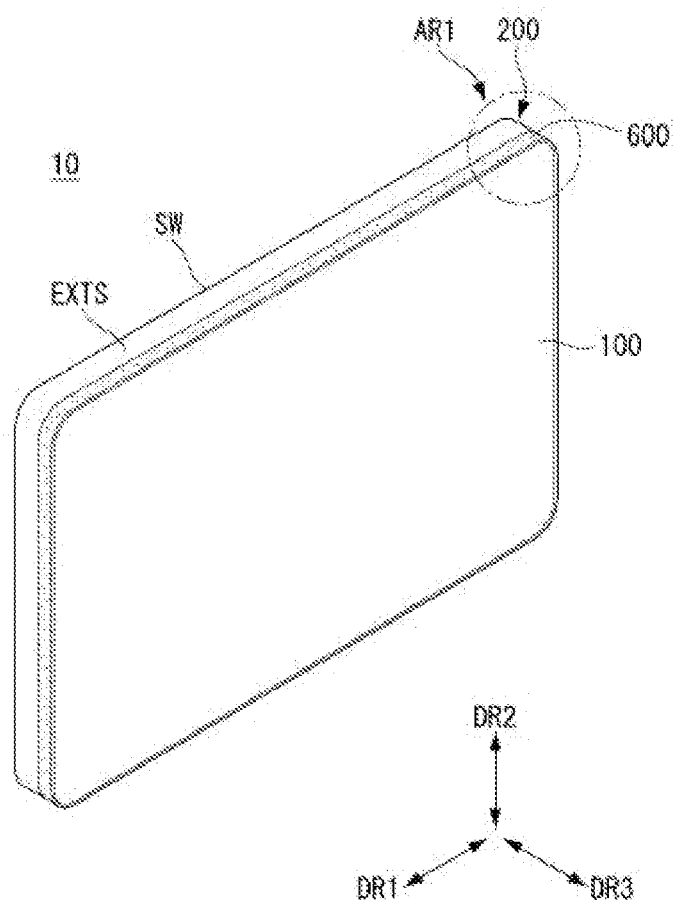
Figure 59:
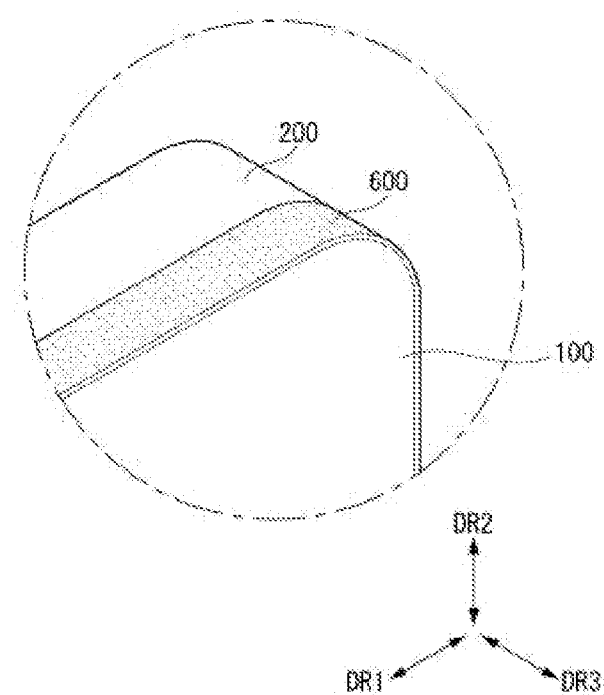

In this instance, as shown in FIGS. 58 and 59, the guide panel 200 may form an appearance of the side of the display device 10. Hence, the thickness of the display device 10 may be further reduced, and the size of the bezel area may be further reduced.

As described above, when the guide panel 200 forms the edge of the display device 10, it may be preferable, but not required, that the guide panel 200 has the sufficiently large rigidity.

The guide panel 200 may include a resin material and a glass fiber material, so as to improve the rigidity of the guide panel 200.

It may be preferable, but not required, that the guide panel 200 further includes a pigment material so as to improve the appearance of the display device 10.

The guide panel 200 may be formed by mixing the resin material, the glass fiber material, and the pigment material, pouring a mixture in a mold, and hardening the mixture. A content of the glass fiber material may be about 20 to 40 part by weight based on total weight of the mixture, so as to sufficiently secure the rigidity of the guide panel 200.

In this instance, even if the side wall of the guide panel 200 is relatively thin, the rigidity of the guide panel 200 may be sufficiently secured.

When the guide panel 200 includes the pigment material, a color of the guide panel 200 may be changed. It may be advantageous in terms of the design of the display device 10.

FIGS. 60 to 74 illustrate another configuration of the display device according to the embodiment of the invention. In the following description, the descriptions of the configuration and the structure described above may be omitted.

Figure 60:
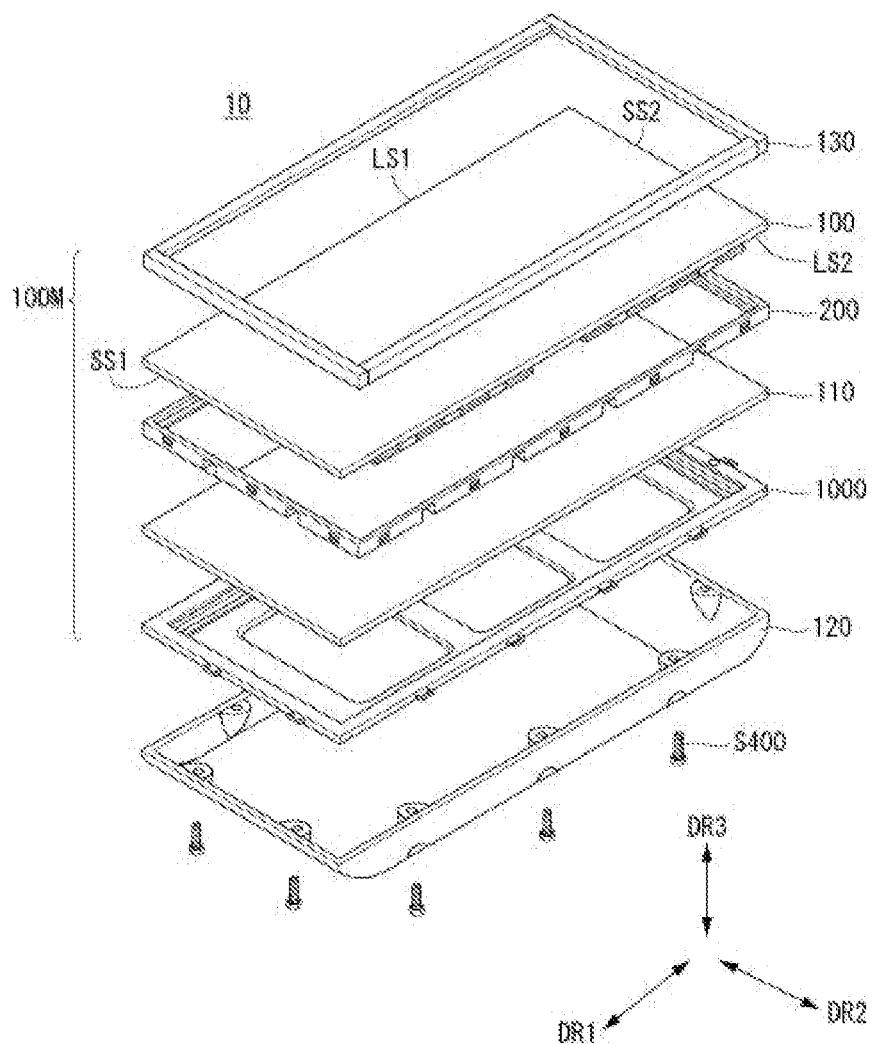
FIGS. 60 to 74 illustrate another configuration of a display device according to an exemplary embodiment of the invention.

As shown in FIG. 60, the display device 10 according to the embodiment of the invention may further include a top case 130.

The top case 130 may include a front part covering the edge of the front surface of the display panel 100 and a side part which extends from the front part and covers the side of the display panel 100.

The top case 130 may be divided into a plurality of parts. The top case 130 is described in detail below.

In this instance, it may be regarded that the display module 100M includes the top case 130.

In FIG. 60, "S400" denote a fastening member for fastening the back cover 120 to the frame 1000.

Figure 61:
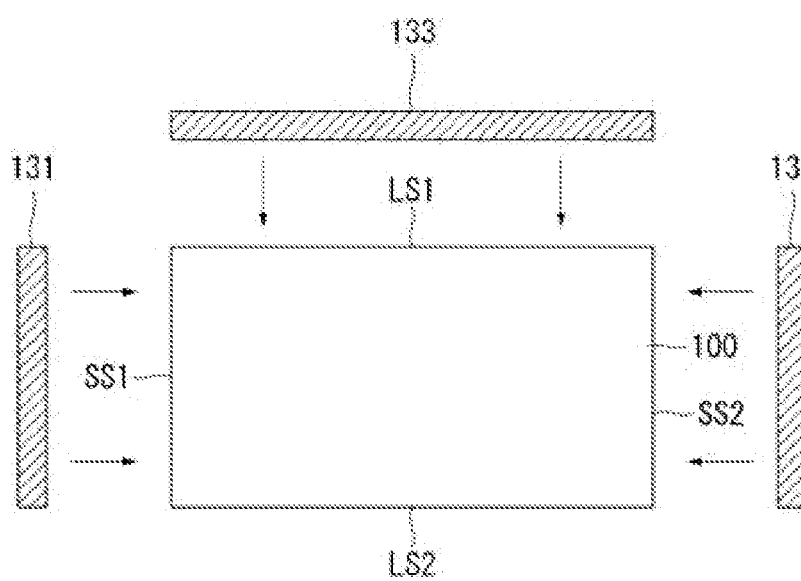
Figure 61:
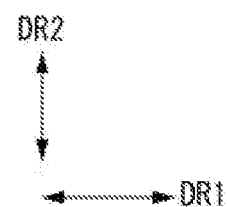

As shown in FIG. 61, the top case 130 may include a first top case 131 corresponding to the first short side SS1 of the display panel 100, a second top case 132 corresponding to the second short side SS2 of the display panel 100, and a third top case 133 corresponding to the first long side LS1 of the display panel 100.

The first top case 131 and the third top case 133 may be connected to each other at the corner of the display device 10, and also the second top case 132 and the third top case 133 may be connected to each other at the corner of the display device 10.

Figure 62:
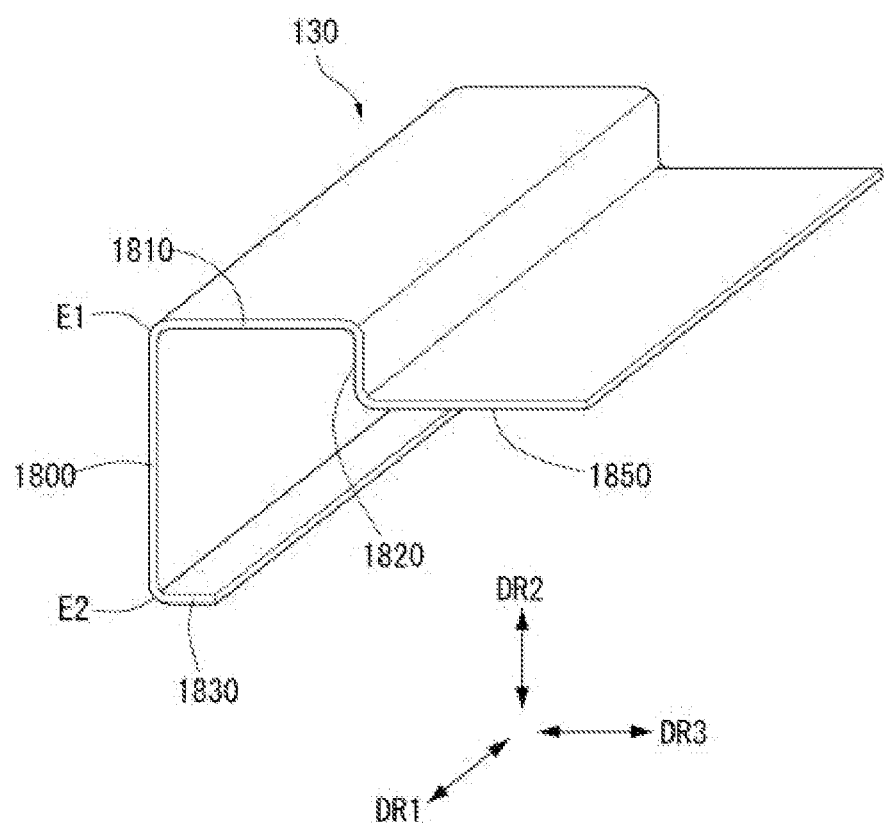

As shown in FIG. 62, the top case 130 may include a first part 1800, a second part 1810 connected to the first part 1800, and a third part 1820 connected to the second part 1810.

The first part 1800 may include a portion covering the edge of the front surface of the display panel 100.

The second part 1810 may include a portion which extends from a first end E1 of the first part 1800 and is positioned on the side of the display panel 100.

The third part 1820 may extend from an end of the second part 1810 in the second direction DR2 of the horizontal direction.

The top case 130 may further include a fourth part 1830 connected to the first part 1800 and a fifth part 1850 connected to the third part 1820.

The fourth part 1830 may extend from a second end E2 opposite the first end E1 of the first part 1800 in the vertical direction (i.e., the third direction DR3) and may be positioned on the front surface of the display panel 100.

The fifth part 1850 may extend from the third part 1820 in the vertical direction (i.e., the third direction DR3).

Figure 63:
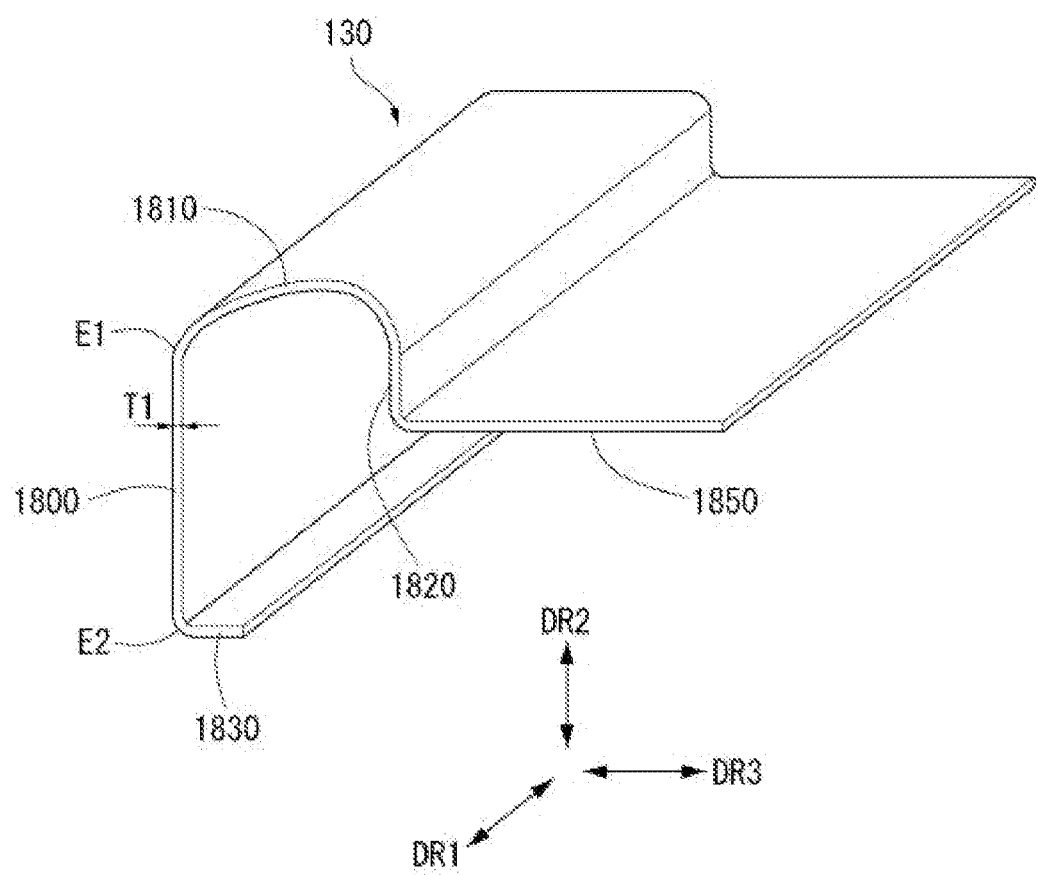

As shown in FIG. 63, the second part 1810 may include a portion having a surface curved in an oblique direction.

In this instance, the second part 1810 may extend from the first part 1800 in the oblique direction and may include a convexly curved surface.

In the embodiment of the invention, the first part 1800 and the fourth part 1830 of the top case 130 may be commonly referred to as the front part including a portion positioned at the front surface of the display panel 100, and the second, third, and fifth parts 1810, 1820, and 1850 of the top case 130 may be commonly referred to as the side part including a portion positioned at the side of the display panel 100.

Figure 64:
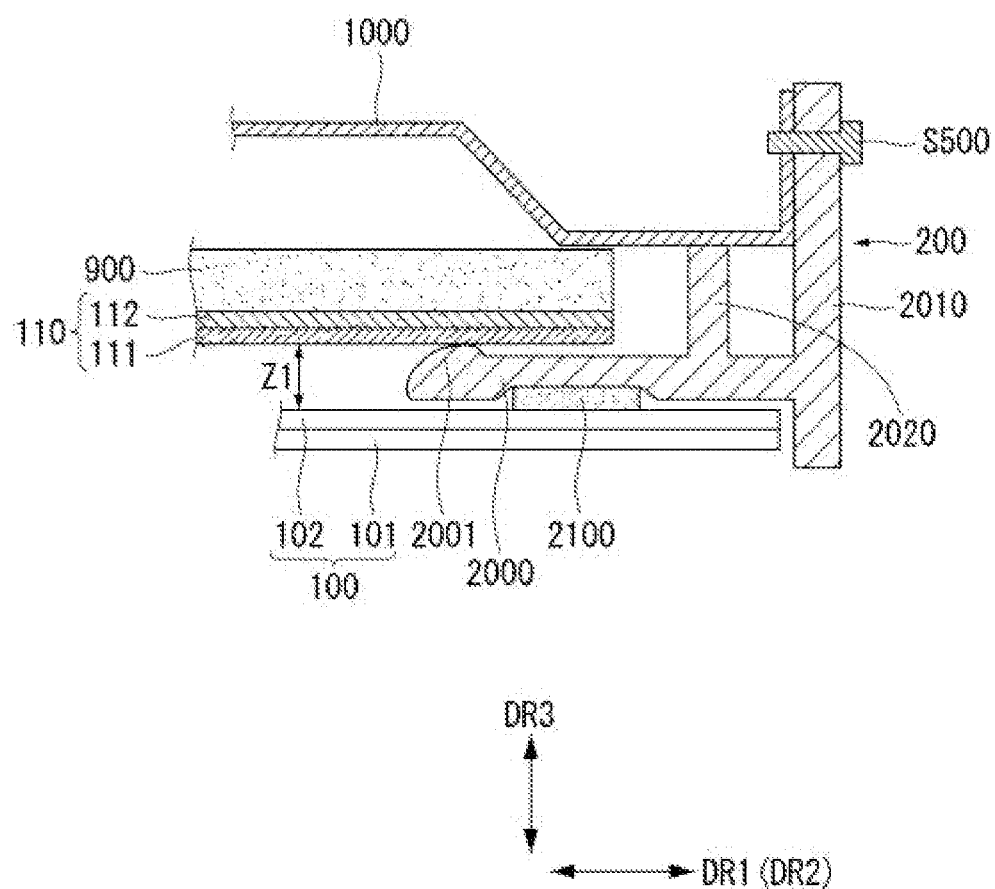

As shown in FIG. 64, the guide panel 200 may include a base part 2000 and a side wall 2010 connected to the base part 2000.

The base part 2000 may extend in the horizontal direction (i.e., the first direction DR1 and/or the second direction DR2).

The base part 2000 may be attached to the back surface of the display panel 100 using an adhesive layer 2100.

A groove 2002, to which the adhesive layer 2100 is applied, may be formed on a bottom surface (i.e., a first surface S1) of the base part 2000.

Further, a convex part 2001 protruding in the vertical direction (i.e., the third direction DR3) may be formed on an upper surface (i.e., a second surface S2) opposite the bottom surface S1 of the base part 2000.

Figure 65:
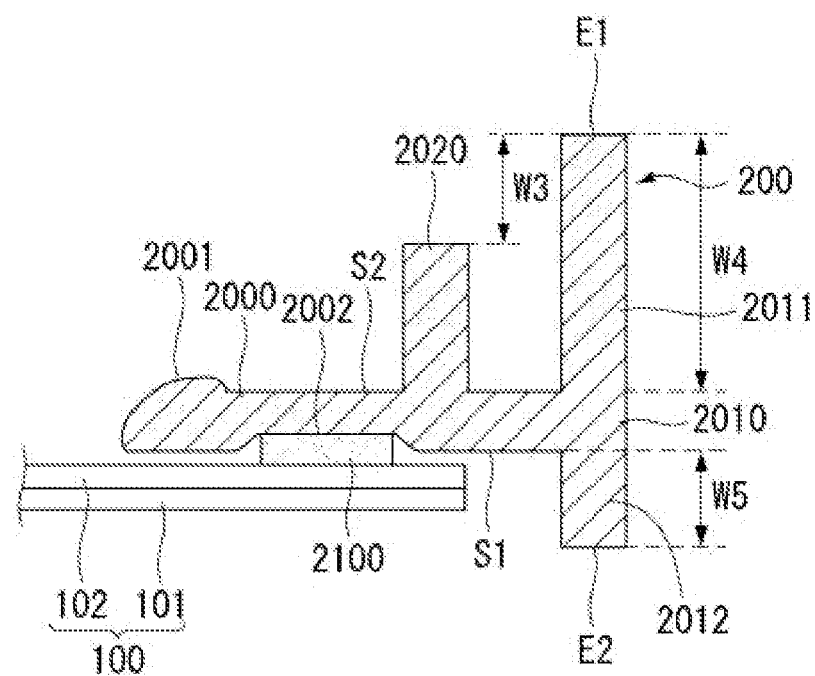
Figure 65:
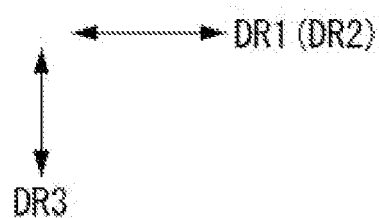

As shown in FIG. 65, the guide panel 200 may further include an inner wall 2020. The inner wall 2020 may be positioned between the side wall 2010 and the convex part 2001.

The inner wall 2020 may extend from the upper surface S2 of the base part 2000 in the vertical direction (i.e., the third direction DR3).

The side wall 2010 may include a forward part 2012 extending forward from the base part 2000 in the vertical direction (i.e., the third direction DR3) and a backward part 2011 extending backward from the base part 2000 in the vertical direction (i.e., the third direction DR3).

A length W4 of the backward part 2011 may be longer than a length W5 of the forward part 2012.

Further, the length W4 of the backward part 2011 of the side wall 2010 may be longer than a length of the inner wall 2020 by a predetermined length W3.

The first end E1 of the side wall 2010 is one end of the backward part 2011, and the second end E2 of the side wall 2010 is one end of the forward part 2012. Further, the other end of the backward part 2011 of the side wall 2010 and the other end of the forward part 2012 may be connected to each other.

Figure 66:
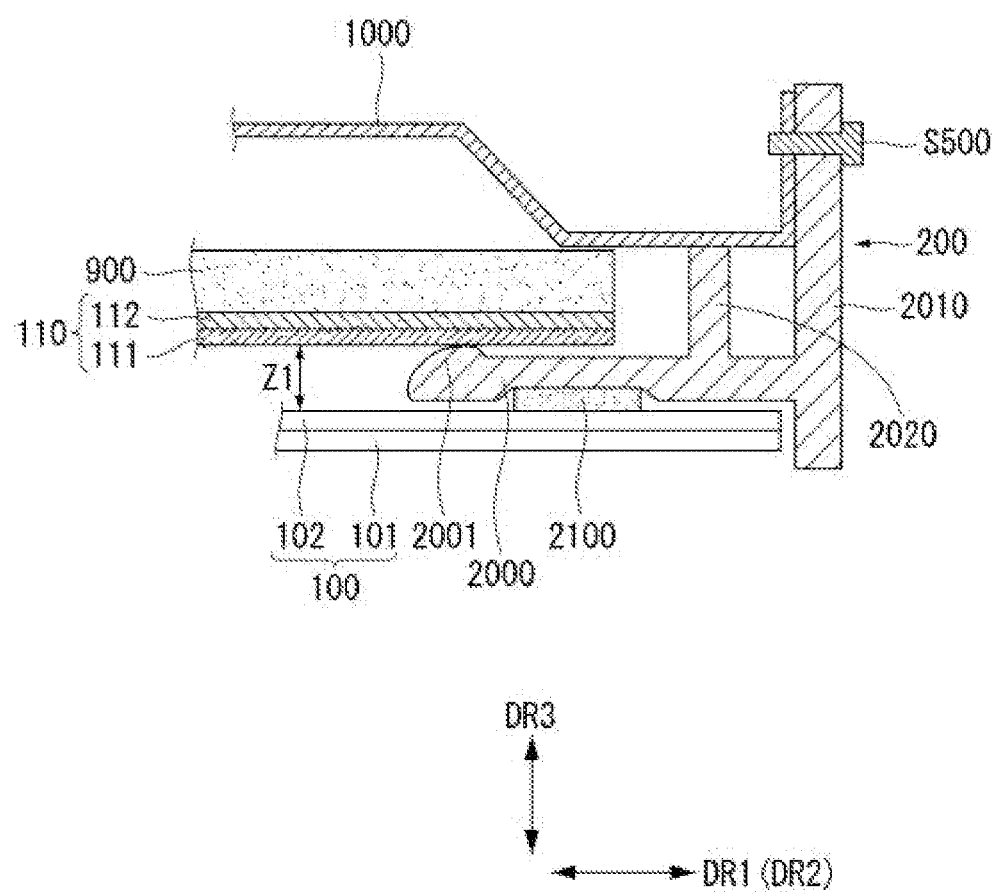

As shown in FIG. 66, the optical layer 110 may be disposed on the base part 2000 of the guide panel 200. More specifically, the optical layer 110 may be disposed on the convex part 2001 of the base part 2000 of the guide panel 200.

The convex part 2001 may reduce an area of a contact surface between the optical layer 110 and the guide panel 200.

The frame 1000 may be disposed on the inner wall 2020 of the guide panel 200.

Further, the frame 1000 may be connected to the side wall 2010 of the guide panel 200 using a predetermined fastening member S500.

Figure 67:
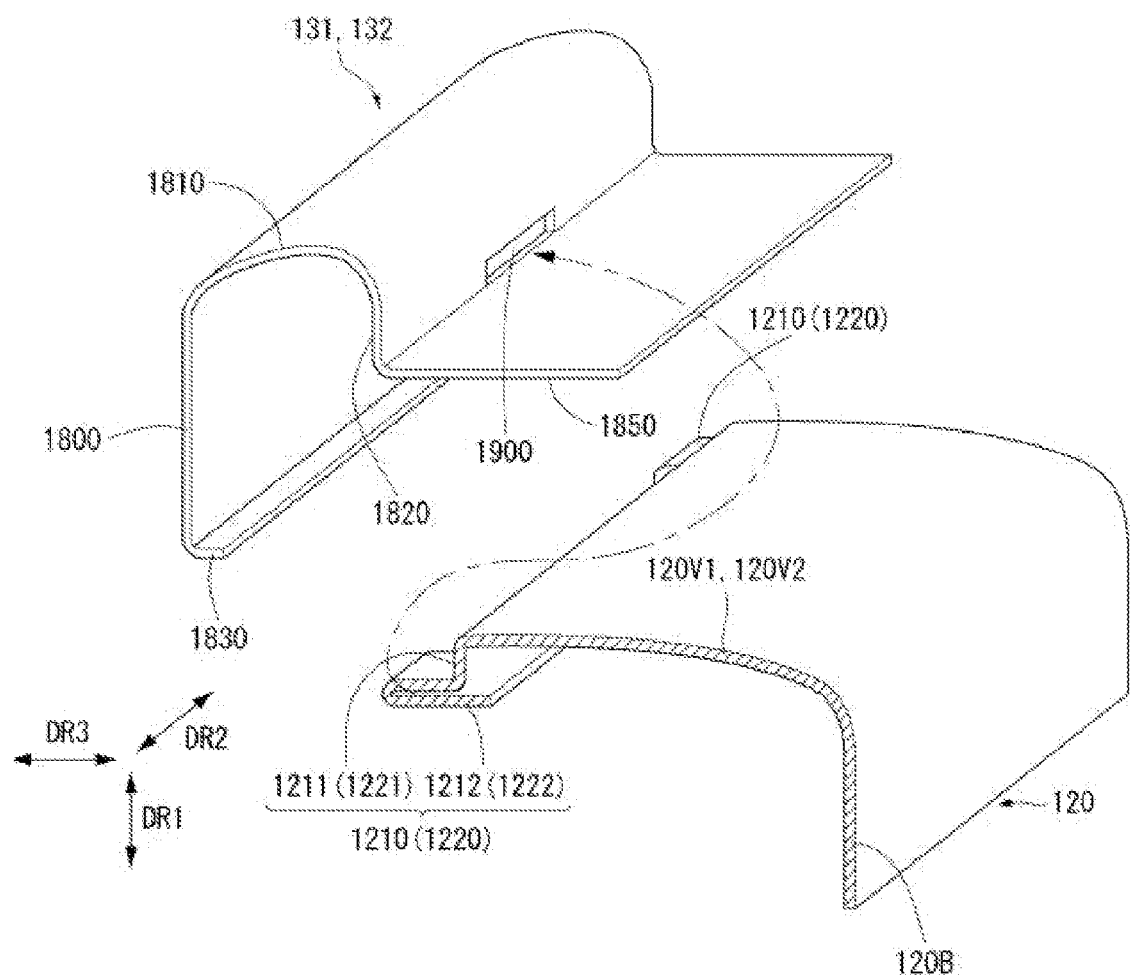

At least one connection hole may be formed in the side of the top case 130 to connect the top case 130 with the back cover 120. For example, as shown in FIG. 67, a first connection hole 1900 may be formed in the third parts 1820 of the first and second top cases 131 and 132.

The first connection hole 1900 may correspond to the first and second protrusions 1210 and 1220 of the back cover 120.

The first and second protrusions 1210 and 1220 may be inserted into the first connection hole 1900.

Figure 68:
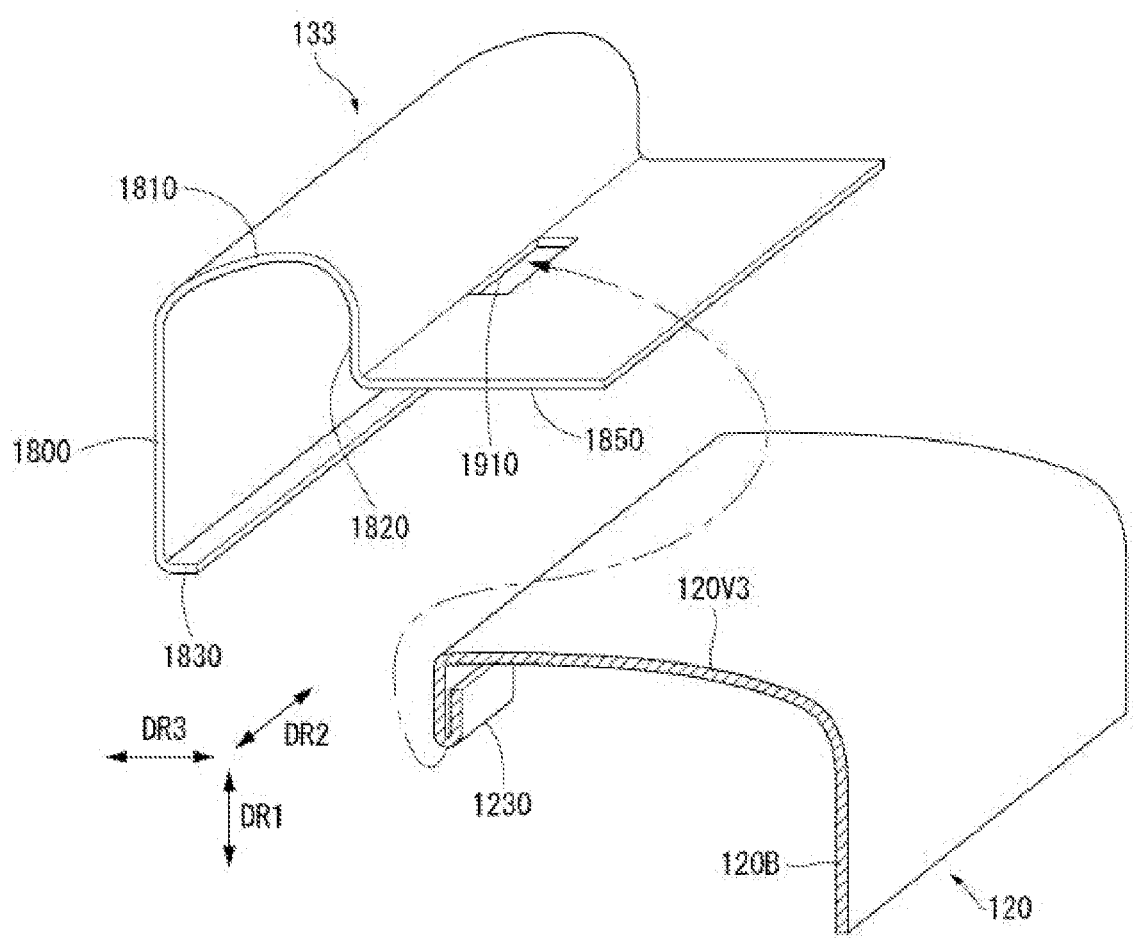

Alternatively, as shown in FIG. 68, a second connection hole 1910 may be formed in the fifth part 1850 of the third top case 133.

The second connection hole 1910 may correspond to the third protrusion 1230 of the back cover 120.

The third protrusion 1230 may be inserted into the second connection hole 1910.

More specifically, the third protrusion 1230 may be inserted into the second connection hole 1910 in the vertical direction (i.e., the third direction DR3).

Figure 69:
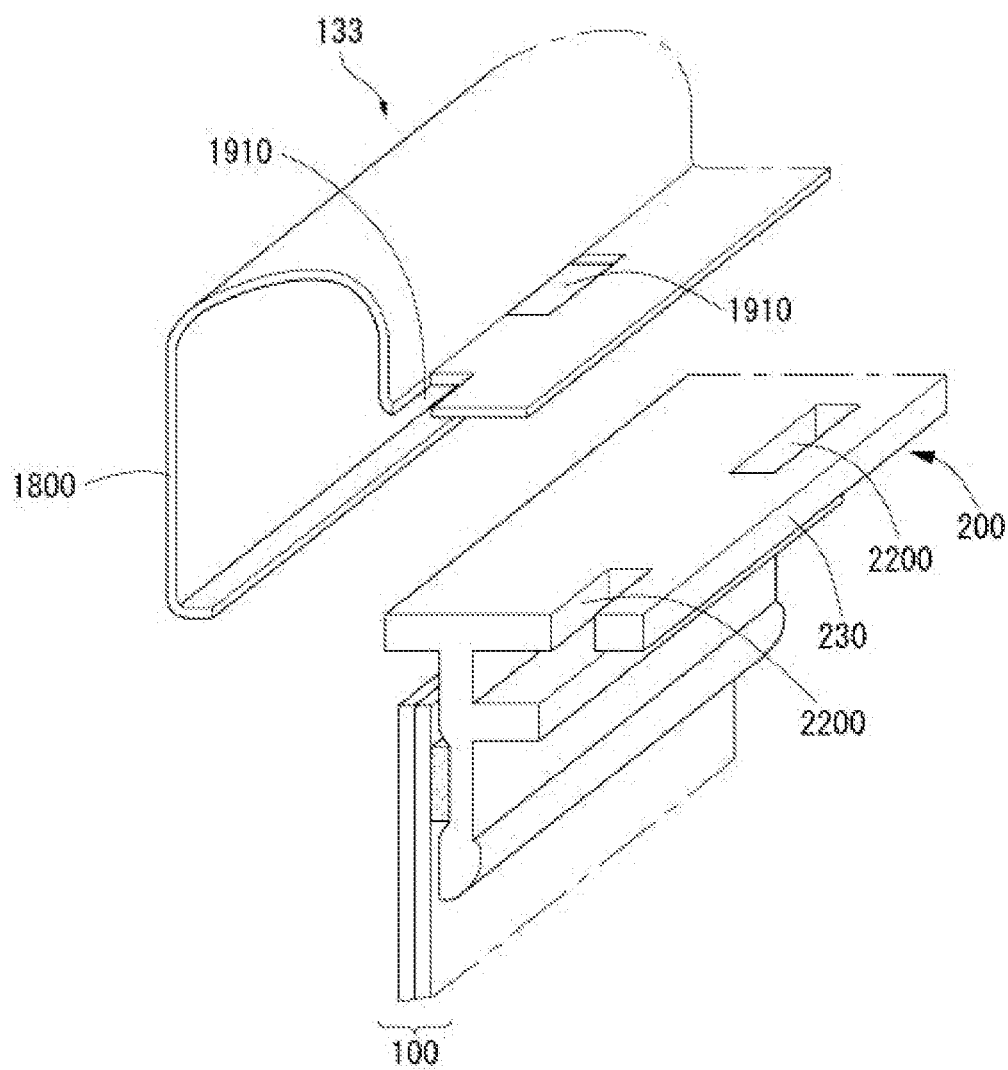

As shown in FIG. 69, an overlap hole 2200 corresponding to the second connection hole 1910 may be formed in the side wall of the guide panel 200. For example, the overlap hole 2200 may be formed in the side wall of the third guide panel 230.

In this instance, the third protrusion 1230 may sequentially pass through the second connection hole 1910 and the overlap hole 2200.

Figure 70:
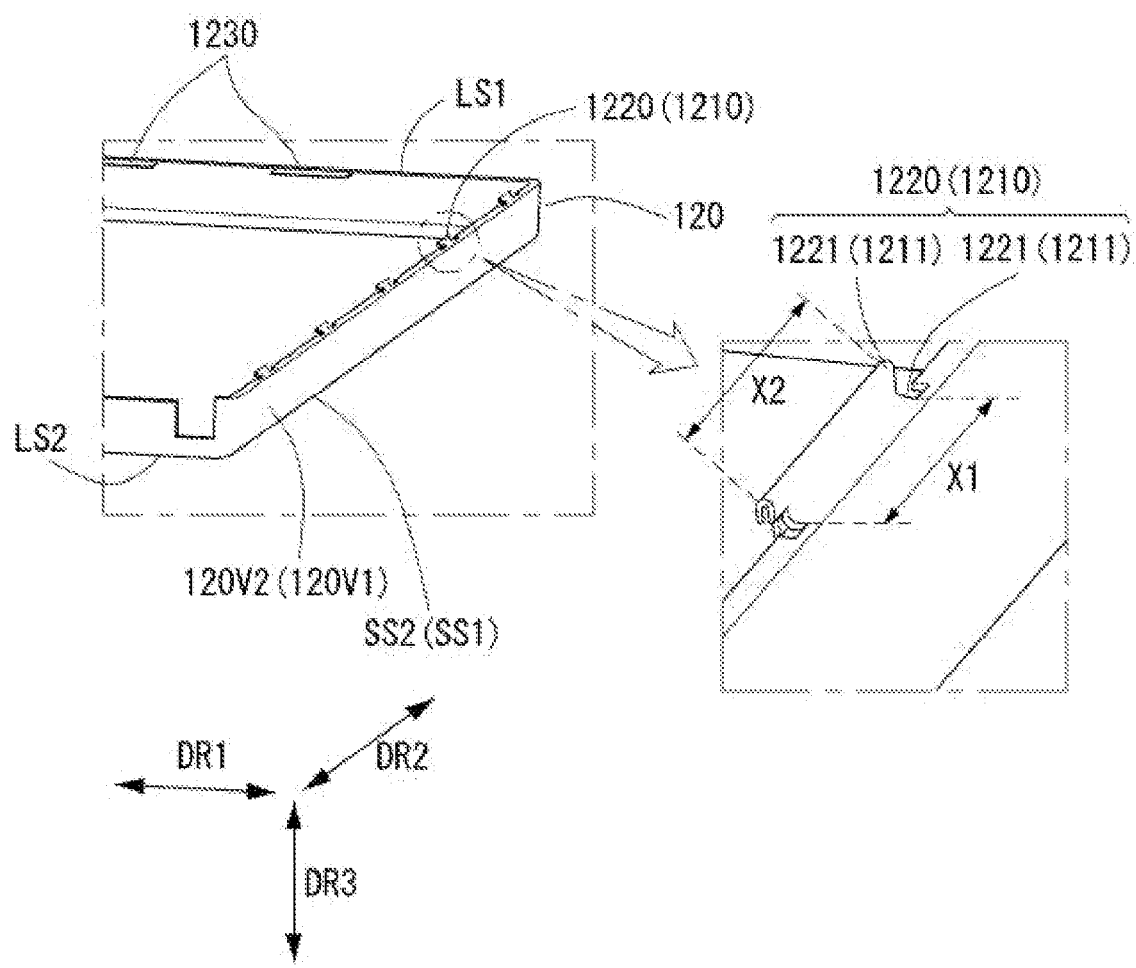

As shown in FIG. 70, the first and second protrusions 1210 and 1220 may be formed by folding the end of the back cover 120.

The second protrusion 1220 may include a second main protrusion 1221 extending from an end of the second vertical part 120V2 toward the first vertical part 120V1 and a second auxiliary protrusion 1222 extending from the second main protrusion 1221 in the vertical direction (i.e., the third direction DR3).

Further, the first protrusions 1210 may include a first main protrusion 1211 extending from an end of the first vertical part 120V1 toward the second vertical part 120V2 and a first auxiliary protrusion 1212 extending from the first main protrusion 1211 in the vertical direction (i.e., the third direction DR3).

The second auxiliary protrusion 1222 may further include a portion extending further than the second main protrusion 1221 in a direction from the first long side LS1 to the second long side LS2. Hence, a length X2 of the second auxiliary protrusion 1222 may be longer than a length X1 of the second main protrusion 1221.

Further, the first auxiliary protrusion 1212 may further include a portion extending further than the first main protrusion 1211 in a direction from the first long side LS1 to the second long side LS2. Hence, a length X2 of the first auxiliary protrusion 1212 may be longer than a length X1 of the first main protrusion 1211.

Figure 71:
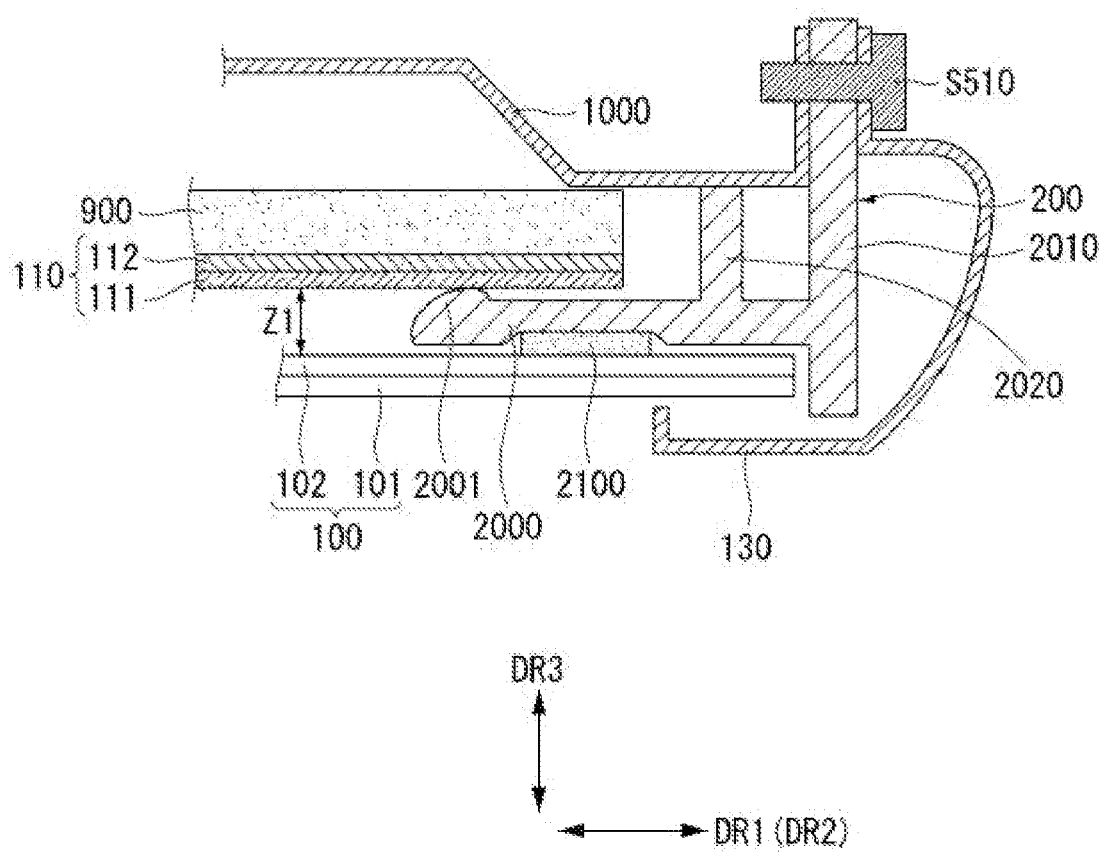

As shown in FIG. 71, the top case 130 may be connected to the guide panel 200.

Alternatively, the top case 130 may be connected to the frame 1000.

For example, a predetermined fastening member S510 may fasten the fifth part 1850 of the top case 130, the side wall SW of the guide panel 200, and the frame 1000 together.

A method for connecting the first and second protrusions 1210 and 1220 of the back cover 120 to the first connection hole 1900 is described below.

Figure 72:
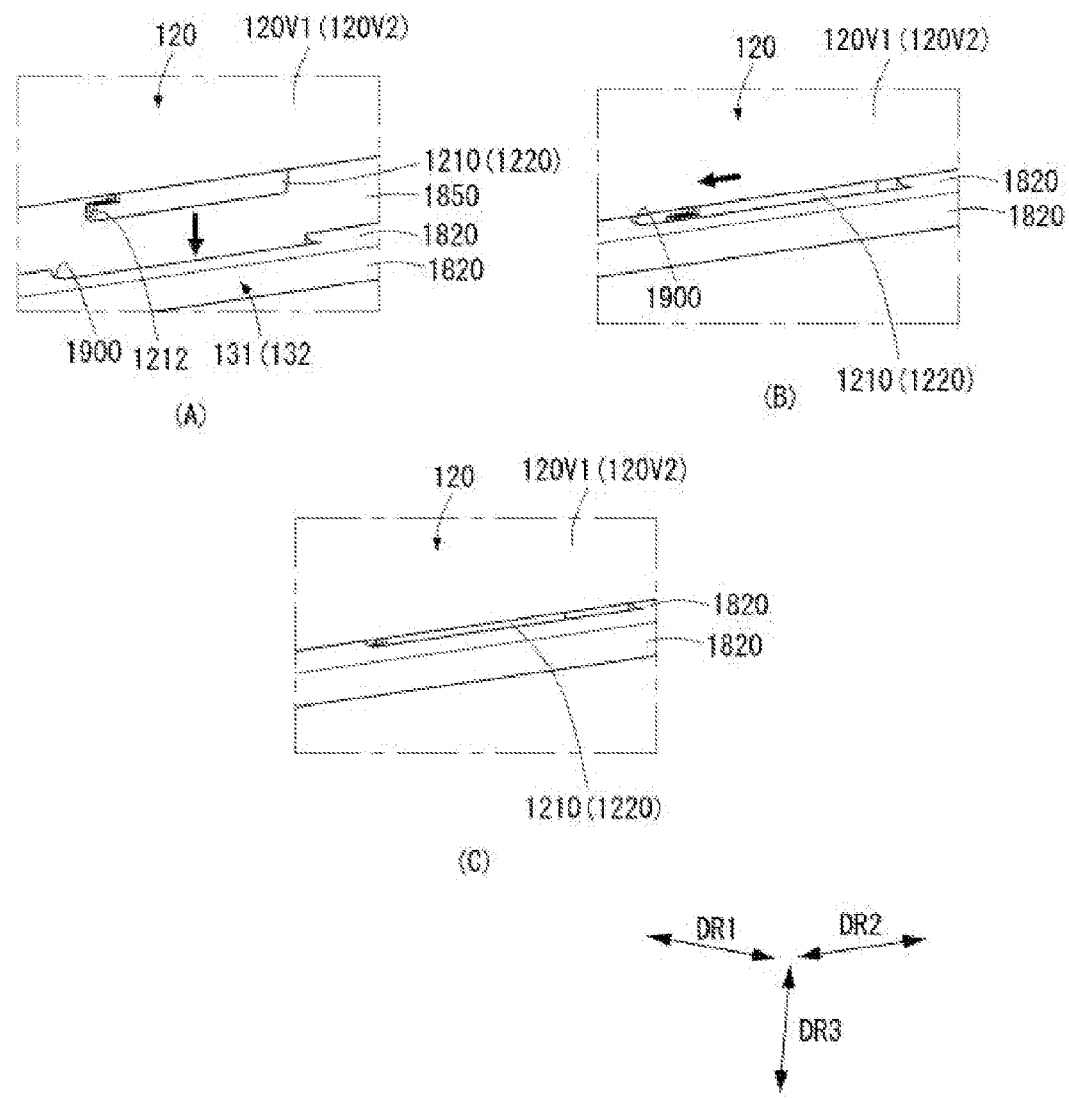

As shown in (A) of FIG. 72, the first and second protrusions 1210 and 1220 may be inserted into the first connection holes 1900 of the first and second top cases 131 and 132 in the vertical direction (i.e., the third direction DR3).

Afterwards, as shown in (B) of FIG. 72, the first and second protrusions 1210 and 1220 may slidingly move in the second direction DR2 in a state where the first and second protrusions 1210 and 1220 are inserted into the first connection hole 1900.

As a result, as shown in (C) of FIG. 72, the first and second protrusions 1210 and 1220 may be engaged with the first connection hole 1900.

As described above, the back cover 120 may be connected to the display module 100M in the sliding manner.

Figure 73:
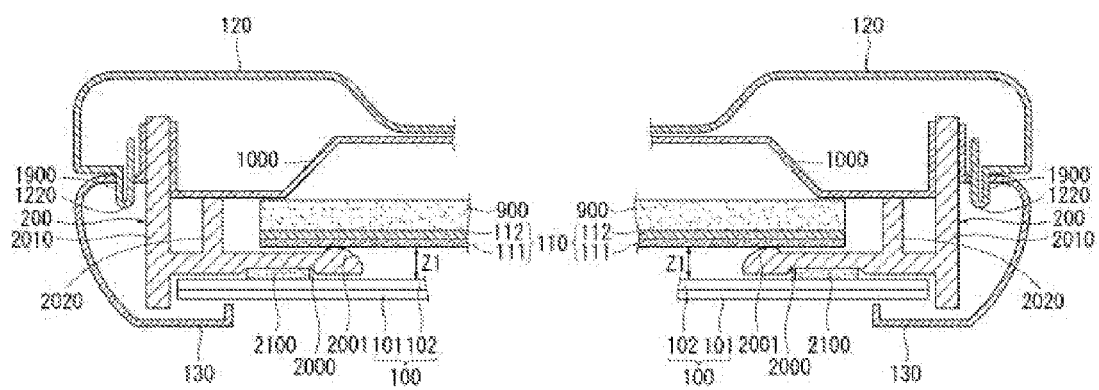

FIG. 73 shows a cross section of the display device 10 according to the embodiment of the invention along the transverse direction.

Figure 74:
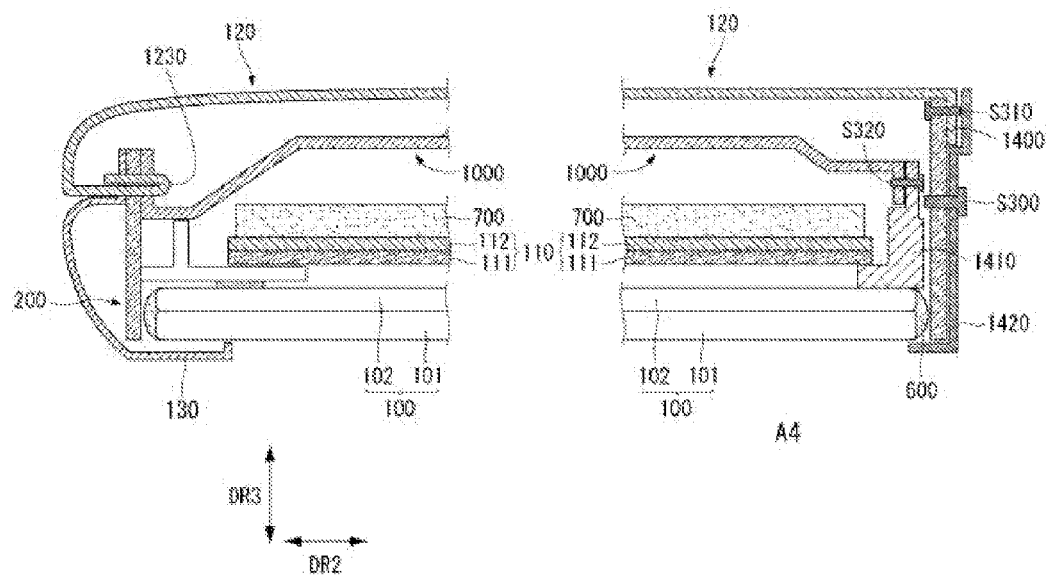

FIG. 74 shows a cross section of the display device 10 according to the embodiment of the invention along the longitudinal direction.

Figure 75:
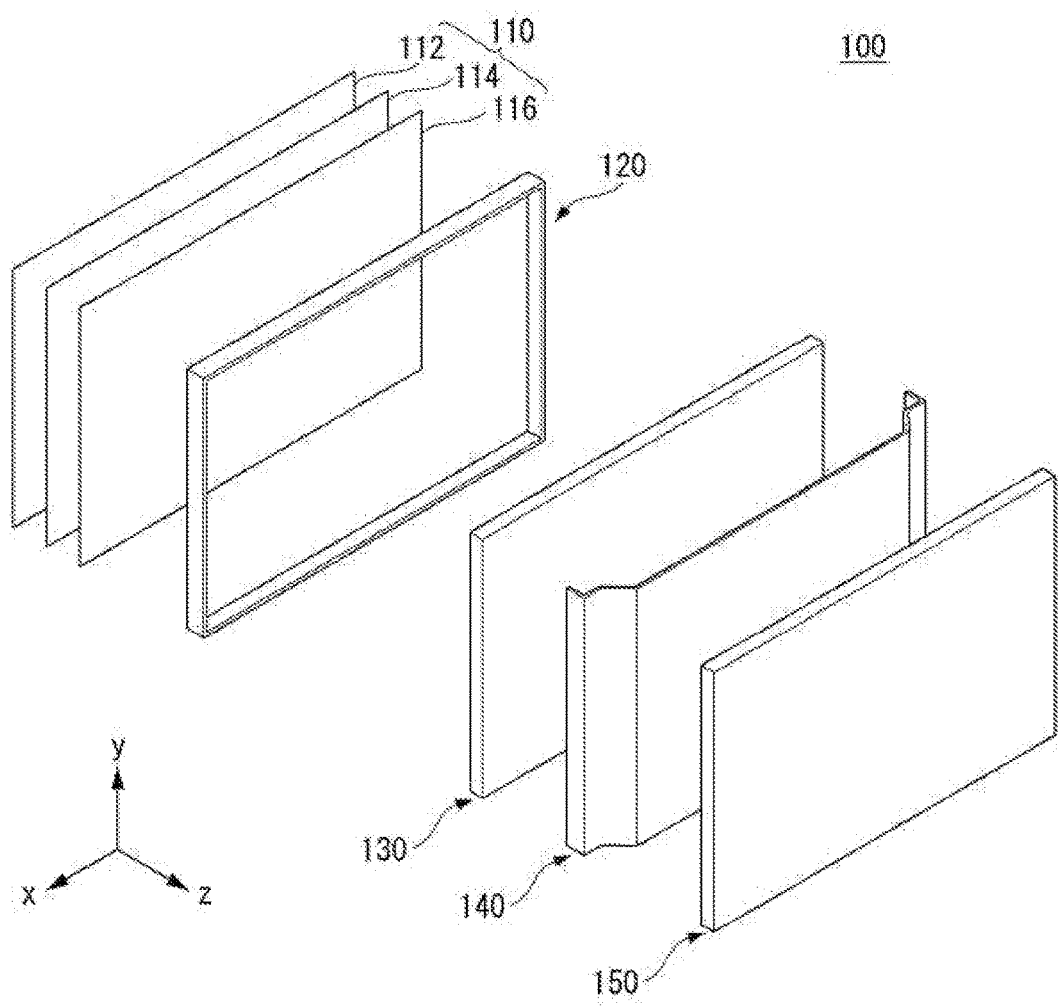
FIG. 75 is an exploded perspective view of a display device according to an exemplary embodiment of the invention.

FIG. 75 is an exploded perspective view of a display device according to an exemplary embodiment of the invention.

As shown in FIG. 75, a display device 100 according to an exemplary embodiment of the invention may include at least one of a display panel 110, a guide panel 120, a backlight unit 130, a frame 140, and a back cover 150.

The display panel 110 may be the component displaying an image in response to a control signal of a controller. The display panel 110 may include a plurality of layers. For example, the display panel 110 may include a front substrate 114 and a back substrate 116.

The front substrate 114 and the back substrate 116 may substantially have the same size. A seal portion for sealing a liquid crystal layer may be positioned between the front substrate 114 and the back substrate 116. A protective plate 112 may be positioned on a front surface of the front substrate 114.

The protective plate 112 may protect the display panel 110 from a damage, a scratch, etc. resulting from an external impact. The protective plate 112 may be substantially transparent. The protective plate 112 may be formed of a material having a strength and/or a hardness greater than the front substrate 114 and/or the back substrate 116. The size of the protective plate 112 may be different from the size of the front substrate 114 and/or the back substrate 116. For example, an area of the protective plate 112 may be greater than an area of the front substrate 114 and/or the back substrate 116.

The guide panel 120 may be positioned on the outer perimeter of the display device 100. For example, the guide panel 120 may be coupled with the side of at least one of the display panel 110, the backlight unit 130, the frame 140, and the back cover 150. The guide panel 120 may be exposed to the outside through a front surface of the display device 100 and/or the side of the display device 100. For example, the guide panel 120 may form a bezel of the display device 100.

The guide panel 120 may be coupled with the display panel 110. Namely, the display panel 110 may be coupled with the display device 100 through the guide panel 120.

The backlight unit 130 may include a plurality of light sources. The backlight unit 130 may be classified into a direct type backlight unit and an edge type backlight unit depending on the disposition of the light sources.

The backlight unit 130 may be coupled with a front surface of the frame 140. For example, the plurality of light sources may be disposed on the front surface of the frame 140. In this instance, the backlight unit may be referred to as the direct type backlight unit.

The backlight unit 130 may include an optical sheet. The optical sheet may diffuse light of the light sources. The optical sheet may include a plurality of layers. For example, the optical sheet may include at least one prism sheet and/or at least one diffusion sheet.

The frame 140 may support the components of the display device 100. For example, the frame 140 may be coupled with the backlight unit 130. The frame 140 may be formed of a metal material, for example, aluminum alloy.

The back cover 150 may be coupled with a back surface of the display device 100. Namely, the back cover 150 may be coupled with the display device 100 so as to shield the frame 140, etc. The back cover 150 may be slidingly coupled with the display device 100. Namely, a predetermined structure may be formed between the display device 100 and the back cover 150 so that the back cover 150 can be easily coupled with the display device 100. The sliding coupling structure of the back cover 150 and the display device 100 will be described in detail later.

FIGS. 76 to 84 illustrate a display panel of the display device shown in FIG. 75.

As shown in FIGS. 76 to 84, the display panel 110 of the display device 100 according to the embodiment of the invention may include a resin portion 111 and/or a protective plate 112 for protecting the display panel 110.

Figure 76:
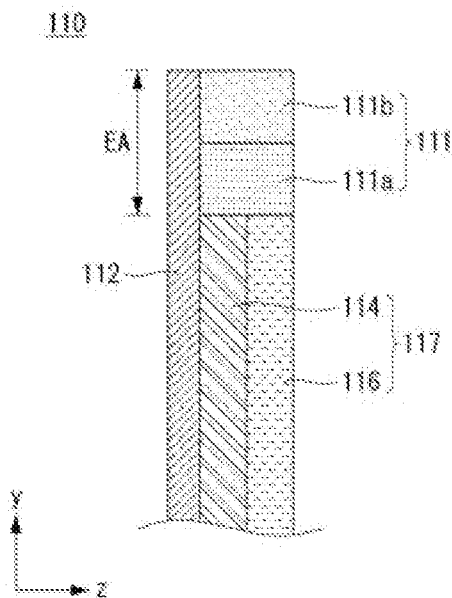
FIGS. 76 to 84 illustrate a display panel of a display device shown in FIG. 75.

As shown in FIG. 76, the resin portion 111 may be positioned on the side of the display panel 110. For example, the resin portion 111 may be positioned on the side of a substrate 117. The resin portion 111 may be positioned on the side of a front substrate 114 and the side of a back substrate 116. The resin portion 111 may be positioned along at least one of four edges of each of the front substrate 114 and the back substrate 116

The resin portion 111 may protect the display panel 110. The resin portion 111 may protect the display panel 110 from an impact applied from the side of the display panel 110.

The resin portion 111 may have characteristic different from the display panel 110. For example, the resin portion 111 may be a material having elasticity. Thus, when an impact is applied to the resin portion 111, the resin portion 111 may be elastically deformed and may absorb the impact.

The resin portion 111 may include a plurality of layers. For example, the resin portion 111 may include a first resin portion 111a directly contacting the side of the substrate 117 and a second resin portion 111b positioned on the outer side of the first resin portion 111a. Namely, the first and second resin portions 111a and 111b may be sequentially stacked in a radial direction of the substrate 117.

The first and second resin portions 111a and 111b may have different characteristics. Namely, it indicates that the first and second resin portions 111a and 111b may be formed of different materials. For example, the first resin portion 111a may be a soft material softer than the second resin portion 111b. In other words, the first resin portion 111a may be a material having a larger deformation degree against an external force than the second resin portion 111b. Thus, when the external force is applied to the side of the substrate 117, the first resin portion 111a of the soft material may firstly absorb the external force, and then the second resin portion 111b of a hard material may absorb the remaining external force.

Each of the first and second resin portions 111a and 111b may have a color. The first and second resin portions 111a and 111b may have different colors. For example, the first resin portion 111a may have a bright color, and the second resin portion 111b may have a dark color. In this instance, because the first resin portion 111a of the bright color is conspicuous, the first resin portion 111a may be the point in terms of the design.

The protective plate 112 may be coupled with one side of the substrate 117. For example, the protective plate 112 may be coupled with a front surface of the substrate 117.

The protective plate 112 may be formed of a material different from the substrate 117. For example, the protective plate 112 may be formed of a material harder than a material of the substrate 117. Thus, the protective plate 112 may protect the substrate 117 from an impact applied from the front.

The protective plate 112 may be larger than the substrate 117. For example, the protective plate 112 may include an extension EA protruding further than the substrate 117 to the outside.

The extension EA of the protective plate 112 may contact the resin portion 111. For example, the first resin portion 111a may contact both the substrate 117 and the extension EA, and the second resin portion 111b may contact both the first resin portion 111a and the extension EA.

The extension EA may protect the substrate 117 from the external impact. The extension EA may be configured so that the resin portion 111 can be stably coupled. Namely, the extension EA may increase an area to which the first and second resin portions 111a and 111b can be attached.

Figure 77:
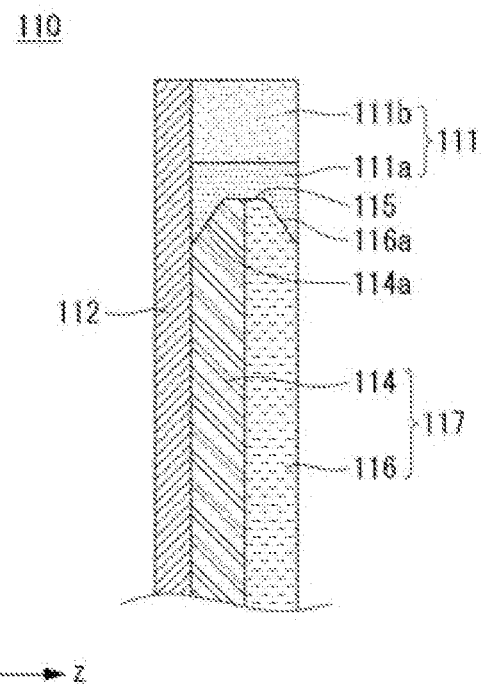

As shown in FIG. 77, another structure of the display panel 110 according to the embodiment of the invention may be configured so that the resin portion 111 can be more efficiently attached. For example, the front substrate 114 may have a first inclined surface 114a, and the back substrate 116 may have a second inclined surface 116a. A planarization portion 115 may be formed by the first and second inclined surfaces 114a and 116a at an upper part of the substrate 117. A contact area between the substrate 117 and the resin portion 111 may increase due to the first and second inclined surfaces 114a and 116a and/or the planarization portion 115.

Figure 78:
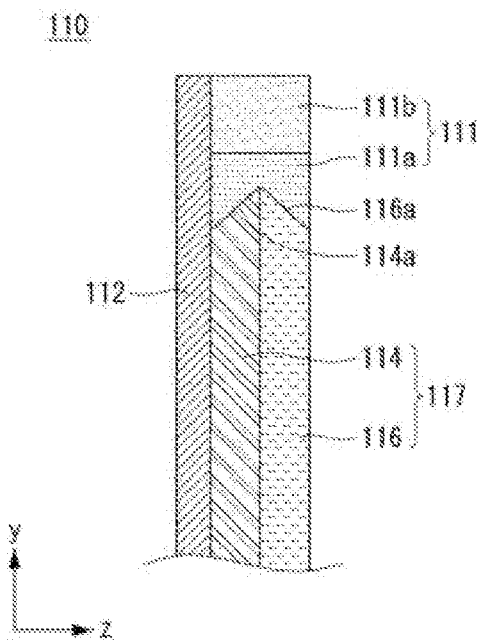

As shown in FIG. 78, another structure of the display panel 110 according to the embodiment of the invention may be configured so that the front substrate 114 and the back substrate 116 respectively have a first inclined surface 114a and a second inclined surface 116a.

Figure 79:
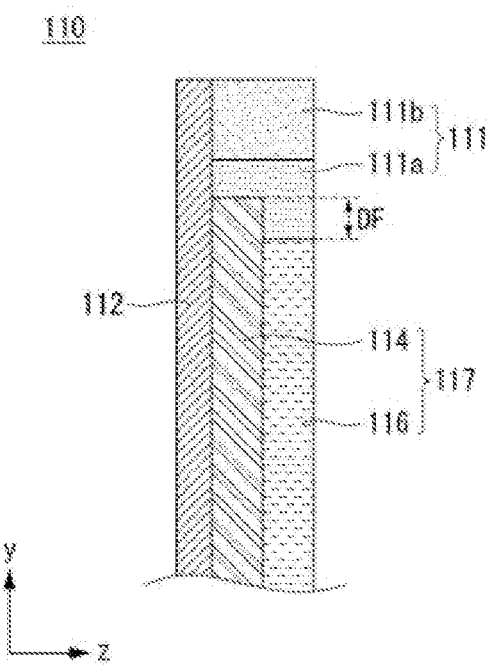
Figure 80:
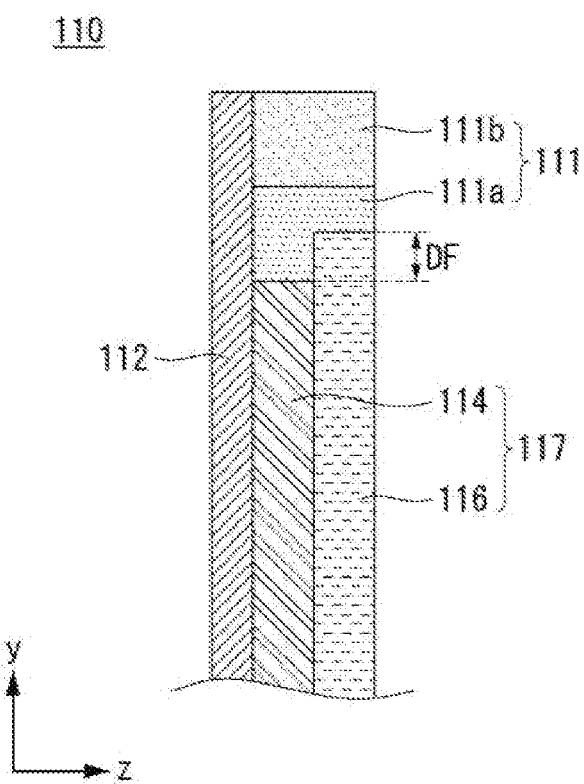

As shown in FIGS. 79 and 80, another structure of the display panel 110 according to the embodiment of the invention may be configured so that lengths and/or areas of the front substrate 114 and the back substrate 116 are different from each other.

More specifically, a length of the front substrate 114 may be longer than a length of the back substrate 116 by 'DF'. Alternatively, a length of the back substrate 116 may be longer than a length of the front substrate 114 by a length DF.

When the lengths of the front substrate 114 and the back substrate 116 are different from each other, contact areas between the front and back substrates 114 and 116 and the resin portion 111 may increase. Namely, a contact area and/or a contact length between the front substrate 114 or the back substrate 116 and the resin portion 111 may increase by the length DF of the side of the front substrate 114 or the side of the back substrate 116, compared to when the resin portion 111 contacts the upper sides of the front and back substrates 114 and 116.

Figure 81:
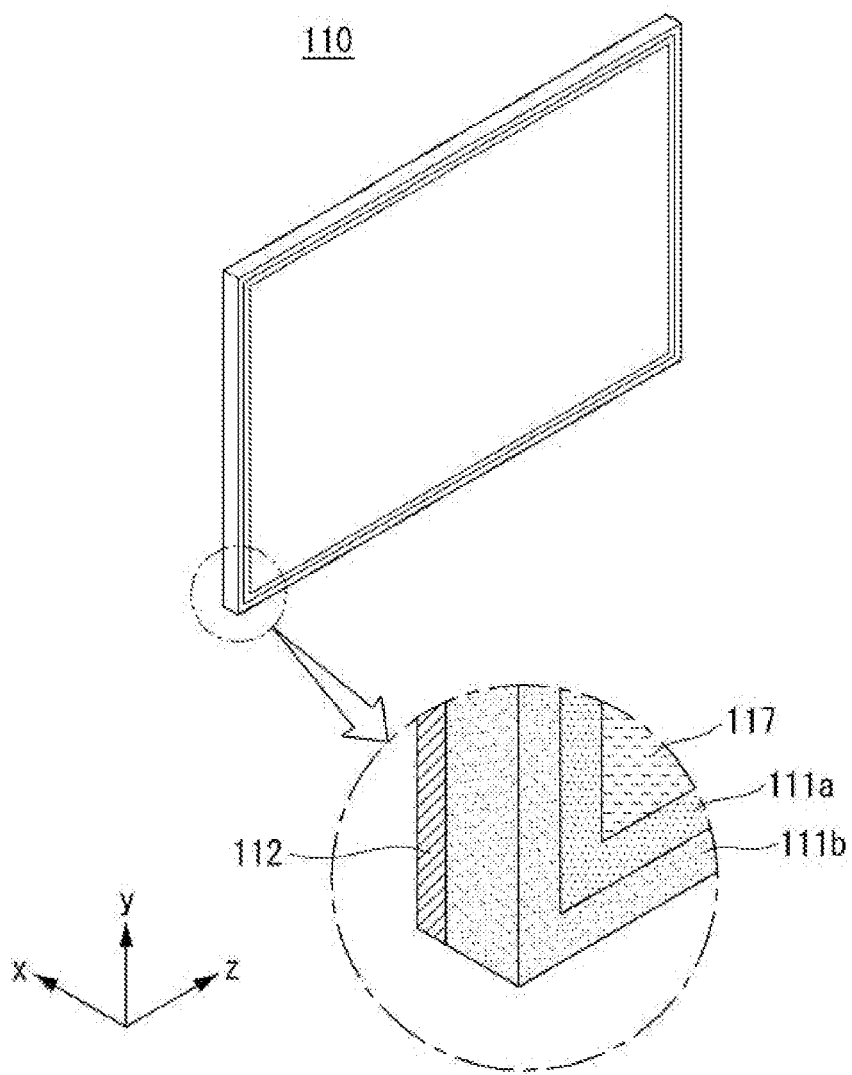

As shown in FIG. 81, the first and second resin portions 111a and 111b may be sequentially stacked on an outer area of the substrate 117. Namely, the first and second resin portions 111a and 111b may be positioned along the outer perimeter of the display panel 110. It is a matter of course that at least one of the first and second resin portions 111a and 111b may be positioned only at a specific edge of the display panel 110. For example, at least one of the first and second resin portions 111a and 111b may be provided only on the long side corresponding to the upper side of the display panel 110, which is highly likely to receive an impact from the outside. The first and second resin portions 111a and 111b may substantially have the same thickness as the substrate 117.

Figure 82:
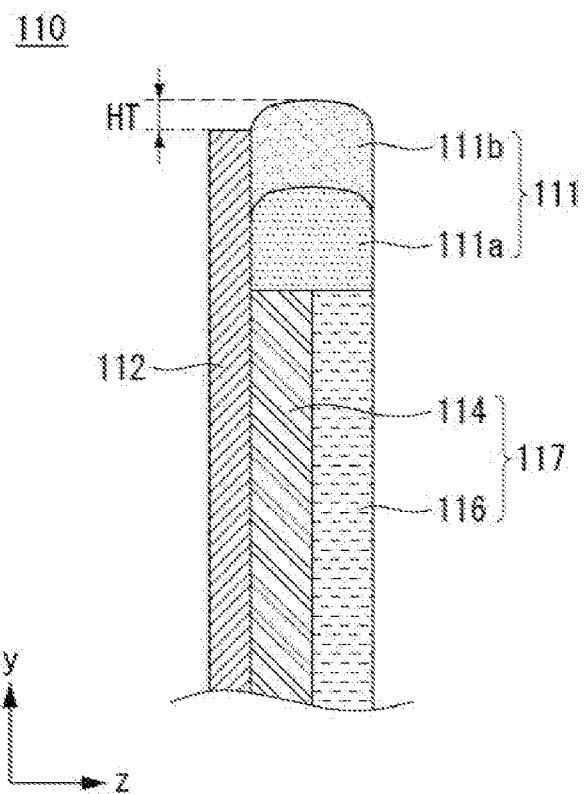

As shown in FIG. 82, the resin portion 111 may protrude further than the protective plate 112. For example, the resin portion 111 may protrude further than the protective plate 112 toward the outside by 'HT'. When the resin portion 111 protrudes toward the outside, the resin portion 111 may more efficiently protect the display panel 110 from an impact from the outside. For example, when an external object approaches the display panel 110 in a Y-axis direction, the external object may contact the second resin portion 111b earlier than other components of the display panel 110. Hence, the second resin portion 111b may protect the components of the display panel 110, for example, the protective plate 112.

Figure 83:
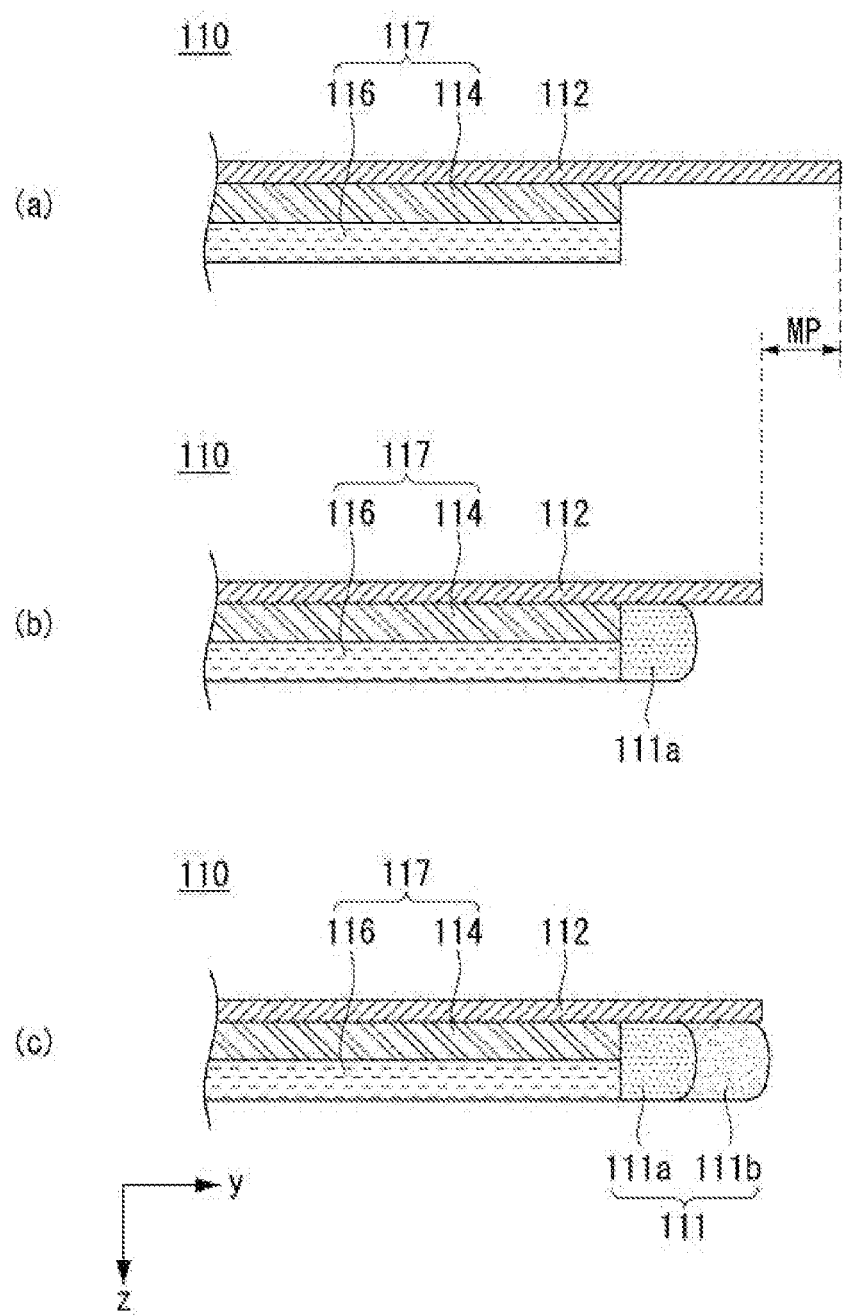
Figure 84:
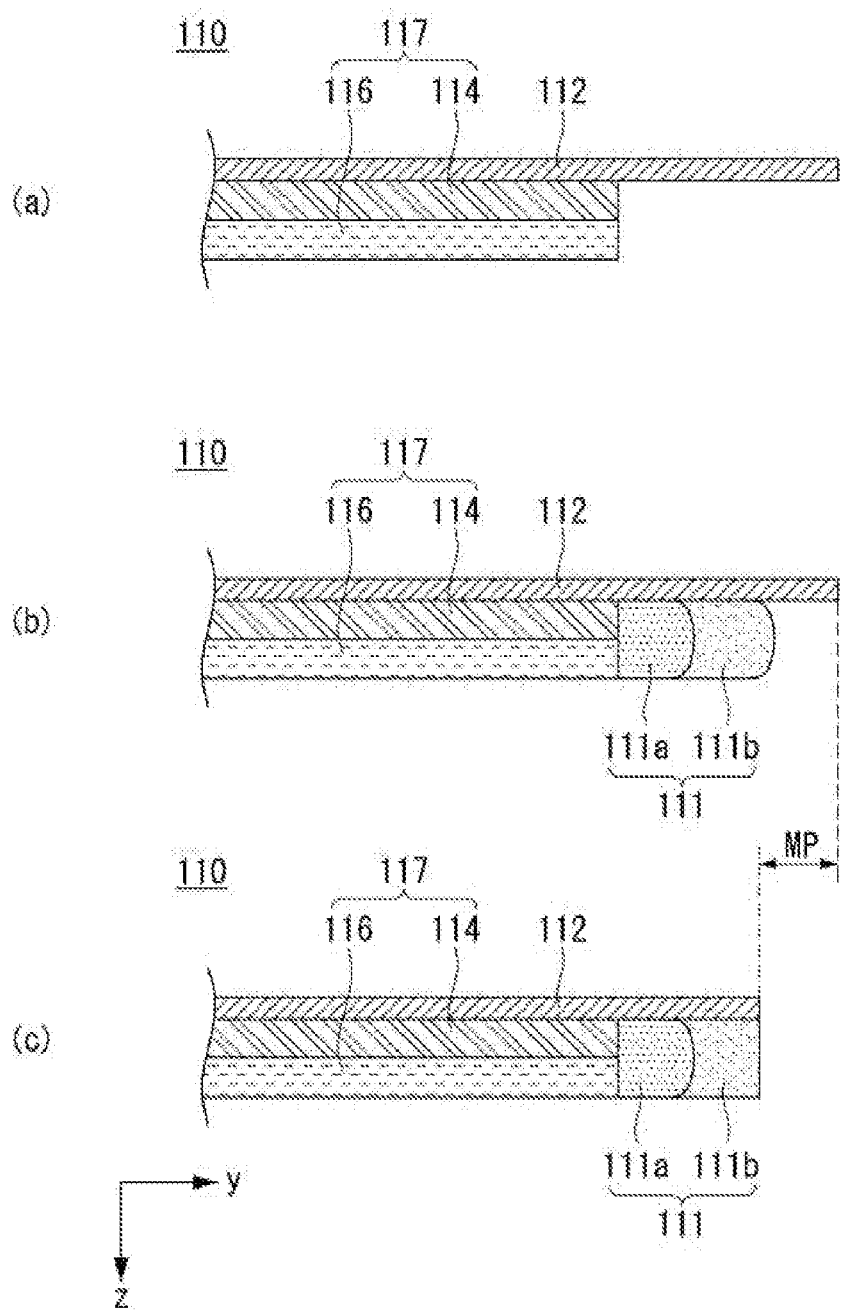

As shown in FIGS. 83 and 84, the resin portion 111 and/or the protective plate 112 may be formed in accordance with a predetermined process order.

As shown in (a) of FIG. 83, the protective plate 112 may be attached to the front surface of the substrate 117. The protective plate 112 may be greater than a length and/or a width required in the completed display panel 110. For example, the protective plate 112 may be greater than the length and/or the width required in the completed display panel 110 by 'MP'.

As shown in (b) of FIG. 83, after the protective plate 112 is attached to the substrate 117, a portion of the outer side of the protective plate 112 may be processed. Namely, the margin MP of the protective plate 112 may be removed in accordance with the length and/or the width required in the completed display panel 110.

The first resin portion 111a may be formed when the protective plate 112 is removed and/or before or after the protective plate 112 is removed. For example, the first resin portion 111a may be formed on the side of the substrate 117 by injecting a liquid or semiliquid resin.

As shown in (c) of FIG. 83, the second resin portion 111b may be additionally applied on the first resin portion 111a. The upper side of the first resin portion 111a and/or the second resin portion 111b may have an oval shape because of the properties of the liquid or semiliquid resin. The second resin portion 111b may protrude further than the protective plate 112 toward the outside because of the oval upper side of the second resin portion 111b.

As shown in (a) of FIG. 84, the protective plate 112 may be attached to the front surface of the substrate 117. The protective plate 112 may be greater than a length and/or a width required in the completed display panel 110.

As shown in (b) of FIG. 84, the first and second resin portions 111a and 111b may be applied before the protective plate 112 is processed.

As shown in (c) of FIG. 84, after the application of the first and second resin portions 111a and 111b is completed, the protective plate 112 may be processed. Namely, a margin MP of the protective plate 112 exceeding the length and/or the width required in the completed display panel 110 may be removed. A portion of the upper side of the second resin portion 111b may be removed in a process for removing the protective plate 112. Thus, a height of the outer side of the protective plate 112 and a height of the upper side of the second resin portion 111b may be substantially the same as each other.

FIGS. 85 to 90 illustrate a structure of the display device shown in FIG. 75.

As shown in FIGS. 85 to 90, the display device 100 according to the embodiment of the invention may have a structure capable of preventing the components of the display device 100 from being damaged by an external force.

Figure 85:
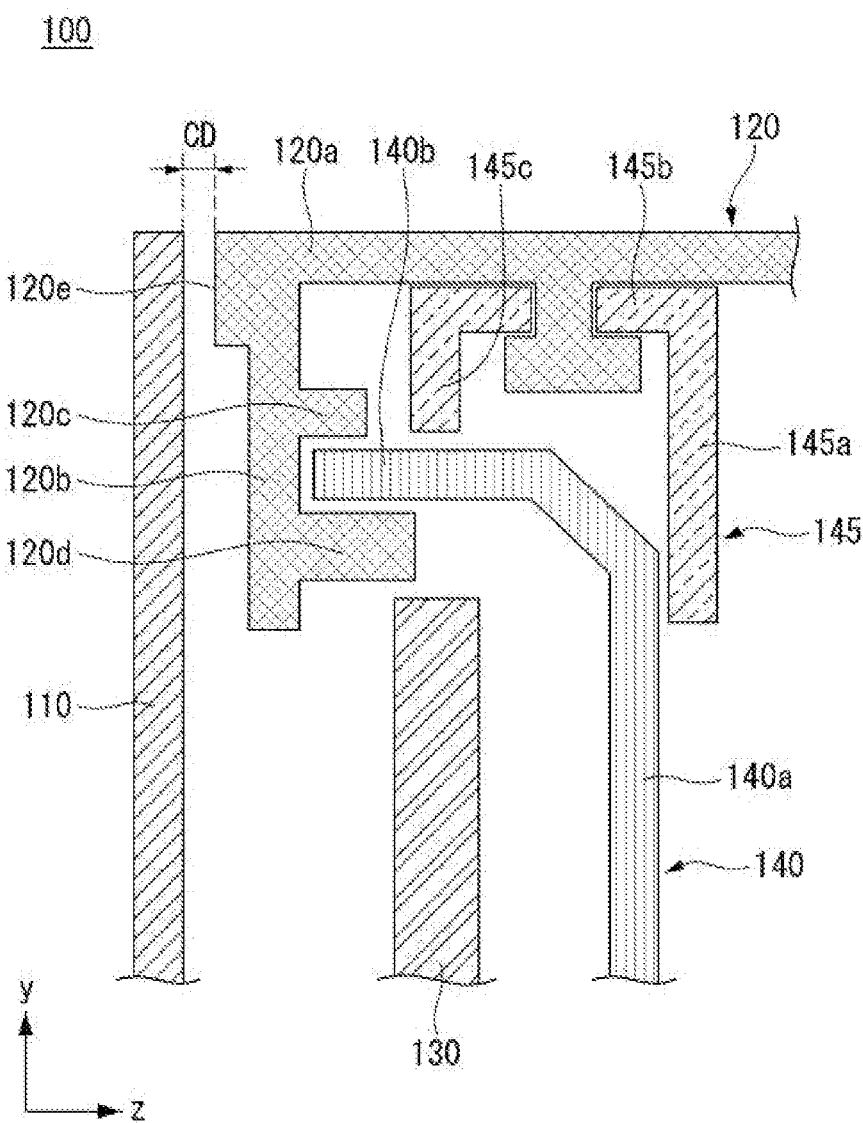
FIGS. 85 to 90 illustrate a structure of a display device shown in FIG. 75.

As shown in FIG. 85, which shows a cross section of the display device 100, the display panel 110 may be positioned at the front of the display device 100, and the backlight unit 130 may be positioned in the rear of the display panel 110. Further, the frame 140 may be positioned in the rear of the backlight unit 130, and the guide panel 120 may be positioned on the side of the backlight unit 130.

One side of a support clip 145 may be fixed to the frame 140. For example, one end of a first support clip body 145a of the support clip 145 may be coupled with the frame 140. A second support clip body 145b of the support clip 145 may be formed by bending the first support clip body 145a, and a third support clip body 145c of the support clip 145 may be formed by bending the second support clip body 145b.

The second support clip body 145b may contact the guide panel 120. For example, the second support clip body 145b may come in surface contact with the guide panel 120. A deformation of the guide panel 120 may be minimized due to the contact between the second support clip body 145b and the guide panel 120. For example, when the guide panel 120 is deformed by the external force, the second support clip body 145b may support the guide panel 120. Hence, the deformation of the guide panel 120 may be minimized.

The second support clip body 145b may be directly coupled with the guide panel 120. For example, an extension extending from a first guide panel body 120a of the guide panel 120 may be directly coupled with the second support clip body 145b. The support clip 145 may be fixed at an original position due to the coupling between the extension of the first guide panel body 120a and the second support clip body 145b.

The third support clip body 145c may be bent toward the frame 140. An end of the third support clip body 145c may be adjacent to or contact a second frame body 140b of the frame 140. Thus, when the guide panel 120 is deformed by the external force, the end of the third support clip body 145c may contact the second frame body 140b of the frame 140 and may minimize the deformation of the guide panel 120.

A second guide panel body 120b of the guide panel 120 may include a stopper 120c. The stopper 120c may have a shape obtained by protruding inward the second guide panel body 120b. The stopper 120c may be adjacent to or contact the back surface of the frame 140.

The stopper 120c may prevent the deformation of the guide panel 120. Alternatively, the stopper 120c may prevent a predetermined amount of the deformation of the guide panel 120. For example, when the external force is applied downwards to the upper side of the guide panel 120, the deformation of the guide panel 120 may be prevented due to the stopper 120c contacting the guide panel 120.

The second guide panel body 120b of the guide panel 120 may further include a protrusion 120d. The protrusion 120d may have a shape obtained by extending the second guide panel body 120b to the inside. When the upper side of the frame 140 is coupled with the stopper 120c, and the lower side of the frame 140 is coupled with the protrusion 120d, the deformation of the guide panel 120 resulting from the external force may be prevented.

The guide panel 120 may be positioned adjacent to the display panel 110. For example, a front end 120e of the guide panel 120 may be positioned adjacent to the display panel 110 at a separation distance CD therebetween. The separation distance CD between the front end 120e of the guide panel 120 and the display panel 110 may be within several millimeters, so as to improve the design completeness. In this state, when the guide panel 120 is deformed by the external force, the front end 120e of the guide panel 120 may contact the display panel 110. The support clip 145, the stopper 120c, and/or the protrusion 120d of the display device 100 according to the embodiment of the invention may prevent the deformation of the guide panel 120.

Figure 86:
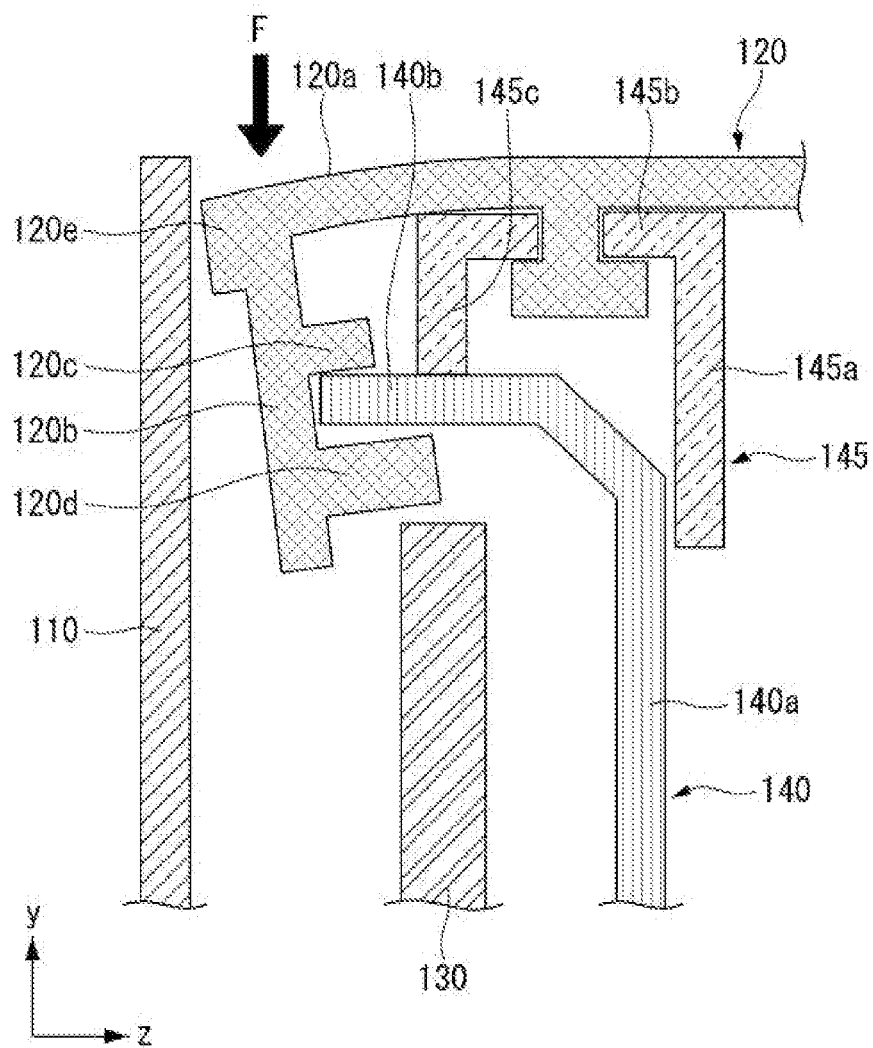

As shown in FIG. 86, an external force F may be applied to the guide panel 120. When the external force F is applied, the guide panel 120 may be deformed. As described above, the front end 120e of the guide panel 120 may be positioned adjacent to the display panel 110. Even when the external force F is applied to the guide panel 120, the contact between the front end 120e of the guide panel 120 and the display panel 110 may not be generated. Namely, the deformation of the guide panel 120 may be prevented through the contact between the third support clip body 145c of the support clip 145 and the second frame body 140b of the frame 140. Further, the deformation of the guide panel 120 may be prevented through the contact between the stopper 120c of the guide panel 120 and the second frame body 140b of the frame 140.

Figure 87:
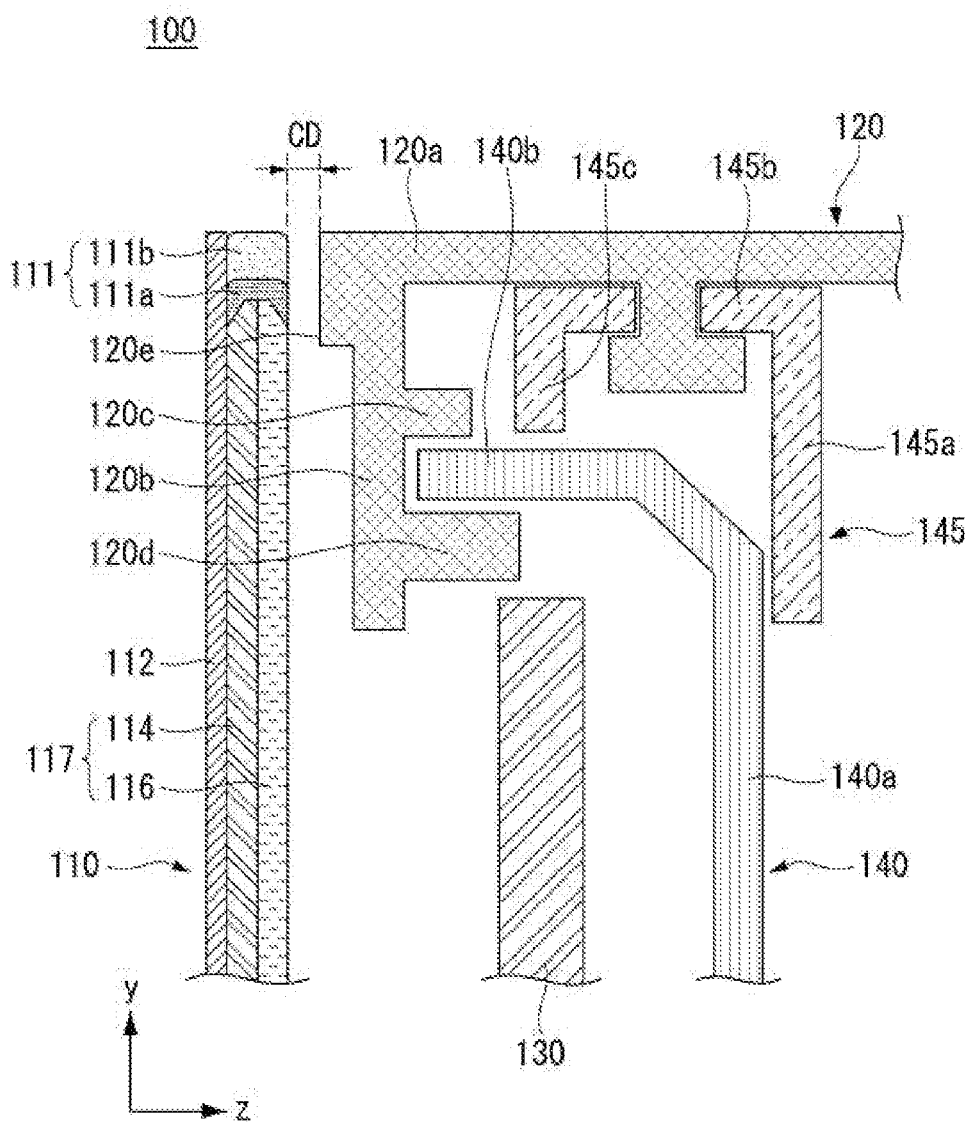

As shown in FIG. 87, the resin portion 111 may be positioned at an end of the display panel 110. The resin portion 111 may include a plurality of layers. Even when the guide panel 120 adjacent to the display panel 110 is excessively deformed, the front end 120e of the guide panel 120 may contact not the back substrate 116 but the resin portion 111. Thus, a damage of the display panel 110 resulting from the deformation of the guide panel 120 may be prevented.

Figure 88:
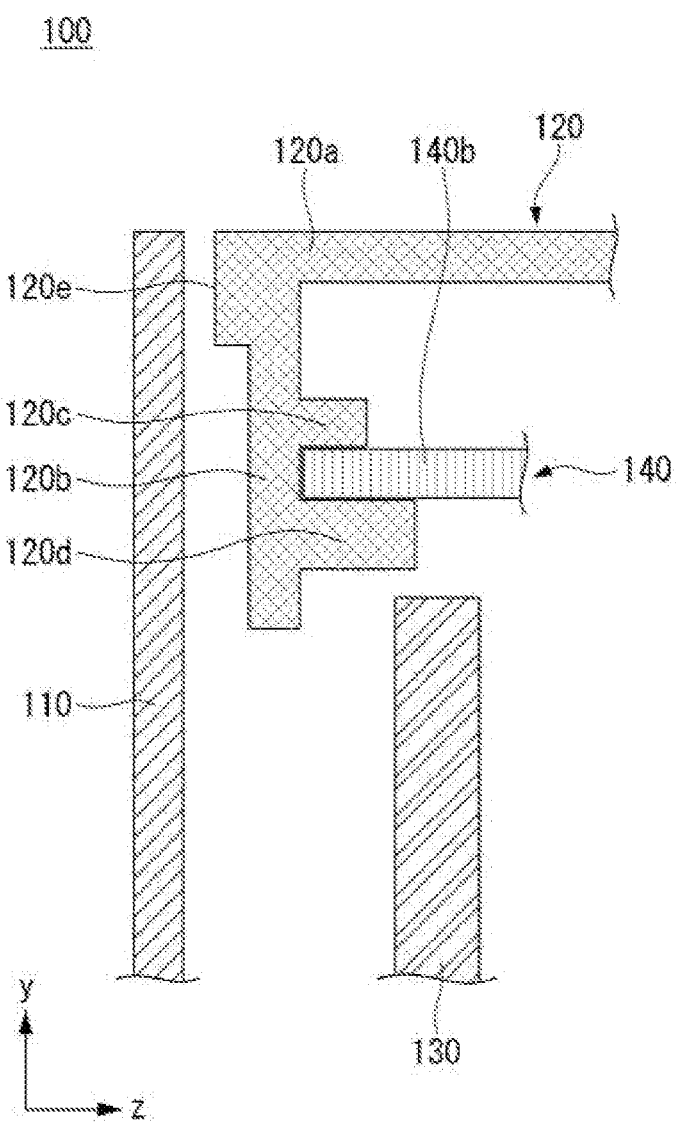

As shown in FIG. 88, the stopper 120c and the protrusion 120d may be adhered to the frame 140. For example, the second frame body 140b may be coupled between the stopper 120c and the protrusion 120d. At least one of the stopper 120c and the protrusion 120d may be fixed to the frame 140 through a screw.

Figure 89:
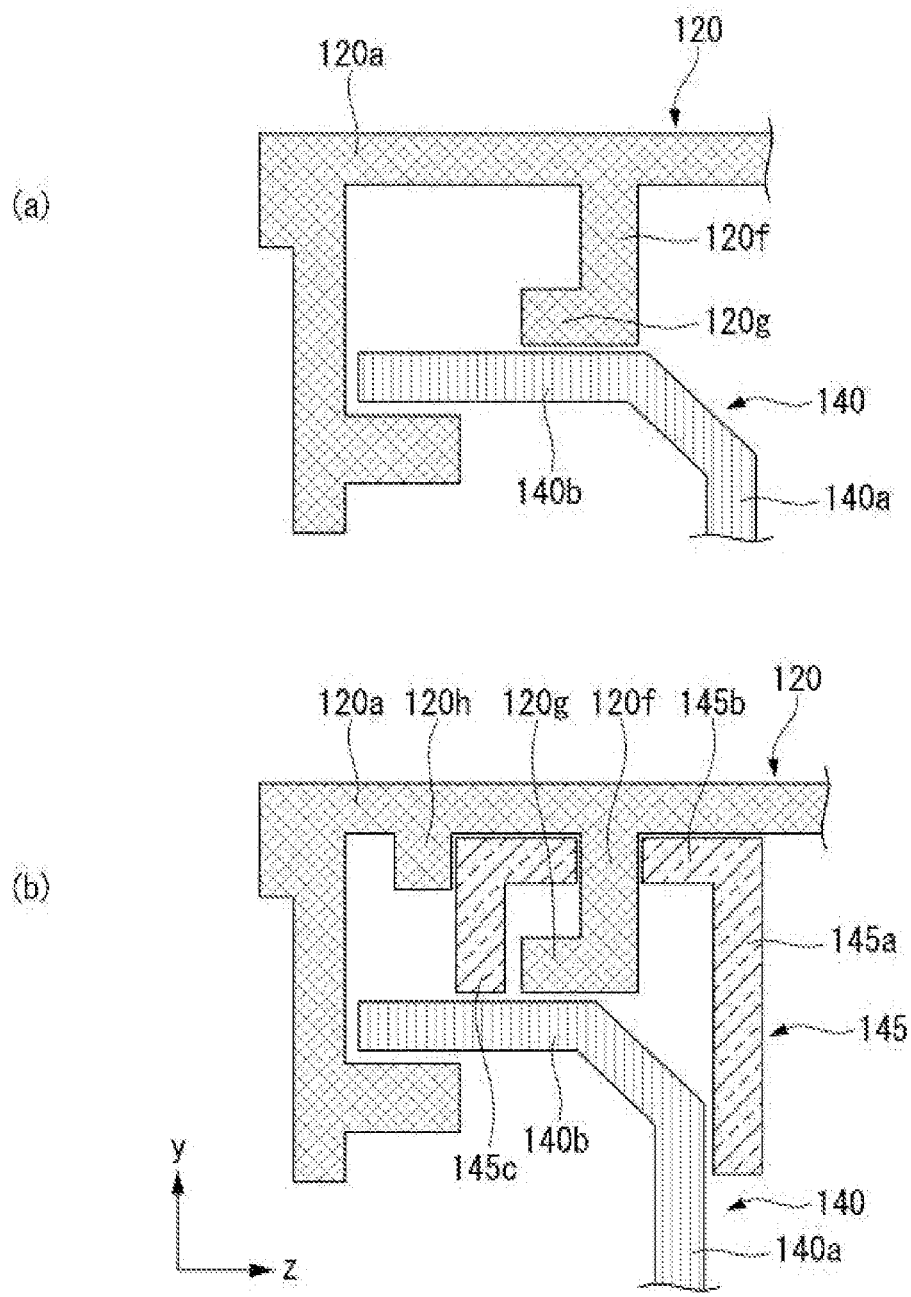

As shown in (a) of FIG. 89, a protrusion protruding in a direction from the guide panel 120 to the frame 140 may be provided. For example, a protrusion 120f protruding in a direction from the first guide panel body 120a to the second frame body 140b and a contact portion 120g extending from the protrusion 120f may be formed.

The contact portion 120g may contact the second frame body 140b. Thus, even when the external force is applied to the guide panel 120, the contact between the guide panel 120 and the display panel 110 may be prevented by the contact portion 120g.

As shown in (b) of FIG. 89, the support clip 145 and the contact portion 120g may be provided. The third support clip body 145c and the contact portion 120g may contact the second frame body 140b.

The guide panel 120 may have a fixed protrusion 120h. The fixed protrusion 120h may contact the support clip 145. The fixed protrusion 120h may support the support clip 145 so that the support clip 145 is fixed at a given position.

Figure 90:
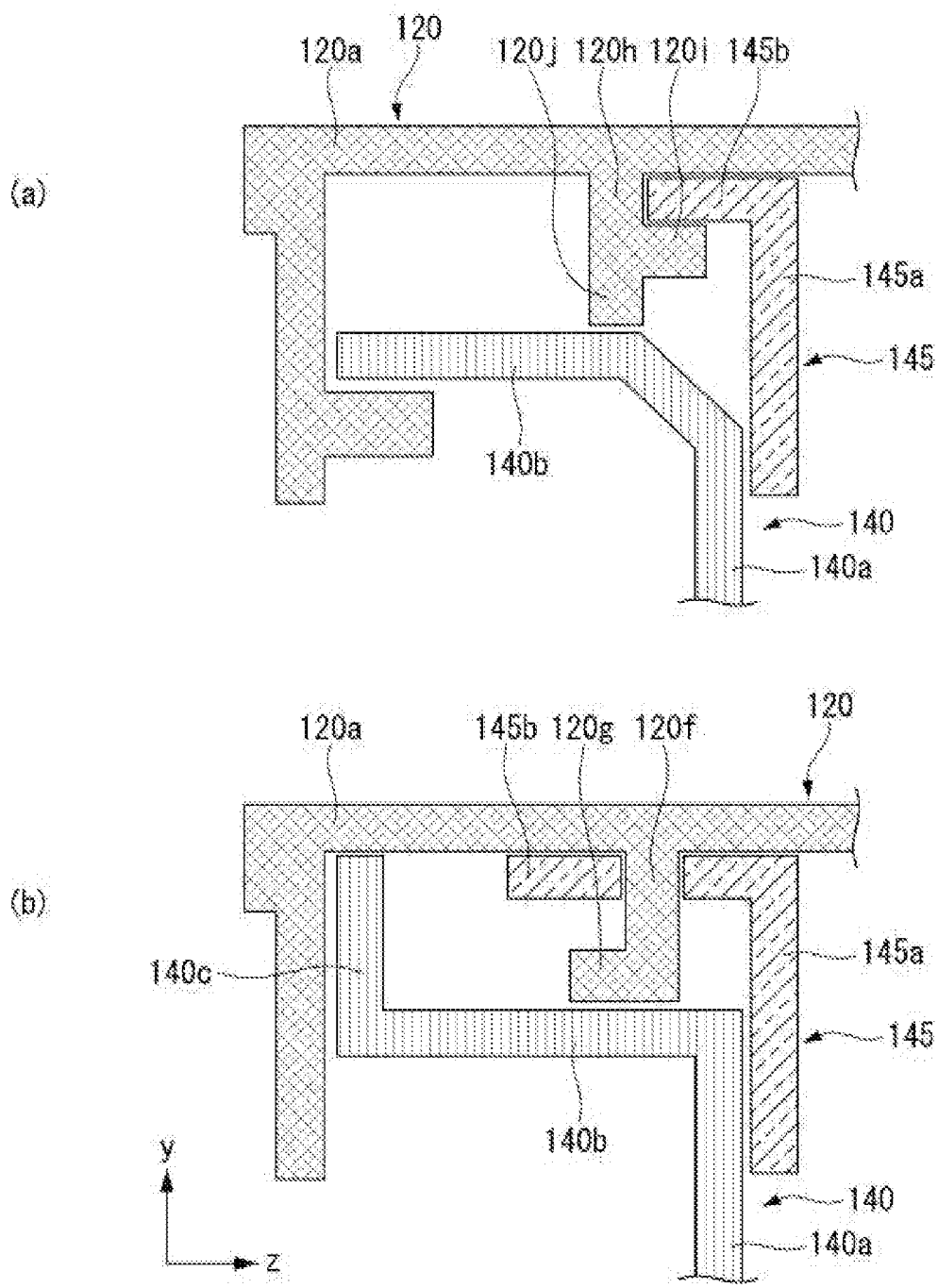

As shown in (a) of FIG. 90, the support clip 145 may be coupled with the guide panel 120. Namely, the second support clip body 145b may be inserted into first and second coupling protrusions 120h and 120i extending from the guide panel 120. Because the second support clip body 145b supports the first guide panel body 120a, the deformation of the guide panel 120 may be prevented.

A third coupling protrusion 120j may extend from the first coupling protrusion 120h toward the frame 140. The third coupling protrusion 120j may contact the frame 140. The deformation of the guide panel 120 may be prevented by the third coupling protrusion 120j contacting the frame 140.

As shown in (b) of FIG. 90, the frame 140 may directly support the guide panel 120. For example, a third frame body 140c extending from the second frame body 140b may contact the first guide panel body 120a. Because the third frame body 140c supports the first guide panel body 120a, the deformation of the guide panel 120 may be prevented.

FIGS. 91 to 105 illustrate a coupling structure of a display device shown in FIG. 75.

As shown in FIGS. 91 to 105, the display device 100 according to the embodiment of the invention may include a guide 142.

Figure 91:
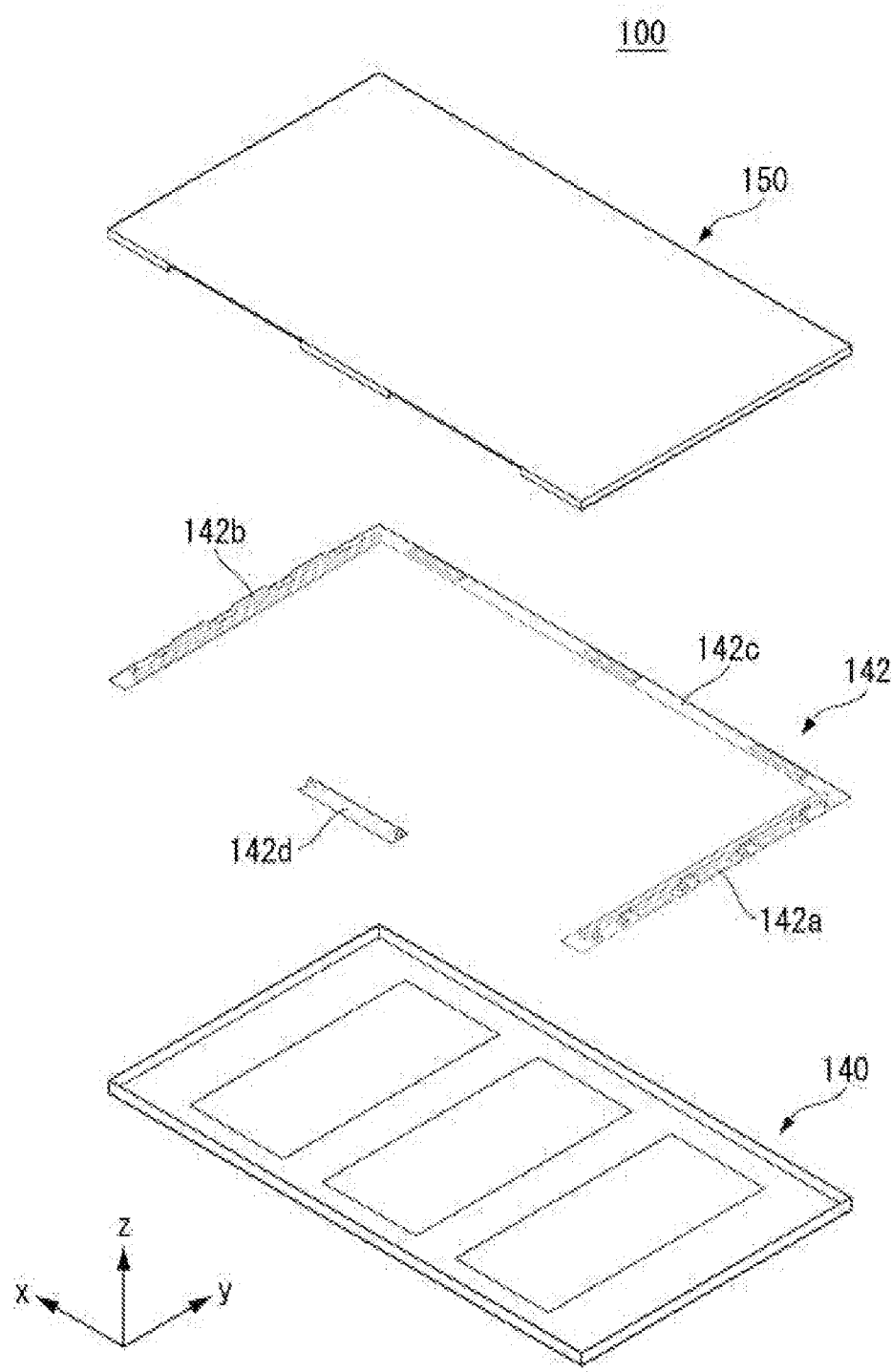
FIGS. 91 to 105 illustrate a coupling structure of a display device shown in FIG. 75.

As shown in FIG. 91, the guide 142 may be formed separately from the frame 140 and then may be coupled with the frame 140. Alternatively, the guide 142 and the frame 140 may form one body by processing an outer circumference area of the frame 140. When the guide 142 is formed separately from the frame 140 and then is coupled with the frame 140, the guide 142 may be coupled with the frame 140 using a screw, etc.

The guide 142 may be divided into a plurality of areas. For example, the guide 142 may be divided into first to fourth guides 142a to 142d. The first and second guides 142a and 142b may be coupled with first and second short sides of the frame 140, the third guide 142c may be coupled with a first long side of the frame 140, and the fourth guide 142d may be coupled with a second long side of the frame 140.

At least one of the first to fourth guides 142a to 142d may be formed separately from at least one of the remaining guides. For example, the fourth guide 142d may be formed separately from the first to third guides 142a to 142c.

Figure 92:
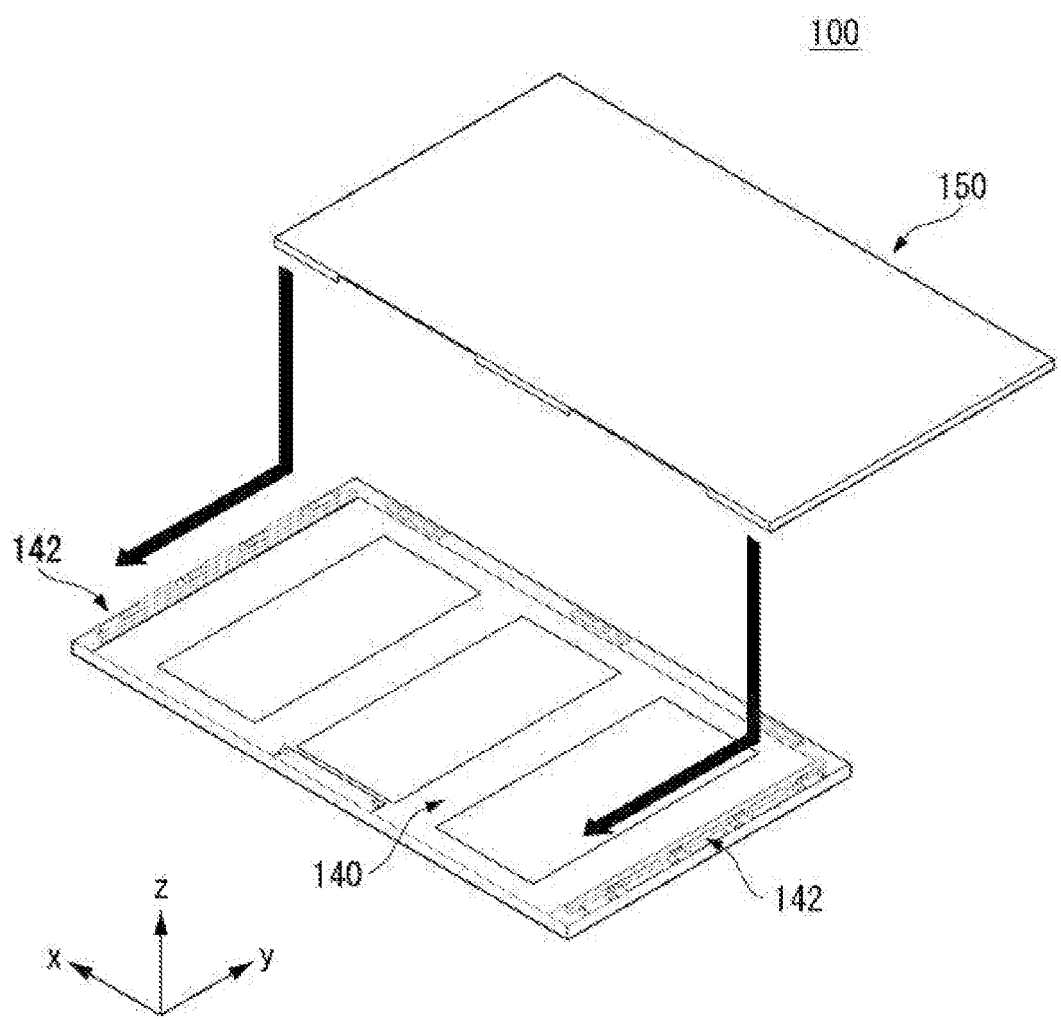

As shown in FIG. 92, the back cover 150 may be coupled with the back surface of the frame 140. The back cover 150 may be slidingly coupled with the frame 140. Namely, the back cover 150 may approach the frame 140 in the rear of the frame 140 and then may slide on the frame 140 in one direction, thereby coupling with the frame 140.

Figure 93:
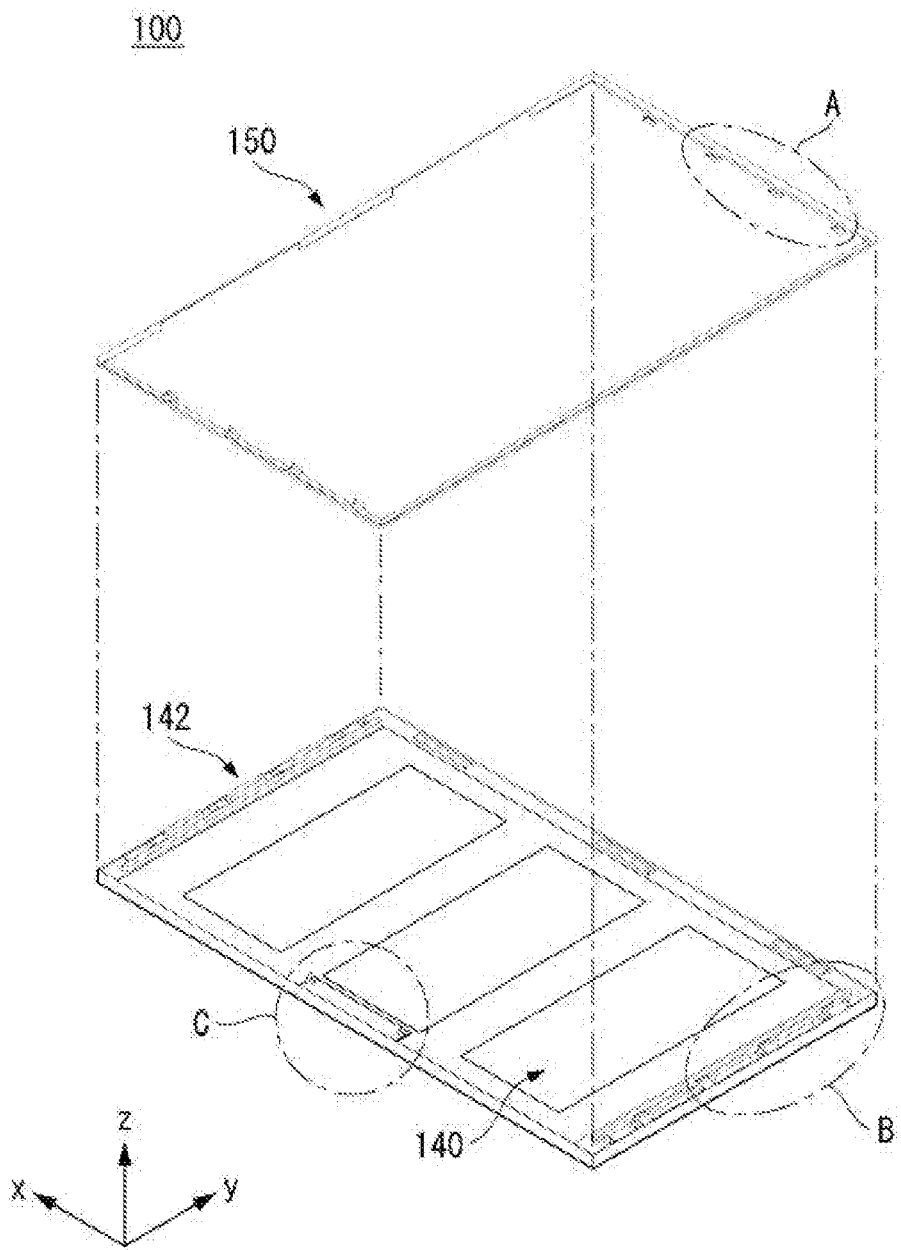

As shown in FIG. 93, the guide 142 may be coupled with the frame 140. The back cover 150 may have a structure corresponding to the guide 142 coupled with the frame 140. Hereinafter, the main components, i.e., areas A, B, C, and D are described.

Figure 94:
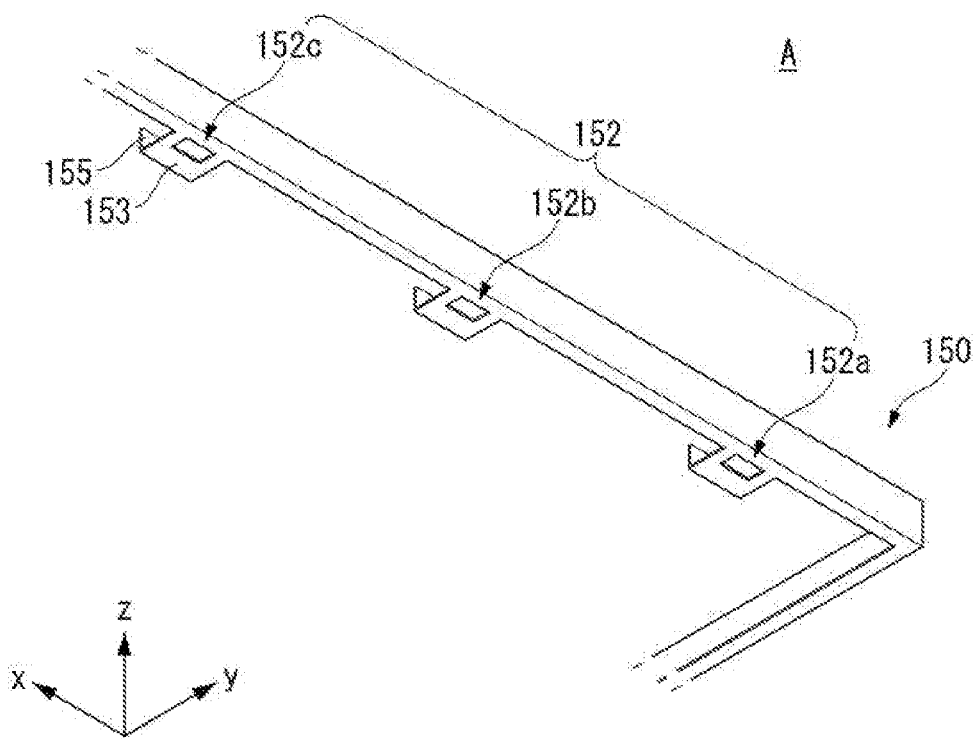

As shown in FIG. 94, a plurality of flanges 152 may be formed inside the back cover 150. For example, first to third flanges 152a to 152c may be arranged inside the back cover 150 to be separated from one another.

The flange 152 may include a first flange body 153 extending from the back cover 150 and a second flange body 155 which extends from the first flange body 153 by bending inward the first flange body 153. The first flange body 153 may contact the guide 142 coupled with the frame 140. This is described in detail later.

A state where the flange 152 contacts the guide 142 and the back cover 150 is inclined at a predetermined angle may be referred to as a first state. A state where a portion of the flange 152 is detached from the guide 142 and is substantially parallel with the frame 140 may be referred to as a second state. Namely, the back cover 150 may move from the first state to the second state and may be coupled with the frame 140.

Figure 95:
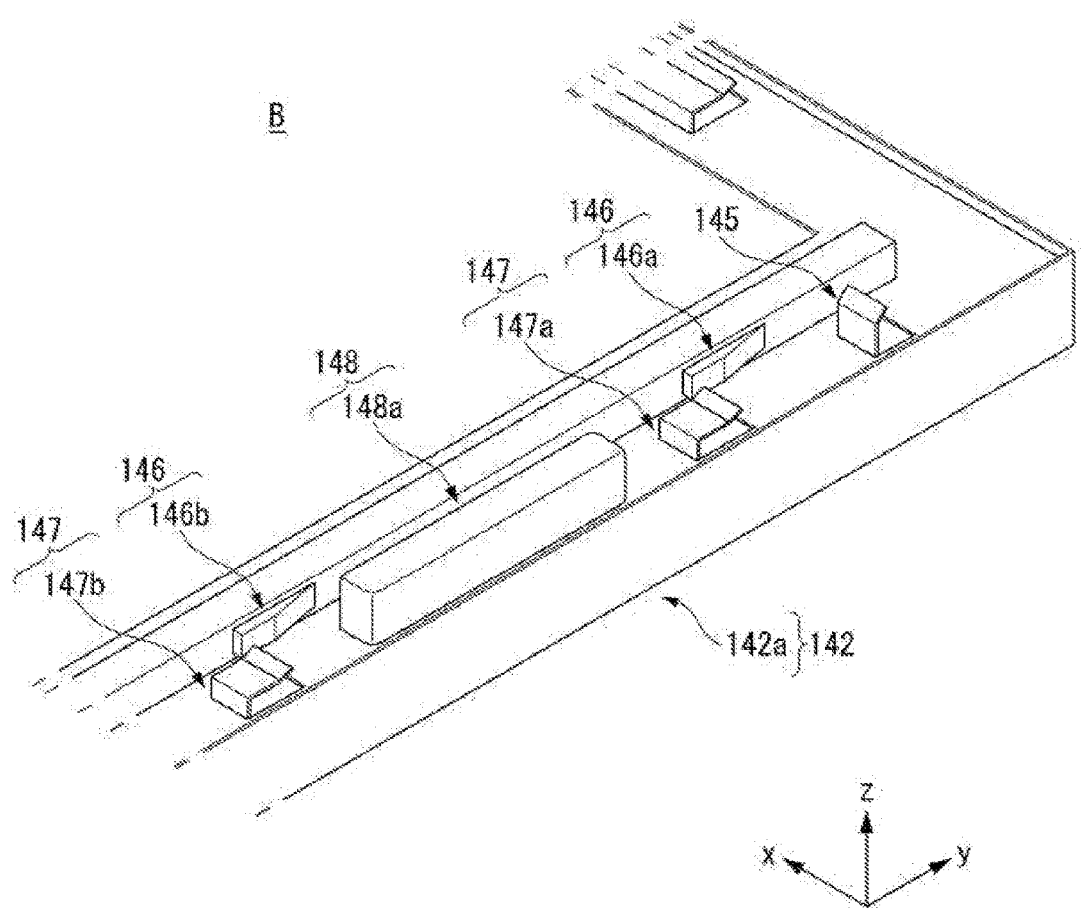

As shown in FIG. 95, the guide 142 may have a structure which is configured so that the flange 152 of the back cover 150 is slidingly coupled with the guide 142. For example, first to fourth guides 145, 146, 147, and 148 may be formed.

At least one of the first to fourth guides 145, 146, 147, and 148 may be repeatedly formed along the long side of the frame 140. For example, the second, third, and fourth guides 146, 147, and 148 may be repeatedly formed along the ling side of the frame 140. A set of the guides (for example, 146, 147, and 148) which are repeatedly formed, may correspond to one flange 152 of the back cover 150. Each guide is described in detail below.

Figure 96:
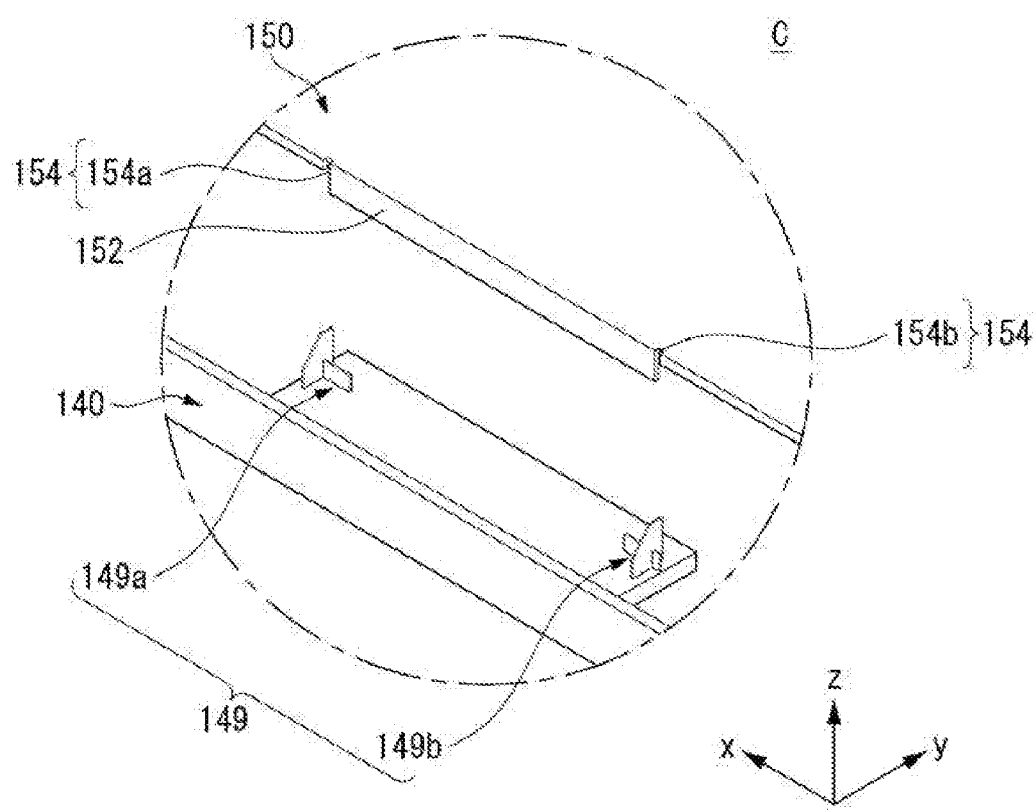

As shown in FIG. 96, a fifth guide 149 may be positioned on the frame 140. The fifth guide 149 may have a cross shape.

The fifth guide 149 may include a 5a guide 149a and a 5b guide 149b. The 5a and 5b guides 149a and 149b may be separated from each other at a predetermined distance therebetween.

The back cover 150 may include an extension 152 between slits 154. The slit 154 may include first and second slits 154a and 154b corresponding to the 5a and 5b guides 149a and 149b.

FIGS. 97 to 105 illustrate a sliding coupling process of the back cover 150 using the above-described structure.

Figure 97:
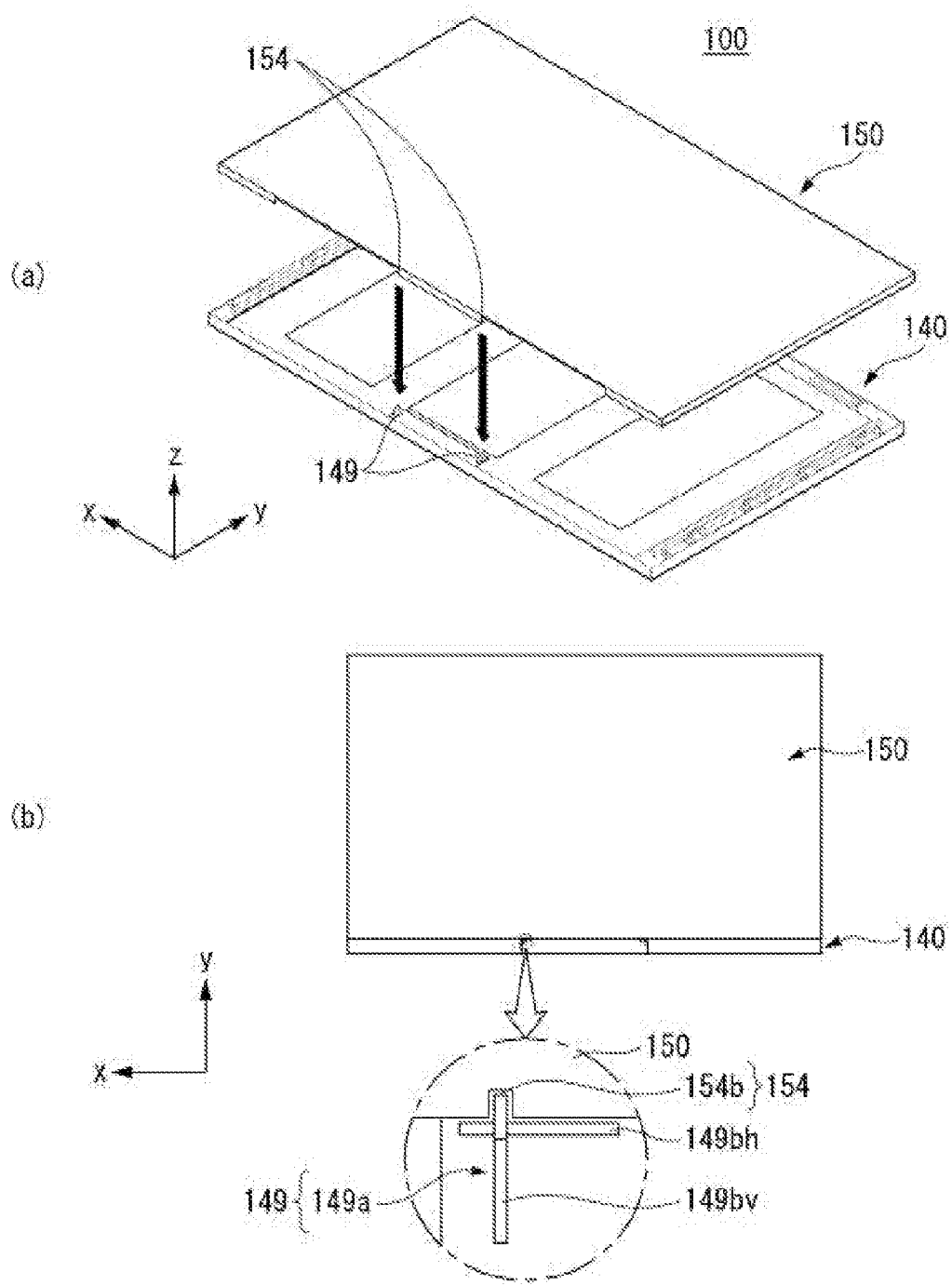

As shown in (a) of FIG. 97, a worker may approach the back cover 150 to the frame 140. In this instance, the worker may dispose the slit 154 of the back cover 150 at a position corresponding to the fifth guide 149 of the frame 140.

As shown in (b) of FIG. 97, a vertical plate 149bv of the fifth guide 149 may be inserted into the slit 154 of the back cover 150. When the vertical plates 149bv of the 5a and 5b guides 149a and 149b are respectively inserted into the two slits 154, a coupling position of the back cover 150 in the x-axis direction may be naturally aligned.

The worker may insert the fifth guide 149 into the slit 154 and also may dispose a back surface of the back cover 150 on a horizontal plate 149bh of the fifth guide 149.

Figure 98:
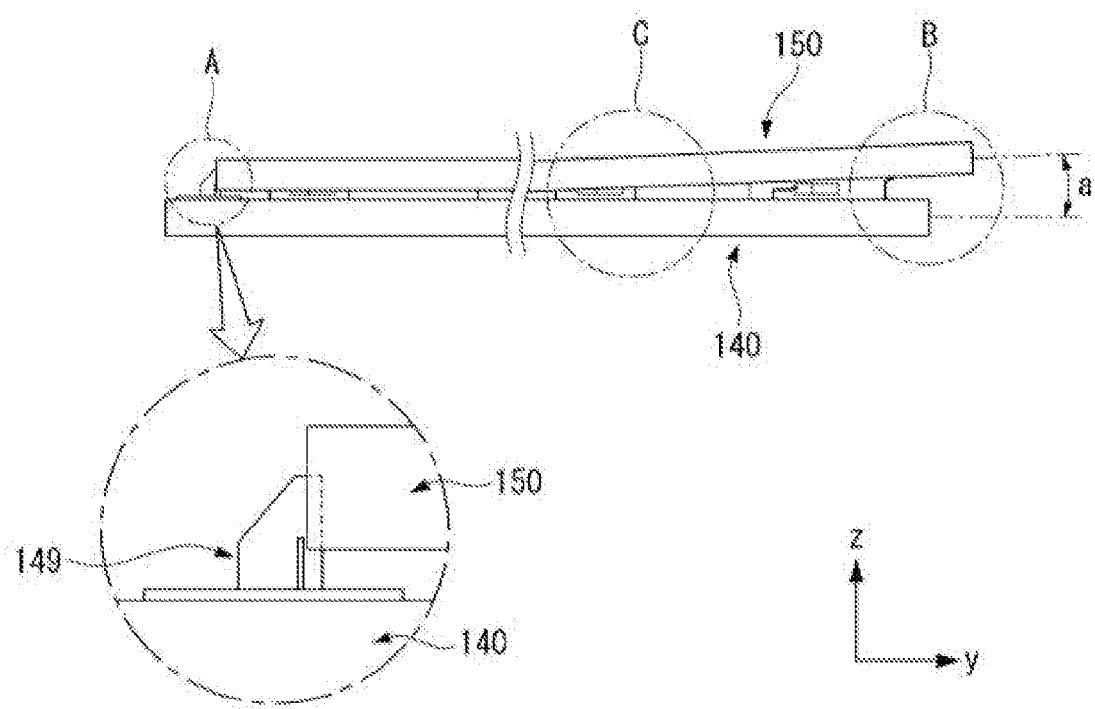

As shown in FIG. 98, when a bottom portion of the back cover 150 is inserted into the fifth guide 149, a predetermined angle 'a' between the back cover 150 and the frame 140 may be formed. Namely, the bottom portion of the back cover 150 may be close to the frame 140, and a top portion of the back cover 150 may be separated from the frame 140. The back cover 150 may easily slide in a detachment direction due to such a disposition of the back cover 150.

Figure 99:
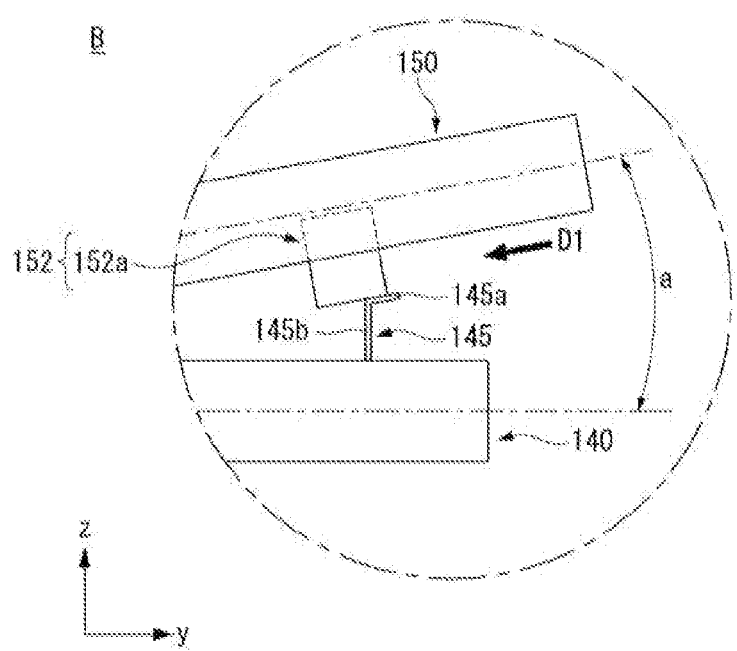

As shown in FIG. 99, when the bottom portion of the back cover 150 is inserted into the fifth guide 149, the flange 152 of the back cover 150 may be put up on the first guide 145. The first guide 145 may include a body portion 145b extending in a z-axis direction and a base portion 145a extending from the body portion 145b. The base portion 145a may be inclined at a predetermined angle. In other words, the base portion 145a may be formed at an oblique angle. Thus, a first flange 152a may be naturally put up on the base portion 145a. Further, the back cover 150 connected to the first flange 152a may be slide on the base portion 145a in an arrow direction D1 shown in FIG. 99.

Figure 100:
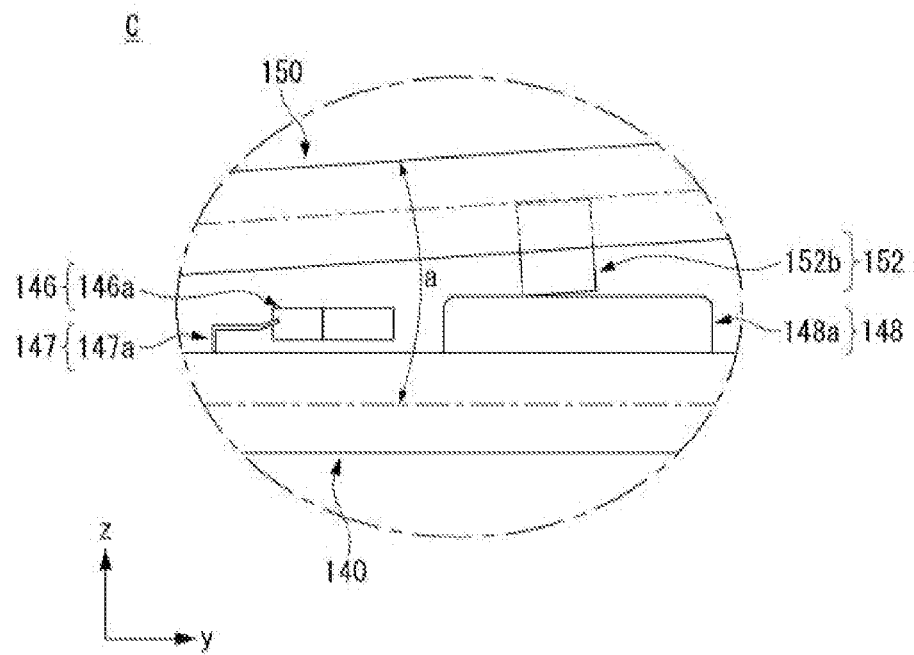

As shown in FIG. 100, at least one of the flanges 152 may be positioned on the fourth guide 148. For example, a second flange 152b may be put up on a 4a guide 148a corresponding to the second flange 152b.

Figure 101:
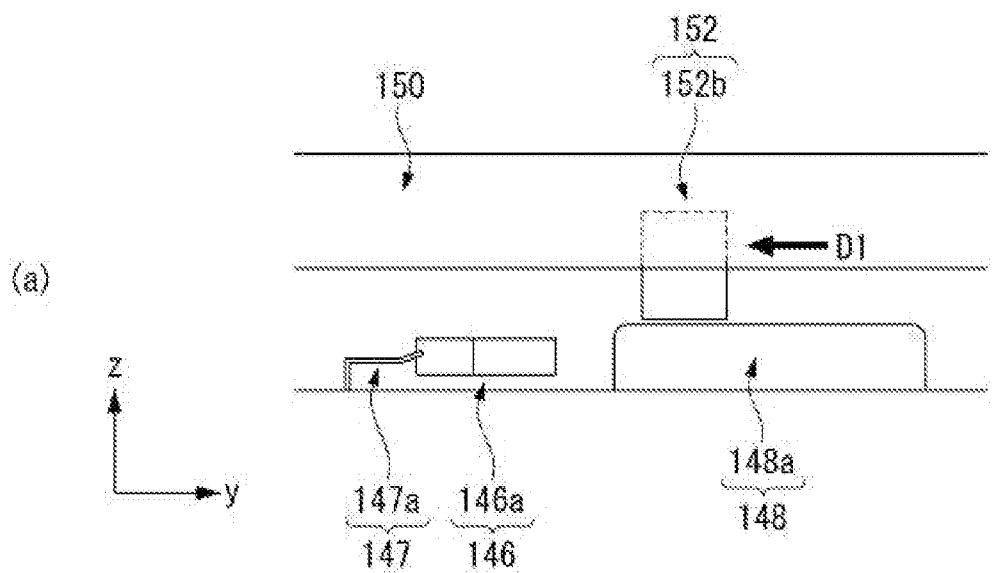
Figure 101:
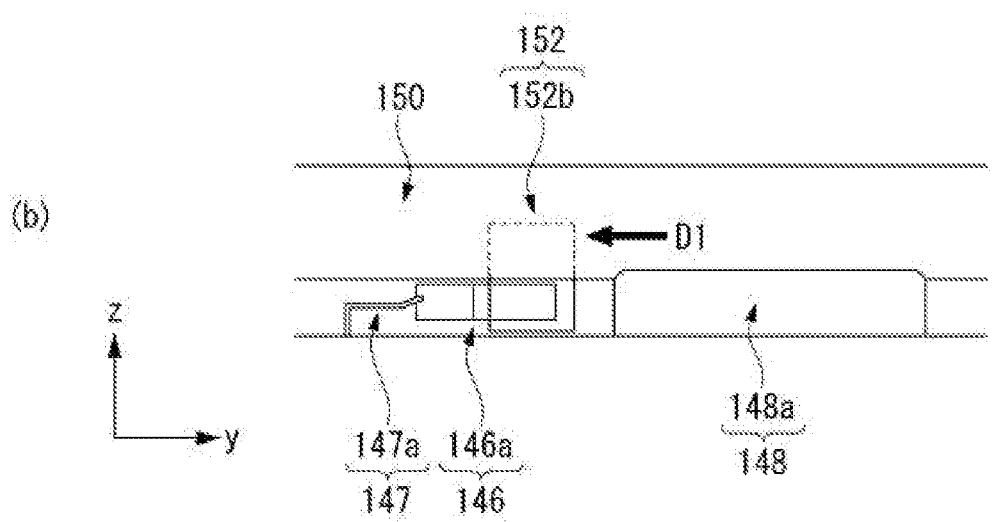

As shown in (a) of FIG. 101, the back cover 150 may slide on the fourth guide 148 in the arrow direction D1 in a state where the flange 152 is put up on the fourth guide 148.

As shown in (b) of FIG. 101, the flange 152 sliding on the fourth guide 148 may move under the fourth guide 148. For example, the second flange 152b moving up to an end of the 4a guide 148a may fall under the 4a guide 148a.

The flange 152 falling under the fourth guide 148 may contact the second guide 146.

Figure 102:
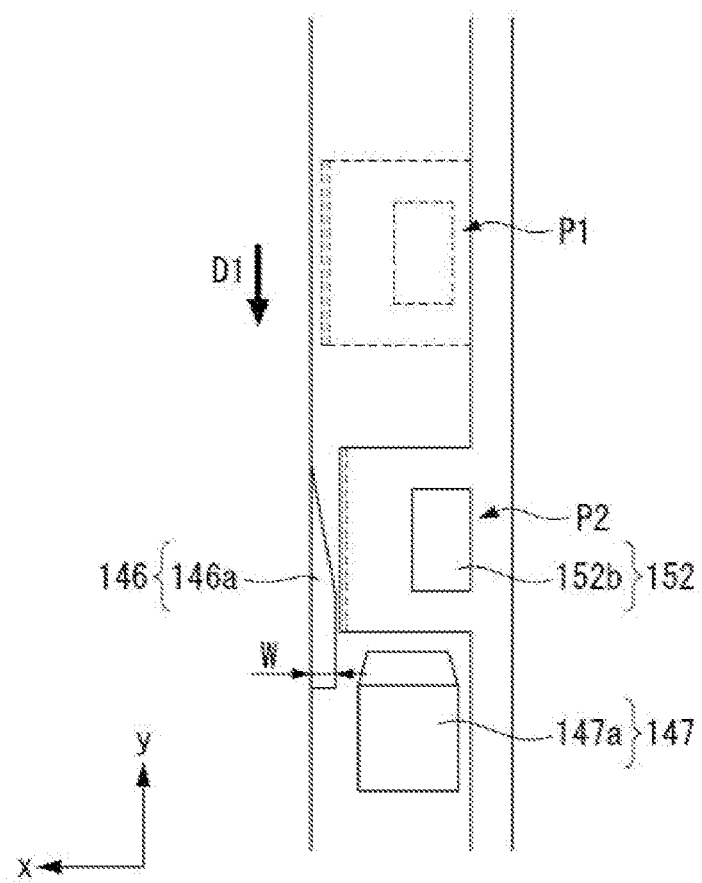
Figure 103:
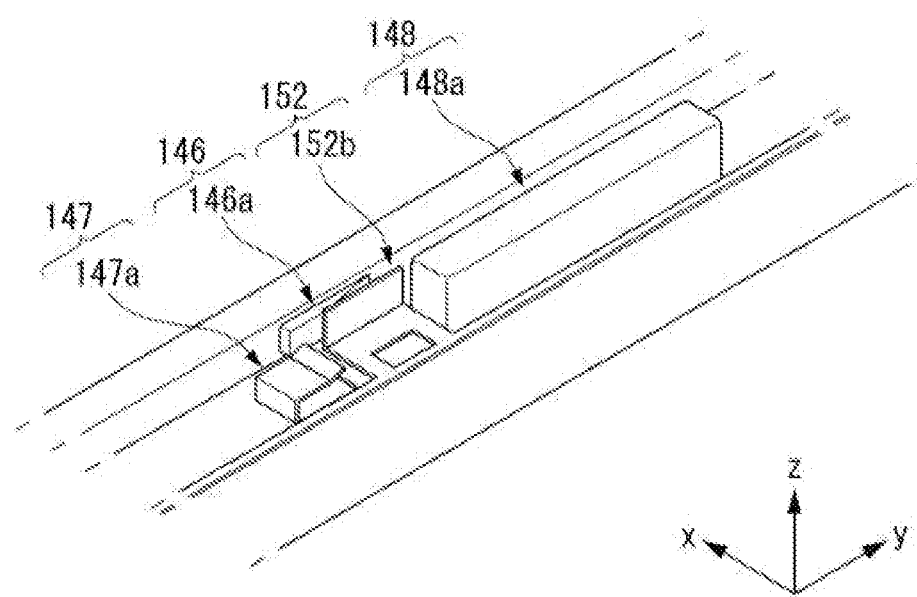

As shown in FIGS. 102 and 103, the second guide 146 may protrude inward by 'W'. Thus, the second guide 146 may pressurize the side of the flange 152. For example, when the flange 152 moves from a P1 state to a P2 state, the second guide 146 may contact the side of the flange 152. When the flange 152 is pressurized by the second guide 146, a noise and/or a vibration generated by the contact between the flange 152 and other structure may be prevented.

Figure 104:
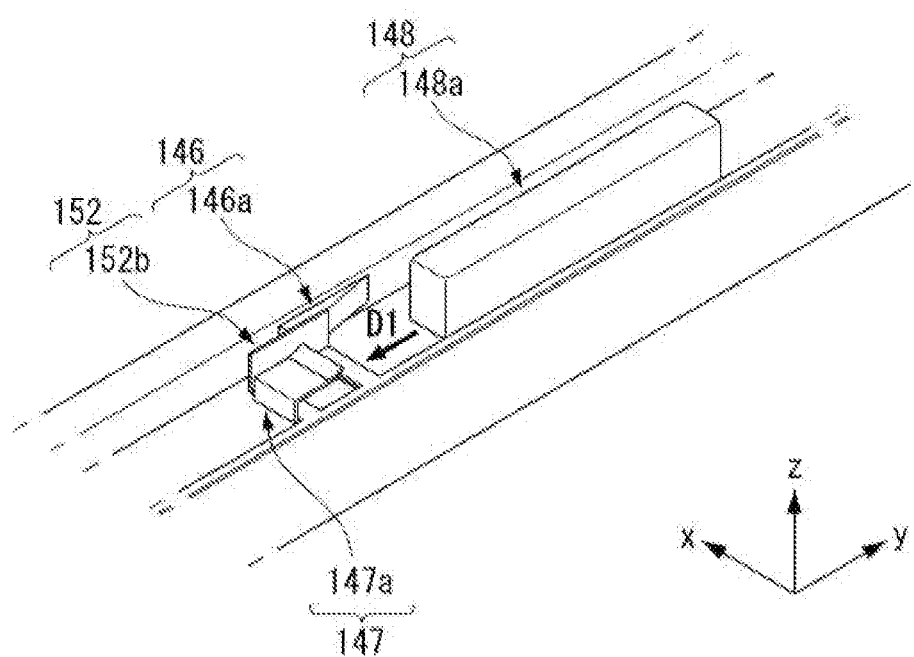

As shown in FIG. 104, when the flange 152 continuously slides in the direction D1, the flange 152 may be inserted into an opening of the third guide 147. The flange 152 inserted into the third guide 147 may be coupled with the third guide 147 and may be fixed to the third guide 147.

Figure 105:
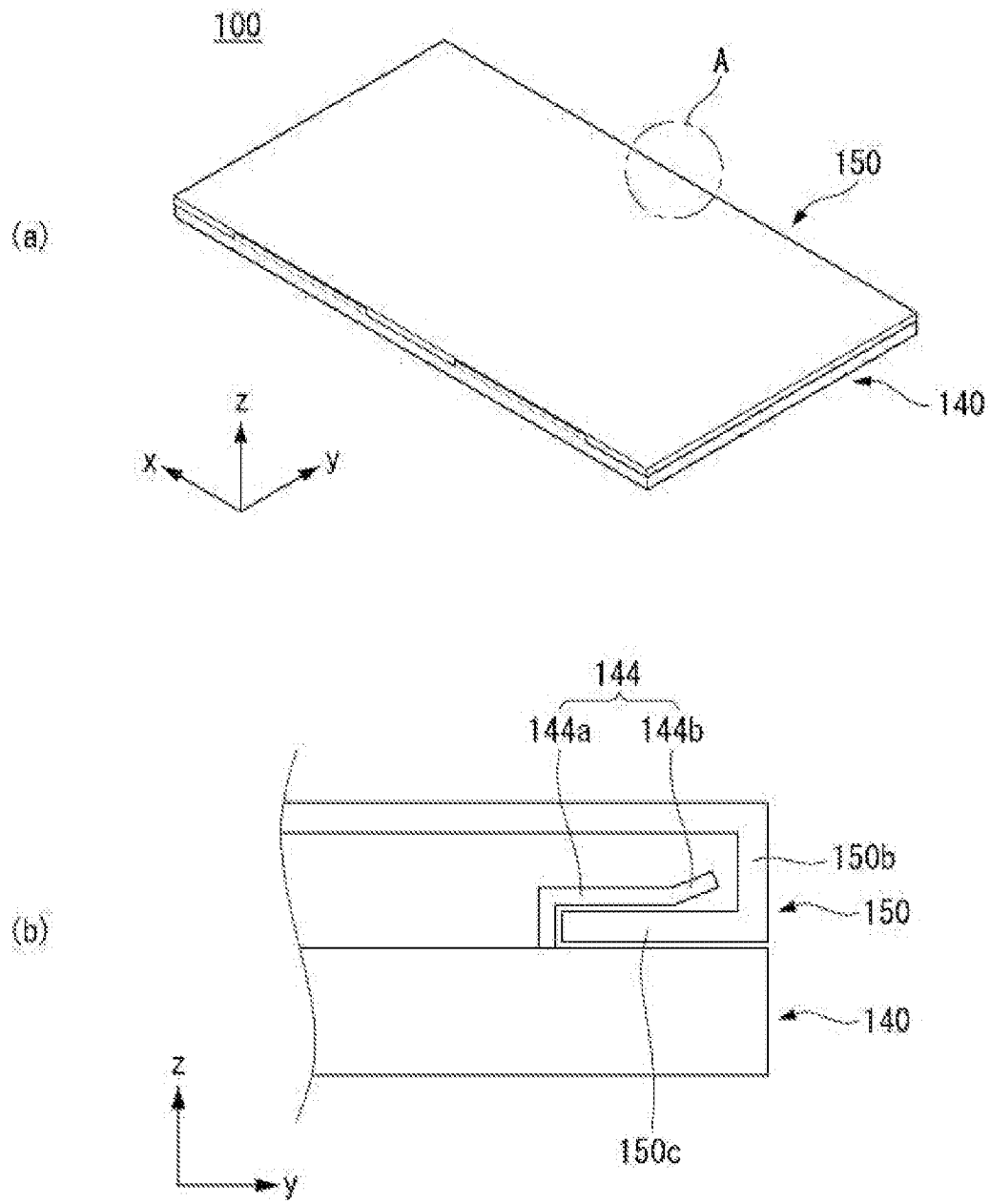

As shown in (a) of FIG. 105, the back cover 150 and the frame 140 may be coupled with each other.

As shown in (b) of FIG. 105, a sixth guide 144 may be provided in a top area of the frame 140, and a bending area 150c may be provided at a position corresponding to the back cover 150. The bending area 150c bending inward may be coupled with the sixth guide 144 when the back cover 150 and the frame 140 are coupled with each other.

The sixth guide 144 may include a body portion 144a and an end portion 144b extending from the body portion 144a. The end portion 144b may be inclined upwardly. Thus, the bending area 150c may naturally move to the inside of the body portion 144a along the end portion 144b.

Any reference in this specification to "one embodiment," "an embodiment," "exemplary embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
a display panel including a front substrate and a back substrate;
a guide panel positioned at an edge of a back surface of the display panel;
a frame positioned in the rear of the display panel and connected to the guide panel; and
a back cover positioned in the rear of the frame and inserted into the frame in a sliding manner,
wherein the back cover includes:
a first protrusion configured to extend toward a second side area opposite a first side area at an end of the first side area;
a second protrusion configured to extend toward the first side area at an end of the second side area; and
a third protrusion configured to extend toward a fourth side area, which is adjacent to the first and second side areas and is opposite to a third side area, at an end of the third side area adjacent to the first and second side areas,
wherein the frame includes:
a first connector corresponding to the first protrusion;
a second connector corresponding to the second protrusion; and
a third connector corresponding to the third protrusion,
wherein the first protrusion includes a first main protrusion extending toward the second side area at the end of the first side area and a first auxiliary protrusion extending from the first main protrusion in a vertical direction, and
wherein the second protrusion includes a second main protrusion extending toward the first side area at the end of the second side area and a second auxiliary protrusion extending from the second main protrusion in the vertical direction.

2. The display device of claim 1, wherein an external surface of the guide panel is exposed.

3. The display device of claim 1, further comprising at least one fixer attached to the back surface of the display panel using an adhesive layer,
wherein the guide panel is connected to the fixer.

4. The display device of claim 1, wherein the frame includes a fifth side area corresponding to the first side area, a sixth side area corresponding to the second side area, a seventh side area corresponding to the third side area, and an eight side area corresponding to the fourth side area,
wherein the first connector includes a first convex portion protruding from the frame toward the back cover in the fifth side area and a first arm protruding from the first convex portion toward the seventh side area,
wherein the second connector includes a second convex portion protruding from the frame toward the back cover in the sixth side area and a second arm protruding from the second convex portion toward the seventh side area, and
wherein grooves depressed toward the eight side area are respectively formed between the first arm and the frame and between the second arm and the frame.

5. The display device of claim 4, wherein the first protrusion is slidingly inserted into the groove of the first connector in a direction from the seventh side area to the eight side area, and
wherein the second protrusion is slidingly inserted into the groove of the second connector in the direction from the seventh side area to the eight side area.

6. The display device of claim 4, wherein the third connector includes a third convex portion protruding from the frame toward the back cover in the seventh side area,
wherein the third convex portion includes a groove depressed toward the eight side area, and
wherein the third protrusion is inserted into the groove of the third connector in a direction from the seventh side area to the eight side area.

7. The display device of claim 4, wherein the frame includes:
a first horizontal frame part configured to extend in a horizontal direction;
a second horizontal frame part positioned at an edge of the first horizontal frame part and configured to extend in the horizontal direction;
an inclined frame part positioned between the first horizontal frame part and the second horizontal frame part and configured to extend in an oblique direction;
a vertical frame part configured to extend from an end of the second horizontal frame part in a vertical direction; and
a third horizontal frame part configured to extend from an end of the vertical frame part toward the inclined frame part in the horizontal direction.

8. The display device of claim 7, wherein at least one of the first convex portion or the second convex portion overlaps at least one of the inclined frame part or the second horizontal frame part.

9. The display device of claim 8, wherein the third horizontal frame part includes an opening, through which at least one of the first convex portion or the second convex portion passes.

10. The display device of claim 8, wherein a distance between the first horizontal frame part and the second horizontal frame part in the vertical direction is greater than a distance between the second horizontal frame part and the third horizontal frame part in the vertical direction.

11. The display device of claim 2, wherein the guide panel includes a resin material and a glass fiber material.

12. The display device of claim 11, wherein the guide panel further includes a pigment.

* * * * *